(12) United States Patent
Kato et al.

(10) Patent No.: US 12,149,843 B2
(45) Date of Patent: Nov. 19, 2024

(54) IMAGING DEVICE AND ELECTRONIC EQUIPMENT

(71) Applicant: SONY SEMICONDUCTOR SOLUTIONS CORPORATION, Kanagawa (JP)

(72) Inventors: Eriko Kato, Kanagawa (JP); Mamoru Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 347 days.

(21) Appl. No.: 17/756,238

(22) PCT Filed: Oct. 28, 2020

(86) PCT No.: PCT/JP2020/040431
§ 371 (c)(1),
(2) Date: May 19, 2022

(87) PCT Pub. No.: WO2021/106478
PCT Pub. Date: Jun. 3, 2021

(65) Prior Publication Data
US 2022/0417461 A1 Dec. 29, 2022

(30) Foreign Application Priority Data

Nov. 29, 2019 (JP) ................................. 2019-216280
Sep. 29, 2020 (JP) ................................. 2020-162862

(51) Int. Cl.
*H04N 25/63* (2023.01)
*H04N 25/78* (2023.01)
*H04N 25/79* (2023.01)

(52) U.S. Cl.
CPC ............. *H04N 25/63* (2023.01); *H04N 25/78* (2023.01); *H04N 25/79* (2023.01)

(58) Field of Classification Search
CPC .... H04N 25/63; H04N 25/633; H04N 25/673; H04N 25/677; H04N 25/703; H04N 25/78; H04N 25/79
See application file for complete search history.

(56) References Cited

U.S. PATENT DOCUMENTS

2018/0146154 A1* 5/2018 Sato ..................... H04N 25/627
2020/0106975 A1   4/2020 Oike et al.

FOREIGN PATENT DOCUMENTS

JP     2018-182496 A    11/2018
WO    2017/179319 A1    10/2017
WO    WO-2018190127 A1 * 10/2018 ............. H04N 5/363

OTHER PUBLICATIONS

International Search Report and Written Opinion of PCT Application No. PCT/JP2020/040431, issued on Jan. 19, 2021, 12 pages of ISRWO.

* cited by examiner

*Primary Examiner* — Daniel M Pasiewicz
(74) *Attorney, Agent, or Firm* — CHIP LAW GROUP

(57) ABSTRACT

A selection pixel where signal readout is performed and a reference pixel where signal readout is not performed are arranged in a pixel array section, and an amplification transistor of the selection pixel and an amplification transistor of the reference pixel each source electrode of which is connected in common to a common wire are connected with a constant current source via the common wire to form a differential amplification circuit. Then, a bypass control section which selectively establishes connection between the constant current source and a differential output node of the differential amplification circuit and limits a voltage of the differential output node to a predetermined voltage by causing a bypass current to flow between the constant current source and the differential output node, and a current (Continued)

path for bypass current that supplies the bypass current to the constant current source through the pixel array section are included.

27 Claims, 48 Drawing Sheets

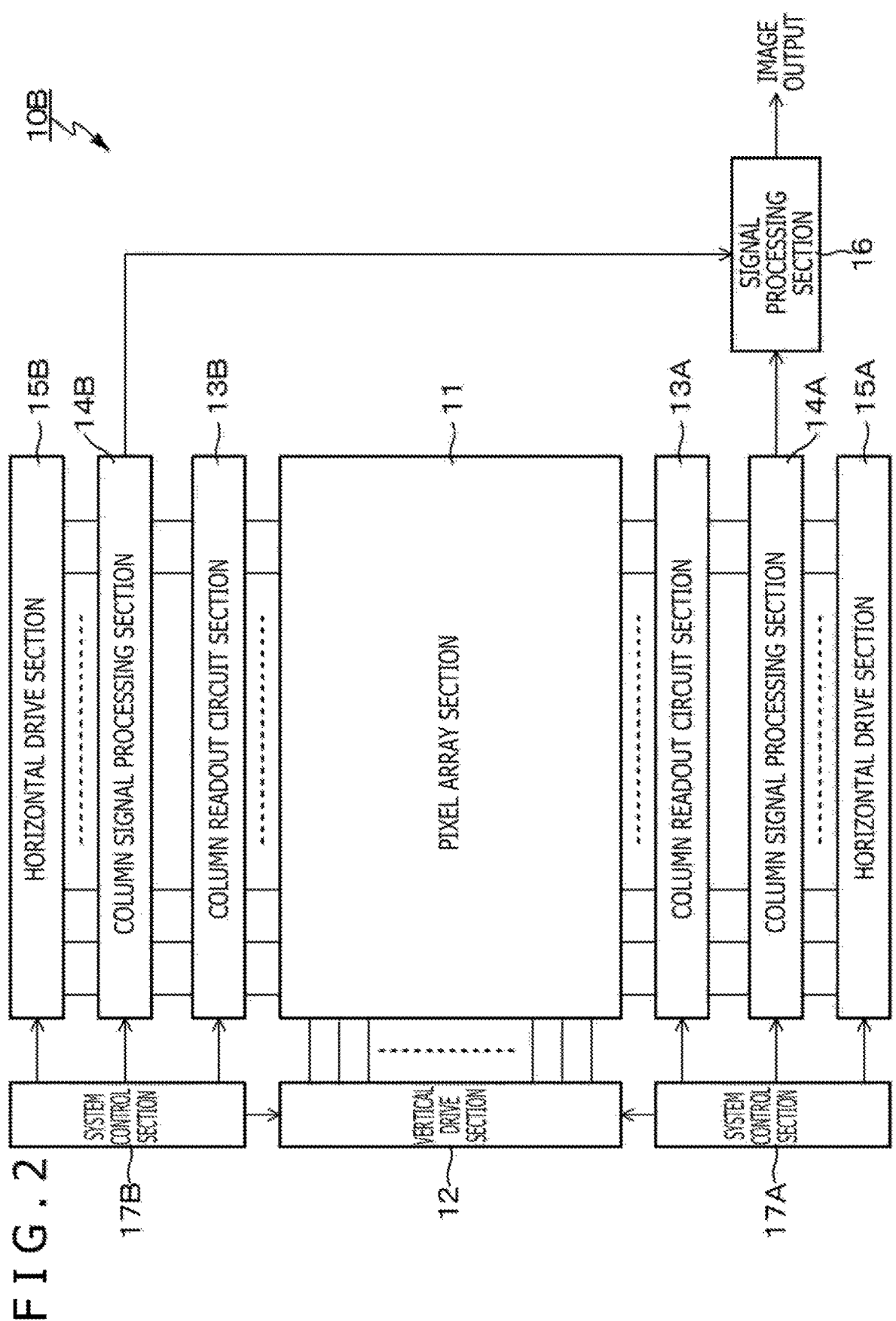
F I G. 2

FIG. 16    <<NORMAL OPERATION COLUMN>>

FIG. 24    <<NORMAL OPERATION COLUMN>>

IMAGING DEVICE AND ELECTRONIC EQUIPMENT

CROSS REFERENCE TO RELATED APPLICATIONS

This application is a U.S. National Phase of International Patent Application No PCT/JP2020/040431 filed on Oct. 28, 2020, which claims priority benefit of Japanese Patent Application No. JP 2019-216280 filed in the Japan Patent Office on Nov. 29, 2019, and also claims priority benefit of Japanese Patent Application No. JP 2020-162862 filed in the Japan Patent Office on Sep. 29, 2020. Each of the above-referenced applications is hereby incorporated herein by reference in its entirety.

TECHNICAL FIELD

The present disclosure relates to an imaging device and electronic equipment.

BACKGROUND ART

There are imaging devices called differential-amplification type imaging devices that read out photoelectrically-converted signal charges by use of differential amplification circuits. In the differential-amplification type imaging devices, selection pixels (readout pixels) where signal readout is performed, and reference pixels where signal readout is not performed are used to form differential amplification circuits, and signal readout of the selection pixels is performed by use of the differential amplification circuits as pixel readout circuits. Because the differential-amplification type imaging devices have higher amplification rates as compared to a case that circuits, for example, source follower circuits, other than differential amplification circuits are used as pixel readout circuits, signal readout can be performed at high conversion efficiency.

A bypass control section is provided in a differential-amplification type imaging device (see PTL 1, for example). When high-illuminance light enters, the bypass control section limits the voltage of a differential output node of a differential amplification circuit connected to a vertical signal line to an upper limit voltage at which an active load of a current mirror circuit operates in the saturated area. By connecting a common wire and the differential output node of the differential amplification circuit (by forming a bypass path therebetween), the bypass control section limits the voltage of the differential output node of the differential amplification circuit. Note that the common wire is a wire that connects a source electrode of an amplification transistor in a reference pixel and the source electrode of an amplification transistor in a selection pixel, in a shared manner. The common wire is connected with a constant current source of the differential amplification circuit.

CITATION LIST

Patent Literature

[PTL 1]
WO 2017/179319A1

SUMMARY

Technical Problem

In the conventional technology described in PTL 1 described above, because the voltage of the differential output node of the differential amplification circuit is limited to the upper limit voltage at which the active load of the current mirror circuit operates in a saturated area, a stabilization period for the active load of the current mirror circuit to return to the saturated area becomes unnecessary, so that it is possible to attempt to enhance the frame rate by a corresponding amount.

On the contrary, because a current flows through the bypass path due to the operation of the bypass control section and flows into the common wire, the potential of the common wire that is determined through the wire resistance of the common wire from the source potential of the amplification transistor of the reference pixel varies. Then, the potential variations of the common wire are propagated to adjacent columns through a power source, a ground, or linkages to adjacent columns, and streak noise called streaking is generated in a captured image in the horizontal direction (i.e. in the row direction of a matrix-like pixel array).

An object of the present disclosure is to provide an imaging device that can reduce occurrence of streaking due to potential changes of a common wire resulting from operation of a bypass control section, and to provide electronic equipment having the imaging device.

Solution to Problem

In an imaging device of the present disclosure for achieving the object described above, in a pixel array section in which a selection pixel where signal readout is performed and a reference pixel where signal readout is not performed are arranged in a pixel array section, an amplification transistor of the selection pixel and an amplification transistor of the reference pixel each source electrode of which is connected in common to a common wire are connected with a constant current source via the common wire to form a differential amplification circuit, the imaging device including a bypass control section which selectively establishes connection between the constant current source and a differential output node of the differential amplification circuit, and limits a voltage of the differential output node to a predetermined voltage by causing a bypass current to flow between the constant current source and the differential output node, and a current path for bypass current that supplies the bypass current to the constant current source through the pixel array section.

In addition, electronic equipment of the present disclosure for achieving the object described above has the imaging device having the configuration described above.

BRIEF DESCRIPTION OF DRAWINGS

FIG. 2 is a block diagram depicting a configuration example of a double-sided readout imaging device.

FIG. 3A is an exploded perspective view depicting an overview of a horizontally-placed semiconductor chip structure in a case of the double-sided readout imaging device, and FIG. 3B is an exploded perspective view depicting an overview of a stacked semiconductor chip structure in a case of the double-sided readout imaging device.

DESCRIPTION OF EMBODIMENTS

Figure 1:
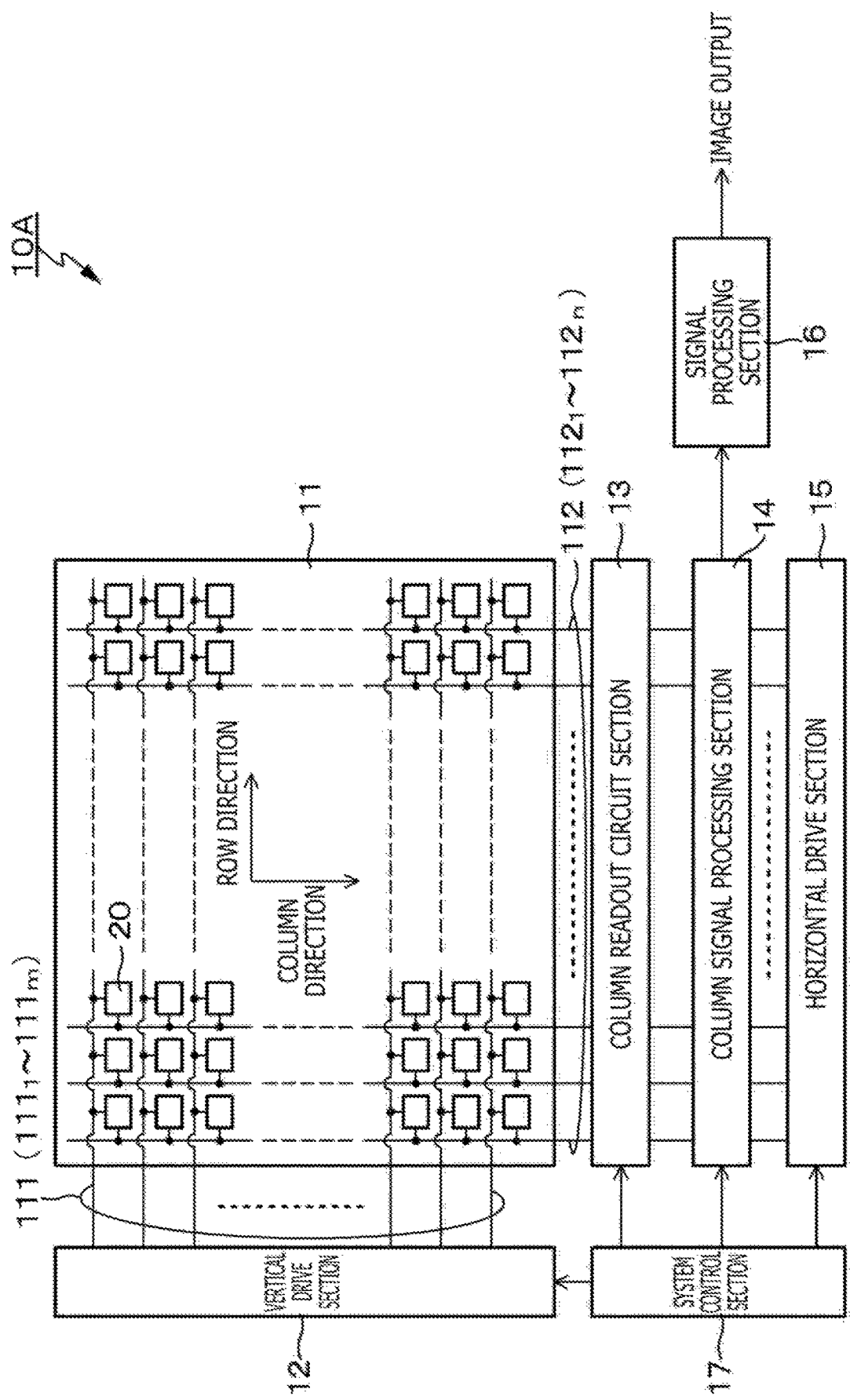
FIG. 1 is a block diagram depicting a configuration example of a single-sided readout imaging device.

Modes (described as "embodiments" below) for carrying out the technology of the present disclosure are explained in detail below by use of the figures. The technology of the present disclosure is not limited to the embodiments. In explanations below, identical reference signs are used for identical elements or elements having identical functionalities, and overlapping explanations are omitted. Note that the explanations are given in the following order.
1. Overall Explanation Regarding Imaging Device and Electronic Equipment of Present Disclosure
2. Configuration Example of Typical Imaging Device
   2-1. Single-Sided Readout Imaging Device
   2-2. Double-Sided Readout imaging Device
   2-3. Semiconductor Chip Structure
   2-3-1. Horizontally-Placed Chip Structure
   2-3-2. Stacked Chip Structure
   2-4. Configuration Example of Pixel Array Section in Differential-Amplification Type Imaging Device
   2-5. Configuration Example of Differential Amplification Circuit
   2-5-1. Circuit Configuration Example of Selection Pixel
   2-5-2. Circuit Configuration Example of Reference Pixel
   2-5-3. Configuration Example of Current Mirror Circuit
   2-5-4. Regarding Voltage Clipping Functionality of Bypass Control Section
3. First Embodiment of Present Disclosure
   3-1. First Implementation Example (Example of Reference Pixel Following and Single-Sided Readout)
   3-2. Second Implementation Example (Modification Example of First Implementation Example: Example in Which Constant Current Source Is Arranged on Side Opposite to Bypass Control Section Sandwiching Pixel Array Section)
   3-3. Third Implementation Example (Example of Reference Pixel Fixation and Single-Sided Readout)
   3-4. Fourth Implementation Example (Example of Reference Pixel Following and Double-Sided Readout)
   3-5. Fifth Implementation Example (Example of Reference Pixel Fixation and Double-Sided Readout)
   3-6. Sixth Implementation Example (Modification Example of First Implementation Example: Example in Which Bypass Wire Is Provided Adjacent to Common Wire VCOM)
   3-7. Seventh Implementation Example (Modification Example of Fourth Implementation Example: Example in Which Bypass Wire Is Provided Adjacent to Common Wire VCOM)
   3-8. Eighth Implementation Example (Modification Example of Third Implementation Example: Example in Which, in Pixel Array Section, Reference Pixel Area Is Provided Closer to Column Readout Circuit Section Than Selection Pixel Area Is)
   3-9. Ninth Implementation Example (Modification Example of Fifth Implementation Example: Example in Which Two Reference Pixel Areas Including Reference Pixels Are Provided Corresponding to Double-Sided Readout)
4. Second Embodiment of Present Disclosure
   4-1. Regarding Selection-Pixel Reset Methods
   4-1-1. Reset Method 1 (Example of VRD Wiring Method)
   4-1-2. Reset Method 2 (Example in Which Vertical Signal Lines Double as Reset Lines)
   4-1-3. Reset Method 3 (Example in Which Selection Pixel Has Two Reset Transistors)
   4-2. Tenth Implementation Example (Example in Which Vertical Signal Lines Which Are Used at Time of SF Readout and Are Not Used at Time of Differential Amplification Readout Are Used as Current Paths for Bypass Current)
   4-3. Eleventh Implementation Example (Modification Example of Tenth Implementation Example: Another Configuration Example of Selector Switches That Electrically Connect Vertical Signal Lines and Common Wire)
   4-4. Twelfth Implementation Example (Example in Which Selector Switches That Electrically Connect Vertical Signal Lines and Common Wire Are Formed in Column Readout Circuit Section)
   4-5. Thirteenth Implementation Example (Example in Which, as Current Path for Bypass Current, Reset Line Used Only at Time of Reset in Differential Amplification Readout Is Used)
5. Third Embodiment of Present Disclosure
   5-1. Fourteenth Implementation Example (Example of Application to Differential-Amplification Type imaging Device Having Voltage Clipping Functionality of Limiting Differential Output Voltage and Functionality of Widthwise Connection on Reference-Pixel Side)
   5-1-1. Case of Reference Pixel Following and Single-Sided Readout
   5-1-2. Case of Reference Pixel Fixation and Single-Sided Readout
6. Modification Examples
7. Application Examples
8. Application Examples of Technology According to Present Disclosure
   8-1. Electronic equipment of Present Disclosure (Example of Imaging System)
   8-2. Examples of Application to Mobile Body
9. Configuration That Present Disclosure Can Have <Overall Explanation Regarding Imaging Device and Electronic Equipment of Present Disclosure>

An imaging device and electronic equipment of the present disclosure can have a configuration in which a reference pixel is fixedly arranged in a particular area of a pixel array section. Then, there can be set a configuration in which the pixel array section includes a selection pixel area in which the selection pixel is arranged, and a reference pixel area in which the reference pixel is arranged, and the reference pixel area is provided on an opposite side of a column readout circuit section including a bypass control section sandwiching the selection pixel area or is provided on the same side.

Alternatively, in a possible configuration of the imaging device and the electronic equipment of the present disclosure including the preferred configuration mentioned above, the reference pixel area is provided closer to a column readout circuit section including the bypass control section than the selection pixel area is, and a current path for bypass current includes a bypass wire placed between the bypass control section and the reference pixel, and a common wire placed along a pixel column and having one end connected to the bypass control section. Then, in a possible configuration, the bypass wire and the common wire are electrically connected near the reference pixel area.

In addition, in a possible configuration of the imaging device and the electronic equipment of the present disclosure including the preferred configuration mentioned above, a column readout circuit section including the bypass control section and a constant current source is a double-sided readout circuit section arranged on both sides of the pixel array section in a pixel column direction. At this time, in a possible configuration, the reference pixel area is provided on both sides of the selection pixel area sandwiching the selection pixel area.

Alternatively, in a possible configuration of the imaging device and the electronic equipment of the present disclosure including the preferred configuration mentioned above, the current path for bypass current includes a bypass wire placed for each pixel column of the pixel array section along the pixel column and having one end connected to the bypass control section. In addition, in a possible configuration, the reference pixel moves to follow the selection pixel that moves along with selection and scanning. At this time, in a possible configuration, the bypass wire is a wire that specifies a clip connection destination that limits the voltage of the differential output node, and is linked with a common connection node of the amplification transistor and a selection transistor for each pixel of the pixel array section. In addition, in a possible configuration, after flowing through the selection transistor of the reference pixel and the selection transistor of the selection pixel through the bypass wire, the bypass current flows into the constant current source through the common wire.

In a possible configuration of the imaging device and the electronic equipment of the present disclosure including the preferred configuration mentioned above, the common wire is placed for each pixel column of the pixel array section along the pixel column and has one end connected to the bypass control section, and the current path for bypass current includes the common wire. In addition, in a possible configuration, the constant current source is arranged on a side opposite to the bypass control section sandwiching the pixel array section, and connected to the other end of the common wire, and the bypass current flows into the constant current source through the common wire.

In addition, in a possible configuration of the imaging device and the electronic equipment of the present disclosure including the preferred configuration mentioned above, a column readout circuit section including the bypass control section and the constant current source has a double-sided readout configuration arranged on both sides of the pixel array section in the pixel column direction. Then, in a possible configuration, two common wires are provided corresponding to the double-sided readout configuration, and each of the two common wires has one end connected to the bypass control section and the other end connected to the constant current source.

In addition, in a possible configuration of the imaging device and the electronic equipment of the present disclosure including the preferred configuration mentioned above, the current path for bypass current includes a bypass wire placed for each pixel column of the pixel array section along the pixel column, and the common wire placed along the pixel column and having one end connected to the bypass control section. Then, in a possible configuration, in the pixel array section, the bypass wire and the common wire are electrically connected near a pixel row at an end far from the bypass control section.

In addition, in a possible configuration of the imaging device and the electronic equipment of the present disclosure including the preferred configuration mentioned above, a column readout circuit section including the bypass control section and the constant current source has a double-sided readout configuration arranged on both sides of the pixel array section in the pixel column direction. In addition, in a possible configuration, the current path for bypass current includes a bypass wire placed for each pixel column of the pixel array section along the pixel column, and the common wire placed along the pixel column and having one end connected to the bypass control section. Then, in a possible configuration, in the pixel array section, the bypass wire and the common wire are electrically connected near a middle pixel row.

In addition, in a possible configuration of the imaging device and the electronic equipment of the present disclosure, the current path for bypass current is an inactive wire that is included in existing wires provided for each pixel column of the pixel array section along the pixel column and that does not contribute to signal readout at a time of readout of reading out a signal of the selection pixel by the differential amplification circuit.

In addition, a possible configuration of the imaging device and the electronic equipment of the present disclosure including the preferred configuration mentioned above has a first selector switch that electrically connects the inactive wire and an output wire of the bypass control section, and a second selector switch that electrically connects the inactive wire and the common wire. Then, in a preferred configuration, when the second selector switch is formed in the pixel array section, the second selector switch includes a depression-type N-channel MOS type field effect transistor.

In addition, in a possible configuration of the imaging device and the electronic equipment of the present disclosure including the preferred configuration mentioned above, the inactive wire is a vertical signal line that is not used at a time of readout of reading out a signal of the selection pixel by the differential amplification circuit or is a reset line that is used only at a time of reset in readout of reading out a signal of the selection pixel by the differential amplification circuit.

In addition, a possible configuration of the imaging device and the electronic equipment of the present disclosure including the preferred configuration mentioned above has a stacked semiconductor chip structure in which a first semiconductor chip where the pixel array section is formed and a second semiconductor chip where a column readout circuit section including the bypass control section is formed are stacked one on another. Then, in a possible configuration, the first semiconductor chip and the second semiconductor chip are electrically connected via a connection section provided for each of the wires.

In a second imaging device of the present disclosure,
a selection pixel where signal readout is performed and a reference pixel where signal readout is not performed are arranged in a pixel array section,
source electrodes of an amplification transistor of the selection pixel and an amplification transistor of the reference pixel are connected with a constant current source via a commonly connected common wire to form a differential amplification circuit, and
the imaging device includes:
a bypass control section that selectively establishes connection between the constant current source and a differential output node of the differential amplification circuit, and limits a voltage of the differential output node to a predetermined voltage by causing a bypass current to flow between the constant current source and the differential output node; and
a widthwise connection wire that connects, widthwise, the common wire of each pixel column of the pixel array section for each pixel or for each set of a plurality of pixels.

In possible configuration of the second imaging device of the present disclosure, the reference pixel moves to follow the selection pixel that moves along with selection and scanning, and the widthwise connection wire is provided in all pixel rows of the pixel array section. Alternatively, in possible configuration, the reference pixel is fixedly arranged in a particular area of the pixel array section, and the widthwise connection wire is provided in the particular area of the pixel array section.

<Configuration Example of Typical Imaging Device>

Prior to explaining the imaging device of the present disclosure, a configuration example of a typical imaging device is explained. Here, as a typical imaging device, a CMOS (Complementary Metal Oxide Semiconductor) image sensor which is one type of X-Y addressing imaging device is explained as an example. A CMOS image sensor is an image sensor fabricated by applying a CMOS process or partially using a CMOS process.

In an imaging device such as a CMOS image sensor, readout methods of reading out signals from pixels of a pixel array section include a single-sided readout method of reading out signals from one side, in the pixel column direction, of the pixel array section in which the pixels are arrayed, and a double-sided readout method of reading out from both sides of the pixel array section in the pixel column direction.

[Single-Sided Readout Imaging Device]

FIG. 1 is a block diagram depicting a configuration example of a single-sided readout imaging device.

A single-sided readout imaging device 10A includes a pixel array section 11, a vertical drive section 12, a column readout circuit section 13, a column signal processing section 14, a horizontal drive section 15, a signal processing section 16, and a system control section 17. Then, the imaging device 10A has single-sided readout configuration in which the column readout circuit section 13, the column signal processing section 14, and the horizontal drive section 15 are arranged on one side of the pixel array section 11 in the pixel column direction (e.g. on the lower side in the figure), and signals of pixels 20 of the pixel array section 11 are read out from the one side in the pixel column direction.

The pixel array section 11 includes the pixels 20 having photoelectric converting sections to generate optical charges in charge amounts according to incident light amounts and arranged two-dimensionally in a matrix therein. In the pixel array section 11, for each pixel row in a pixel array with m rows and n columns, one of pixel drive lines $111_1$ to $111_m$ is placed along the pixel row direction (the left-right direction in the figure). Further, in the pixel array section 11, for each pixel column, one of vertical signal lines $112_1$ to $112_n$ is placed along the pixel column direction (the up-down direction in the figure). One end of each pixel drive line 111 is connected to each output terminal corresponding to one pixel row of the vertical drive section 12.

The vertical drive section 12 is a pixel drive section that includes a shift register, an address decoder, and the like, and drives all the pixels 20 of the pixel array section 11 simultaneously, each pixel row of the pixels 20 at a time, and so on. Although illustration of the specific configuration is omitted in the figure, the vertical drive section 12 has a configuration having a readout scanning system and a sweep scanning system and can perform bulk sweeping and bulk transfer under driving by these scanning systems.

In order to read out signals from the pixels 20, the readout scanning system selects and scans each pixel row of the pixels 20 of the pixel array section 11 sequentially. In a case of row driving (rolling shutter operation), in sweeping, sweep scanning is performed for a readout row where readout scanning is to be performed by the readout scanning system, at a timing which is earlier than the readout scanning by an amount of time corresponding to a shutter speed. In addition, in a case of global exposure (global shutter operation), bulk sweeping is performed at a timing which is earlier than the bulk transfer by an amount of time corresponding to a shutter speed.

This sweeping sweeps unnecessary charges from the photoelectric converting sections of pixels 20 in a readout row. Then, what is generally called electronic shutter operation is performed by the sweeping of the unnecessary charges (reset). Here, the electronic shutter operation means operation of discarding optical charges of the photoelectric converting sections and newly starting exposure (starting accumulation of optical charges).

Signals read out by readout operation of the readout scanning system are ones that correspond to amounts of light that has entered after the previous readout operation or electronic shutter operation. In a case of row driving, the accumulation period (exposure period) of optical charges of a pixel 20 is a period from a readout timing of the previous readout operation or a sweep timing of the previous electronic shutter operation to a readout timing of the current readout operation. In a case of global exposure, the accumulation period (exposure period) is a period from bulk sweeping to bulk transfer.

Pixel signals output from pixels 20 in a pixel row selected by the vertical drive section 12 are supplied to the column readout circuit section 13 through corresponding vertical signal lines 112. The column readout circuit section 13 has a configuration in which a current mirror circuit or the like that includes a differential amplification circuit together with a selection pixel and a reference pixel mentioned later is provided for each pixel column. Details of the column readout circuit section 13 are mentioned later.

For each pixel column of the pixel array section 11, the column signal processing section 14 performs predetermined signal processing on pixel signals that are output through the vertical signal lines 112 from pixels 20 in a selected row and that are supplied by way of the column readout circuit section 13, and also temporarily retains the pixel signals after having been subjected to the signal processing. For example, the column signal processing section 14 has an analog-digital converter for each pixel column, and performs an analog-digital conversion process as the predetermined signal processing.

The horizontal drive section 15 includes a shift register, an address decoder, and the like, and sequentially selects unit circuits corresponding to pixel columns of the column signal processing section 14. By the selection and scanning by the horizontal drive section 15, pixel signals having been subjected to the signal processing at the column signal processing section 14 are sequentially output to the signal processing section 16.

The signal processing section 16 performs various types of signal processing on pixel signals output from the column signal processing section 14, the signal processing including, for example, a noise removing process by CDS (Correlated Double Sampling) and the like.

The system control section 17 includes a timing generator that generates various types of timing signal and the like, and, on the basis of the various types of timing signal generated at the timing generator, performs drive control of the vertical drive section 12, the column readout circuit section 13, the column signal processing section 14, the horizontal drive section 15, and the like.

[Double-Sided Readout Imaging Device]

FIG. 2 is a block diagram depicting a configuration example of a double-sided readout imaging device.

A double-sided readout imaging device 10B has a double-sided readout configuration that has, in addition to the pixel array section 11, the vertical drive section 12, and the signal processing section 16, two systems (A and B) each including the column readout circuit section 13, the column signal processing section 14, the horizontal drive section 15, and the system control section 17 and that reads out signals of the pixels 20 of the pixel array section 11 from both sides in the pixel column direction.

That is, in the imaging device 10B, a system-A column readout circuit section 13A, a column signal processing section 14A, a horizontal drive section 15A, and a system control section 17A are arranged on one side (e.g. on the lower side in the figure), in the pixel column direction, of the pixel array section 11, and a system-B column readout circuit section 13B, a column signal processing section 14B, a horizontal drive section 15B, and a system control section 17B are arranged on the other side (e.g. on the upper side in the figure) in the pixel column direction.

Operation of each circuit section in the double-sided readout imaging device 10B is basically the same as operation of each circuit section in the single-sided readout imaging device 10A. Note that, in the signal processing section 16, a process of re-arranging pixel signals read out in the system A and the system B into a signal array corresponding to the array of the pixels 20 of the pixel array section 11 is performed.

[Semiconductor Chip Structure]

Possible examples of semiconductor chip structures of the single-sided readout imaging device 10A or the double-sided readout imaging device 10B each having the configuration described above include a horizontally-placed semiconductor chip structure and a stacked semiconductor chip structure. In addition, the pixel structure can be a back illumination pixel structure that takes in light that is illuminated from the backside which is a side opposite to a front surface (front face) supposing that the front surface is a substrate surface on a side where a wiring layer is formed, or the pixel structure can also be a front illumination pixel structure that takes in light illuminated from the front-surface side.

Using a case of the double-sided readout imaging device 10B as an example, overviews of the horizontally-placed semiconductor chip structure and the stacked semiconductor chip structure are explained below. The horizontally-placed semiconductor chip structure and the stacked semiconductor chip structure also in a case of the single-sided readout imaging device 10A are basically the same as those in the case of the double-sided readout imaging device 10B.

(Horizontally-Placed Semiconductor Chip Structure)

Figure 3A:
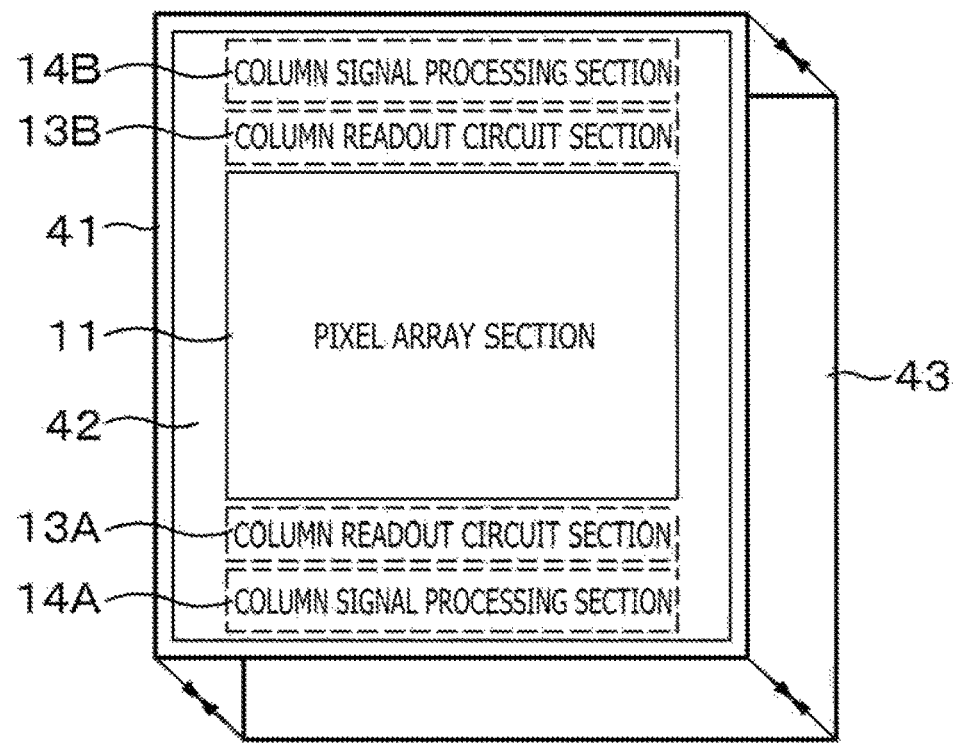
[FIGS. 3A and 3B]

FIG. 3A is an exploded perspective view depicting an overview of the horizontally-placed semiconductor chip structure in the case of the double-sided readout imaging device 10B. As depicted in FIG. 3A, the horizontally-placed semiconductor chip structure has a structure in which a peripheral circuit section 42 of the pixel array section 11 is formed on a semiconductor chip (semiconductor substrate) 41 which is the same semiconductor chip where the pixel array section 11 in which pixels 20 are arranged in a matrix is formed. Specifically, the peripheral circuit section 42 including the column readout circuit sections 13A and 13B, the column signal processing sections 14A and 14B, and the like is formed on the semiconductor chip 41 which is the same semiconductor chip where the pixel array section 11 is formed. Then, the semiconductor chip 41 is stacked on a support semiconductor chip (semiconductor substrate) 43.

(Stacked Semiconductor Chip Structure)

Figure 3B:
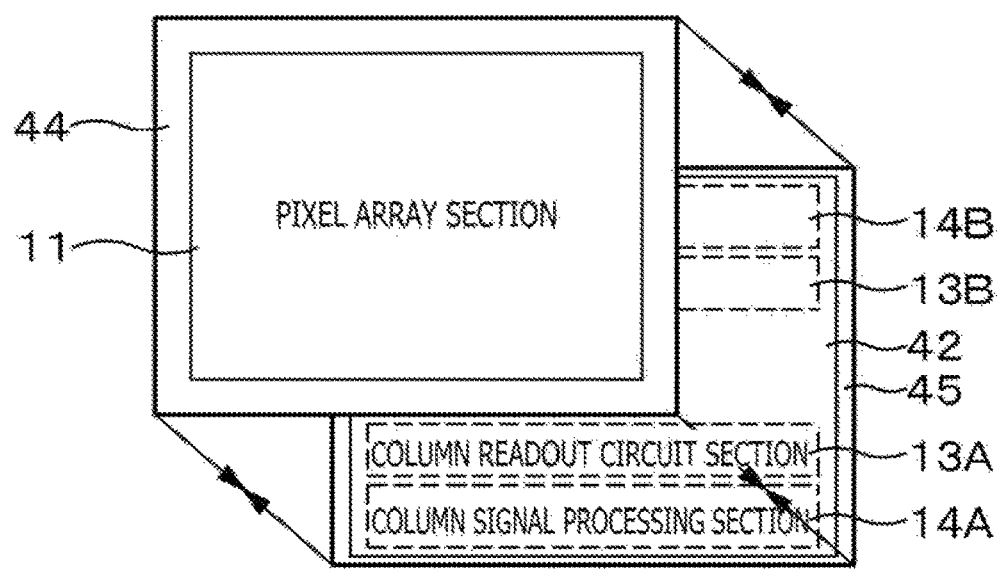

FIG. 3B is an exploded perspective view depicting an overview of the stacked semiconductor chip structure in the case of the double-sided readout imaging device 10B. As depicted in FIG. 3B, the stacked semiconductor chip structure has a structure in which at least two semiconductor chips including a first semiconductor chip 44 and a second semiconductor chip 45 are stacked one on another.

In this stacked semiconductor chip structure, the first semiconductor chip 44 in the first layer is a pixel chip where the pixel array section 11 that has pixels 20 including photoelectric converting sections and arranged two-dimensionally in a matrix therein is formed. The second semiconductor chip 45 in the second layer is a circuit chip in which the peripheral circuit section 42 of the pixel array section 11, that is, the peripheral circuit section 42 including the column readout circuit sections 13A and 13B, the column signal processing sections 14A and 14B, and the like, is formed. Then, each pixel 20 of the first semiconductor chip 44 in the first layer, and the peripheral circuit section 42 of the second semiconductor chip 45 in the second layer are electrically connected through a connection section (not depicted) such as a Cu—Cu connection (a copper-copper connection).

According to this stacked semiconductor chip structure, a process suited for fabrication of the pixels 20 can be applied to the first semiconductor chip 44 in the first layer, and a process suited for fabrication of the circuit portions can be applied to the second semiconductor chip 45 in the second layer. Thereby, it is possible to attempt to optimize the processes in manufacturing of an imaging device such as a CMOS image sensor. In particular, new advanced processes can be applied in fabrication of the circuit portions.

Whereas the imaging device of the present disclosure is a differential-amplification type imaging device that reads out photoelectrically-converted signal charges by using a differential amplification circuit, the imaging device can also be any of the single-sided readout imaging device and double-sided readout imaging device mentioned above, and can also have any of the horizontally-placed and stacked semiconductor chip structures.

[Configuration Example of Pixel Array Section in Differential-Amplification Type Imaging Device]

Figure 4:
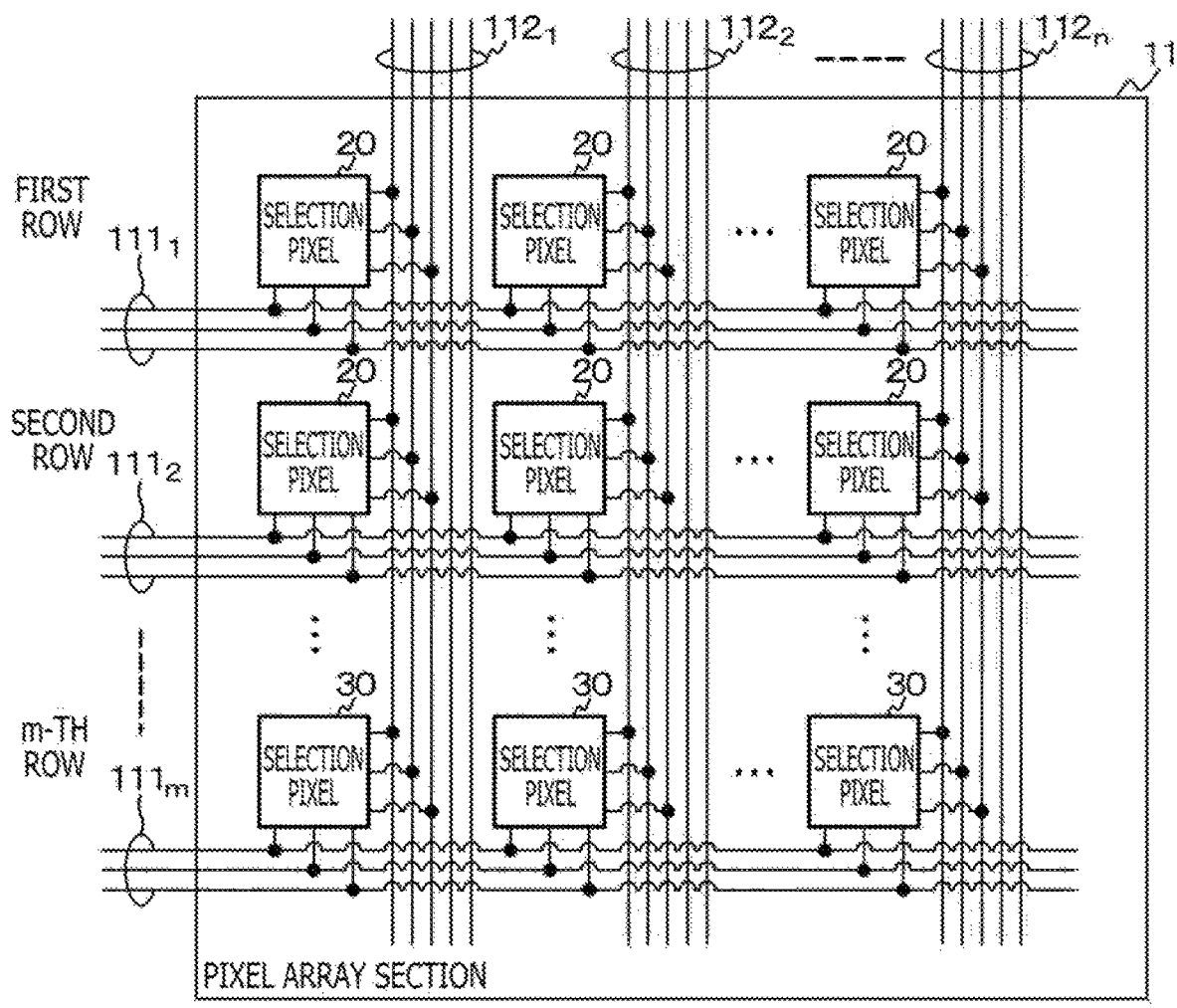
FIG. 4 is a block diagram depicting an example of a configuration of a pixel array section in a differential-amplification type imaging device.

Here, an example of the configuration of the pixel array section in the differential-amplification type imaging device is explained. FIG. 4 is a block diagram depicting an example of the configuration of the pixel array section in the differential-amplification type imaging device. Among pixels in the pixel array section, pixels (readout pixels) where signal readout is performed are described below as "selection pixels 20," and pixels where signal readout is not performed are described below as "reference pixels 30."

In a case of the differential-amplification type imaging device, a plurality of pixels arranged two-dimensionally in a matrix in the pixel array section 11 includes selection pixels 20 which are readout pixels where signal readout is performed and reference pixels 30 where signal readout is not performed. Then, in the differential-amplification type imaging device, the selection pixels 20 and the reference pixels 30 are used to form differential amplification circuits, and signal readout of the selection pixels 20 is performed by using the differential amplification circuits as pixel readout circuits.

The reference pixels 30 that form the differential amplification circuits, together with the selection pixels 20, can also be what is generally called fixed reference pixels that are fixedly arranged in a particular area of the pixel array section 11 and can also be what is generally called following reference pixels that move to follow the selection pixels 20 that move along with selection and scanning. The configuration example depicted in FIG. 4 is an example of a case that the reference pixels 30 are fixed, and, for example, while the selection pixels 20 are arranged in the first row to the (m−1)-th row, the reference pixels 30 are arranged fixedly in the m-th row in this example. Note that arrangement locations of the reference pixels 30 are not limited to the m-th row, but, for example, the reference pixels 30 may be arranged in the first row, n-th column, and the like.

[Configuration Example of Differential Amplification Circuit]

Figure 5:
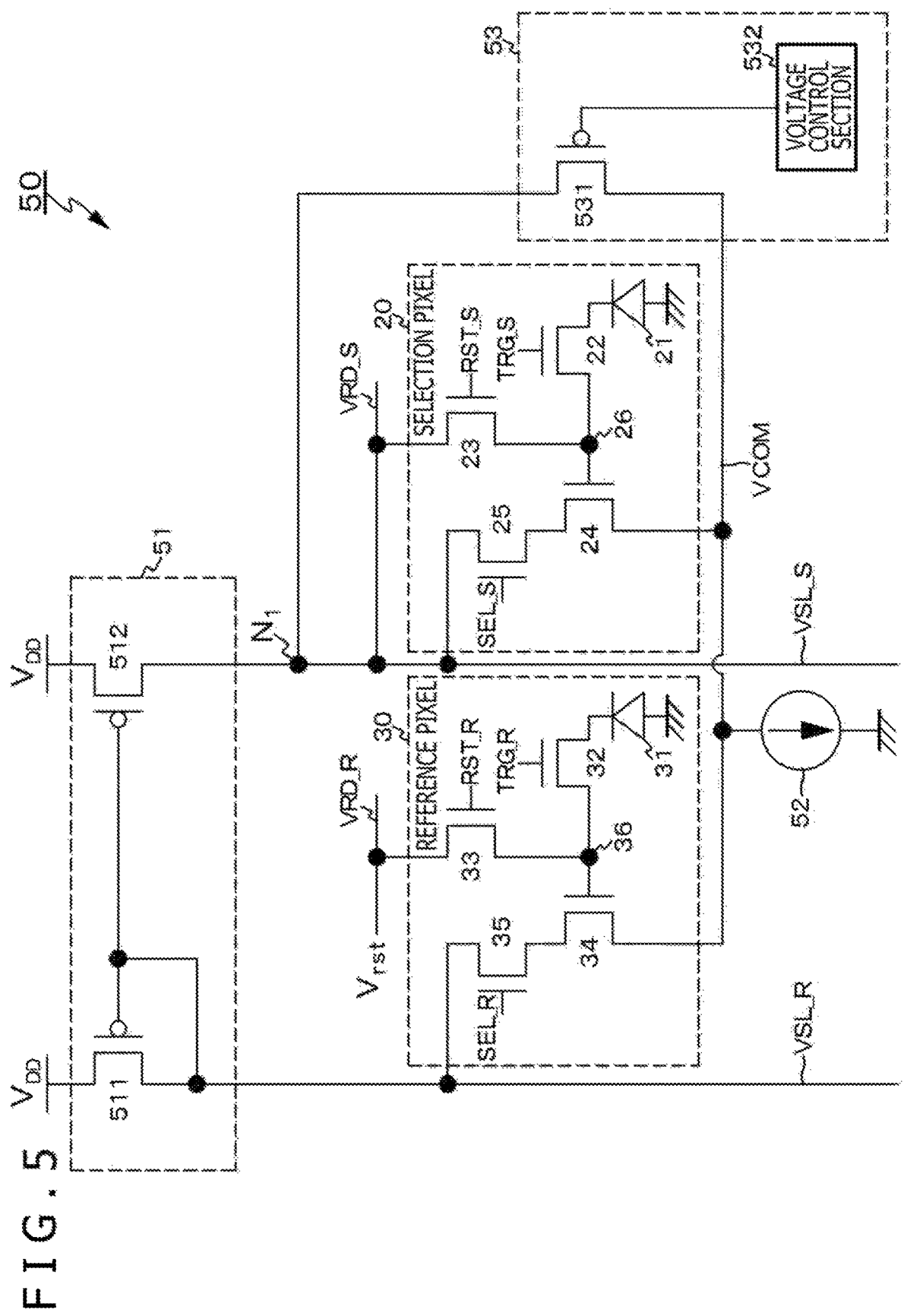
FIG. 5 is a circuit diagram depicting an example of a configuration of a differential amplification circuit.

Next, an example of the configuration of a differential amplification circuit formed by using a selection pixel 20 and a reference pixel 30 is explained. FIG. 5 is a circuit diagram depicting an example of the configuration of the differential amplification circuit.

A differential amplification circuit 50 has a current mirror circuit 51 and a constant current source (tail current source) 52 and is provided for each pixel column. The current mirror circuit 51 and the constant current source 52 form the differential amplification circuit 50 together with an amplification transistor 24 of a selection pixel 20 and an amplification transistor 34 of a reference pixel 30.

(Circuit Configuration Example of Selection Pixel)

For example, the selection pixel 20 has a photodiode 21 as a light receiving element. The selection pixel 20 has a circuit configuration having, in addition to the photodiode 21, a transfer transistor 22, a reset transistor 23, the amplification transistor 24 and a selection transistor 25.

As the four transistors such as the transfer transistor 22, the reset transistor 23, the amplification transistor 24, and the selection transistor 25, for example, N-channel MOS type field effect transistors (Field Effect Transistors; FETs) are used. It should be noted that the combination of the conductivity types of the four transistors 22 to 25 illustrated here is merely an example, and examples of the combination are not limited thereto.

The photodiode 21 has an anode electrode connected to a low-potential side power source (e.g. ground), photoelectrically converts received light into optical charges (here, photoelectrons) with a charge amount according to the amount of the received light, and accumulates the optical charges. A cathode electrode of the photodiode 21 is electrically connected with a gate electrode of the amplification transistor 24 via the transfer transistor 22.

Here, the area where the gate electrode of the amplification transistor 24 is electrically connected is a floating diffusion (floating diffusion area/impurity diffusion area) 26. The floating diffusion 26 is a charge-voltage converting section that converts charges into voltage.

A gate electrode of the transfer transistor 22 receives, from the vertical drive section 12 depicted in FIG. 1, a transfer signal TRG_S that makes a high level (e.g. a $V_{DD}$ level) active. By entering the conduction state in response to the transfer signal TRG_S, the transfer transistor 22 transfers, to the floating diffusion 26, optical charges photoelectrically converted at the photodiode 21 and accumulated in the photodiode 21.

The reset transistor 23 is connected between the floating diffusion 26 and a reset line VRD_S connected to a signal line VSL_S that outputs a pixel signal. A gate electrode of the reset transistor 23 receives, from the vertical drive section 12, a reset signal RST_S that makes a high level active. By entering the conduction state in response to the reset signal RST_S, the reset transistor 23 resets the floating diffusion 26.

The amplification transistor 24 has a gate electrode connected to the floating diffusion 26, amplifies a voltage of the floating diffusion 26, and outputs, as a signal current, a current according to the voltage. Due to the signal current, an output voltage of the selection pixel 20 is generated, and, as a pixel signal, is output to the signal line VSL_S via the selection transistor 26.

The selection transistor 25 is connected between the amplification transistor 24 and the signal line VSL_S that outputs the pixel signal. A gate electrode of the selection transistor 25 receives, from the vertical drive section 12, a selection signal SEL_S that makes a high level active. According to the selection signal SEL_S received from the vertical drive section 12, the selection transistor 25 opens and closes the path between the signal line VSL_S and the amplification transistor 24.

(Circuit Configuration Example of Reference Pixel)

The reference pixel 30 has a circuit configuration having a photodiode 31, a transfer transistor 32, a reset transistor 33, the amplification transistor 34, a selection transistor 35, and a floating diffusion 36. The configuration of each of these elements (31 to 36) is basically the same as the configuration of a corresponding one of the elements (21 to 26) of the selection pixel 20.

It should be noted that a source electrode of the amplification transistor 34 is connected to a common wire VCOM together with a source electrode of the amplification transistor 24. In addition, the reset transistor 33 is connected between the floating diffusion 36 and a reset line VRD_R that receives a reset voltage $V_{rst}$, and the selection transistor 25 is connected between a signal line VSL_R and the amplification transistor 34.

The gate electrode of the transfer transistor 22, the gate electrode of the reset transistor 33, and the gate electrode of the selection transistor 25 receive, from the vertical drive section 12 depicted in FIG. 1, a transfer signal TRG_R that makes a high level active, a reset signal RST_R that makes a high level active, and a selection signal SEL_R that makes a high level active, respectively.

(Configuration Example of Current Mirror Circuit)

For example, the current mirror circuit 51 includes two P-channel MOS type field effect transistors (described as "PMOS transistors" below), that is, a PMOS transistor 511 and a PMOS transistor 512, and a gate electrodes of the PMOS transistor 511 and PMOS transistor 512 are connected in common. The PMOS transistor 511 has a configuration with diode connection in which the gate electrode and a drain electrode are connected in common. The PMOS transistor 511 has the drain electrode connected to a node with a power source voltage $V_{DD}$, and a source electrode connected to the signal line VSL_R. The PMOS transistor 512 has a drain electrode connected to a node with the power source voltage $V_{DD}$, and a source electrode connected to the signal line VSL_S.

The current mirror circuit 51 having the configuration described above outputs, from the PMOS transistor 511, a reference current to the signal line VSL_R on the reference-pixel 30 side, and outputs, from the PMOS transistor 512, a signal current having a value equal to the reference current to the signal line VSL_S on the selection-pixel-20 side. Here, being "equal" means substantially being equal in addition to being strictly equal, and there can be various variations attributable to designing or manufacturing.

The signal line VSL_S and the reset line VRD_S on the selection-pixel-20 side, the signal line VSL_R and the reset line VRD_R on the reference-pixel 30 side, and the common wire VCOM are a group of the vertical signal lines 112, and are provided for each pixel column.

The constant current source 52 is connected between a reference potential node (e.g. a ground) and the common wire VCOM that connects the source electrodes of the amplification transistor 24 of the selection pixel 20 and the amplification transistor 34 of the reference pixel 30 in common, and controls a current from the common wire VCOM such that the current therefrom becomes a constant current. For example, the constant current source 52 can be implemented by an N-type transistor having a gate electrode to which a predetermined bias voltage is applied.

The current mirror circuit 51, the amplification transistor 24 of the selection pixel 20, the amplification transistor 34 of the reference pixel 30 and the constant current source 52 connected to the common wire VCOM each of which has the configuration described above form the differential amplification circuit 50 that amplifies a pair of differential input voltages. The differential amplification circuit 50 is provided for each pixel column, and forms the column readout circuit section 13 in FIG. 1.

In this differential amplification circuit 50, one of the pair of differential input voltages is input to the gate electrode of the amplification transistor 24 on the selection-pixel-20 side, and the other of the pair of differential input voltages is input to a gate electrode of the amplification transistor 34 on the reference-pixel 30 side. Then, an output voltage obtained by amplifying the differential input voltages is output to the column signal processing section 14 in FIG. 1 via the signal line VSL_S on a drain-electrode side of the amplification transistor 24.

Using the differential amplification circuit 50 having the configuration described above as a pixel readout circuit that reads out pixel signals provides an advantage that signal readout can be performed at high conversion efficiency because the amplification rate is higher as compared to a case that a circuit, for example a source follower circuit, other than a differential amplification circuit is used as a pixel readout circuit. Meanwhile, the source follower circuit used as the pixel readout circuit includes the amplification transistor 24 and the constant current source 52 connected to the amplification transistor 24.

[Regarding Voltage Clipping Functionality of Bypass Control Section]

The differential amplification circuit 50 is provided with a bypass control section 53 having a voltage clipping functionality of limiting (clipping), to a predetermined voltage, a voltage (differential output voltage) of a differential output node $N_1$ when light with high illuminance higher than predetermined illuminance enters. By using the voltage clipping functionality, the bypass control section 53 limits (clips) the voltage of the differential output node $N_1$ to an upper limit voltage at which an active load (the PMOS transistor 512) of the current mirror circuit 51 operates in the saturated area.

The bypass control section 53 has a configuration having a bypass transistor 531 connected between the constant current source 52 and the differential output node $N_1$ of the differential amplification circuit 50, and a voltage control section 532 that performs ON/OFF control of the bypass transistor 531. For example, the bypass transistor 531 includes a PMOS transistor. Upon detecting that the illuminance of incident light is higher than the predetermined illuminance, specifically, upon detecting that the voltage of the differential output node $N_1$ is higher than the predetermined voltage, the voltage control section 532 turns on the bypass transistor 531.

Due to an effect of the bypass transistor 531, the bypass control section 53 selectively establishes connection (forms a bypass path) between the constant current source 52 and the differential output node $N_1$ of the differential amplification circuit 50, and causes a bypass current to flow therethrough, to thereby limit (clip) the voltage (differential output voltage) of the differential output node $N_1$ to the predetermined voltage. Because this voltage clipping functionality makes unnecessary a stabilization period for the active load (PMOS transistor 512) of the current mirror circuit 51 to return to the saturated area, it is possible to attempt to enhance the frame rate by a corresponding amount.

Figure 26:
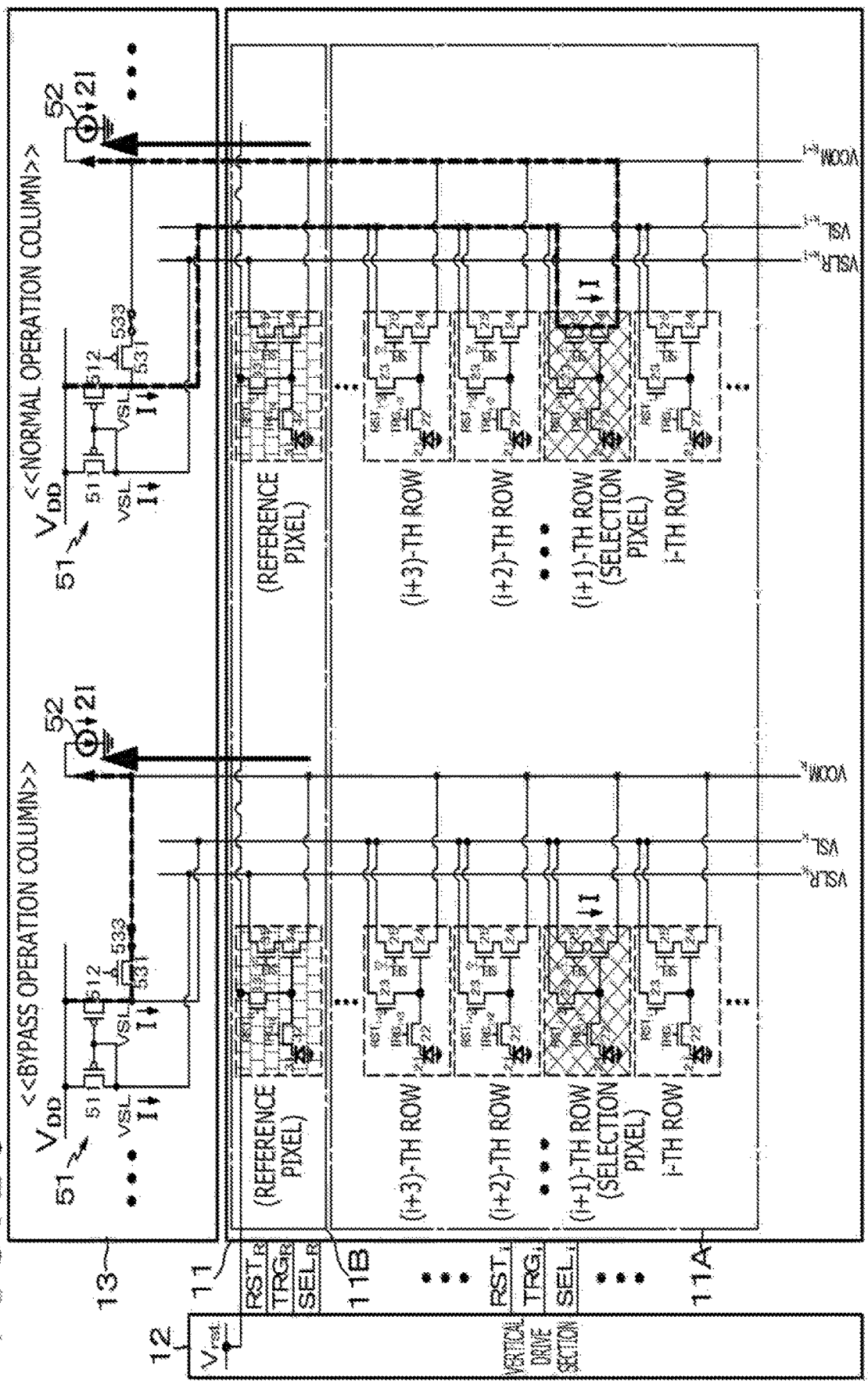
FIG. 26 is a circuit diagram for explaining the occurrence of streaking accompanying a potential variation of a common wire.

However, if the current flows through the bypass path due to the bypass transistor 531, as depicted in FIG. 26, voltage drop amounts (what is generally called IR drop amounts) resulting from wire resistances of the common wires VCOM from the source electrodes of the amplification transistors 34 of reference pixels 30 to the constant current sources 52 become different between a normal operation column and a bypass operation column in response to light incidence. FIG. 26 illustrates a case of reference pixel fixation and single-sided readout mentioned later. If the potential of a common wire VCOM varies, the potential variations are propagated to adjacent columns through a power source, a ground, or linkages to adjacent columns. Thereby, streaking which is streak noise is generated in a captured image in the horizontal direction (i.e. in the row direction of a matrix-like pixel array). The occurrence of streaking becomes a cause of deterioration of the image quality of the captured image.

As mentioned above, in the differential-amplification type imaging device including the bypass control section 53 and having the voltage clipping functionality of limiting the voltage of the differential output node $N_1$ to the predetermined voltage when high-illuminance light enters, a bypass current directly flows into the constant current source 52 through the common wire VCOM in a pixel column where the bypass control section 53 operates. As a result, streaking occurs due to a difference between IR drop amounts from the source electrodes of the amplification transistors 34 of reference pixels 30 to the constant current sources 52 in the pixel column where the bypass current flows and a pixel column where a bypass current does not flow.

First Embodiment of Present Disclosure

In view of this, in a first embodiment of the present disclosure, in the differential-amplification type imaging device including the bypass control section 53 and having the voltage clipping functionality, IR drop amounts resulting from wire resistances of the common wires VCOM from reference pixels 30 to the constant current sources 52 are made equal to each other between a pixel column where a bypass current flows and a pixel column where a bypass current does not flow. Here, being "equal" means substantially being equal in addition to being strictly equal, and there can be various variations attributable to designing or manufacturing.

Specifically, in the first embodiment, a current path for bypass current through which a bypass current is caused to flow is provided in the pixel array section 11. Then, in a pixel column where the bypass control section 53 operates, instead of supplying a bypass current directly to the constant current source 52 through the common wire VCOM, the bypass current is caused to flow through the current path for bypass current in the pixel array section 11, and then is supplied to the constant current source 52 through the common wire VCOM.

By causing the bypass current that flows when the bypass control section 53 operates to flow to the common wire VCOM through the current path for bypass current provided in the pixel array section 11 in this manner, a difference between IR drop amounts from reference pixels 30 to the constant current sources 52 in a pixel column where a bypass current flows and a pixel column where a bypass current does not flow can be reduced. As a result, an electric potential difference between the pixel column where a bypass current flows and the pixel column where a bypass current does not flow can be reduced, so that the occurrence of streaking can be reduced.

Specific implementation examples of the first embodiment are explained below. In the first embodiment, a current path for bypass current through which a bypass current is caused to flow is provided in the pixel array section 11 in order to reduce a difference between IR drop amounts due to currents of wire resistances of the common wires VCOM from reference pixels 30 to the constant current sources 52 in a pixel column where a bypass current flows and a pixel column where a bypass current does not flow.

First Implementation Example

A first implementation example is an example of reference pixel following and single-sided readout in which reference pixels 30 move to follow selection pixels 20.

Figure 6:
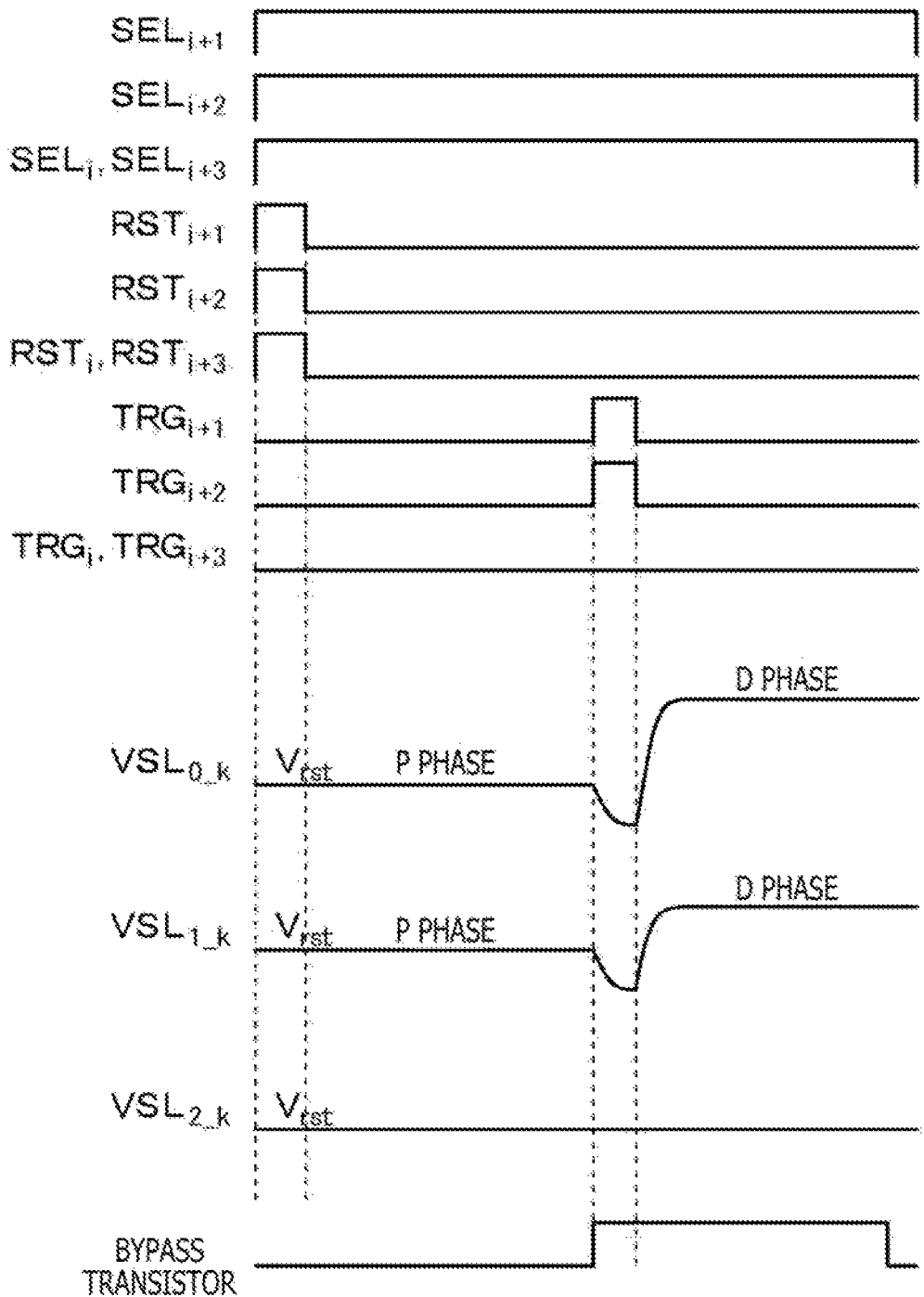
FIG. 6 is a timing chart in a case of reference pixel following.

A timing chart in a case of reference pixel following is depicted in FIG. 6. FIG. 6 depicts a timing relation among selection signals $SEL_i$ to $SEL_{i+3}$, reset signals $RST_i$ to $RST_{i+3}$, transfer signals $TRG_i$ to $TRG_{i+3}$ and the bypass transistor 531. Suffixes i of the selection signals SEL, the reset signals RST, and the transfer signals TRG represent selection pixel rows.

FIG. 6 further depicts waveforms of signal levels $VSL_{0\_k}$ to $VSL_{2\_k}$ of the vertical signal lines 112. The signal levels $VSL_{0\_k}$ to $VSL_{2\_k}$ of the vertical signal lines 112 include P phase (reset data) and D phase (signal data) to be sequentially read out from selection pixels 20.

In addition, in FIG. 6, the top portions and middle portions of the selection signals SEL, the reset signals RST, and the transfer signals TRG represent a timing relation of selection pixels 20, and the bottom portions represent a timing relation of a reference pixel 30. As is apparent from the timing chart in FIG. 6, the reference pixel 30 moves to follow the selection pixels 20 that are selected and scanned. Note that, for the reference pixel 30, charge transfer from the photodiode 31 to the floating diffusion 36 is not performed, as depicted in the timing chart in FIG. 6.

Figure 7:
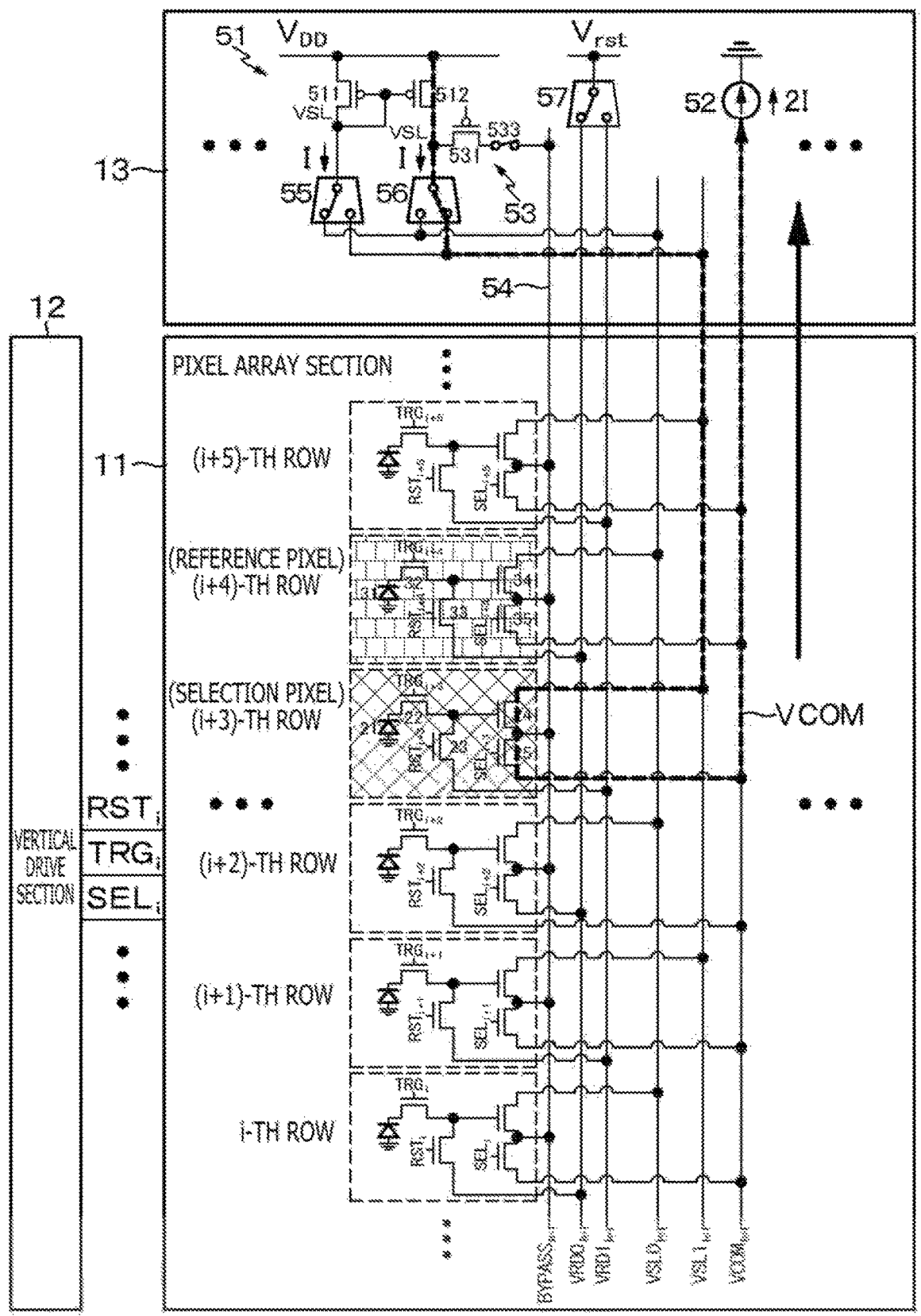
FIG. 7 is a circuit diagram for explaining operation of a normal operation column in the differential-amplification type imaging device according to a first implementation example.
Figure 8:
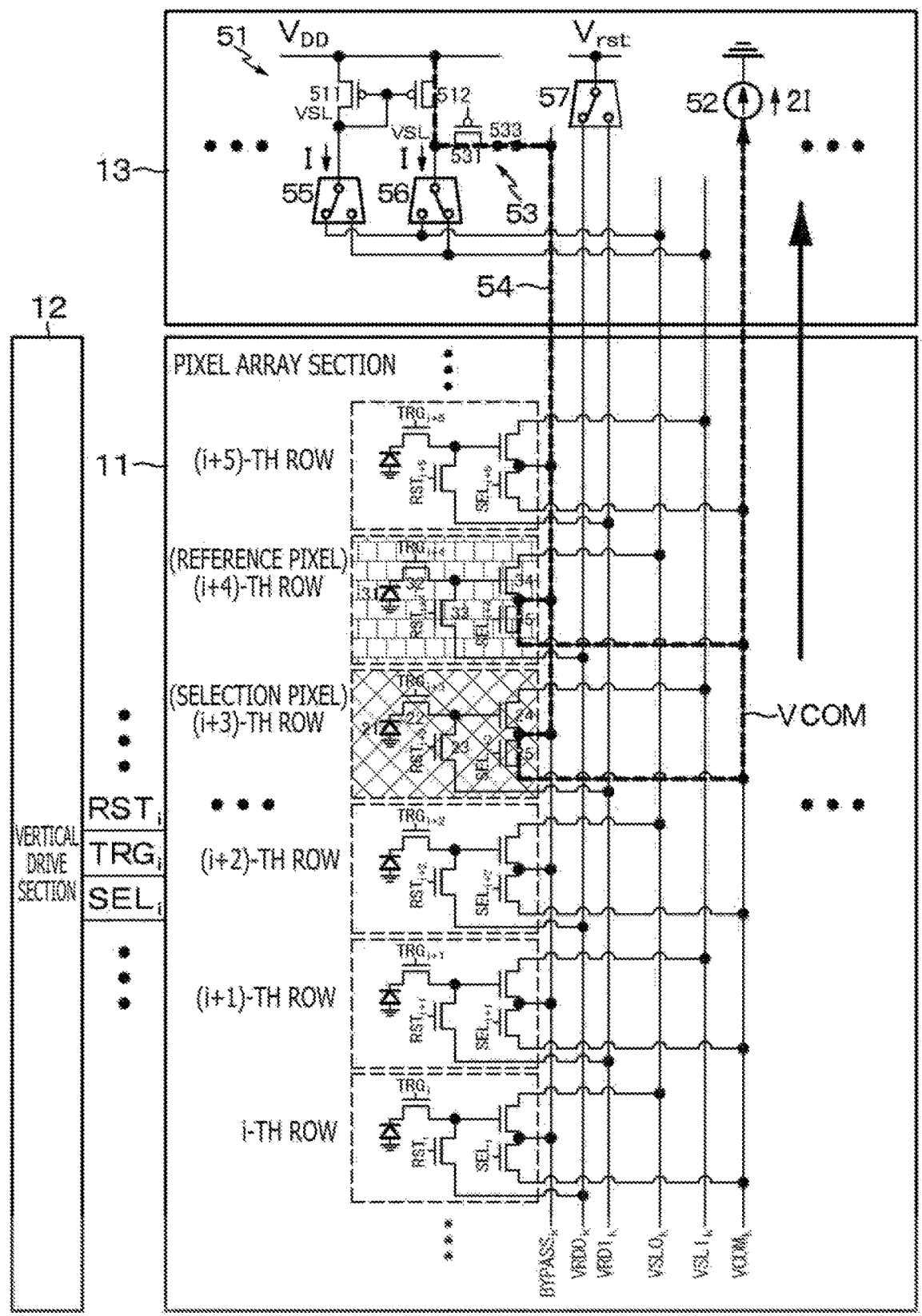
FIG. 8 is a circuit diagram for explaining operation of a bypass operation column in response to light incidence in the differential-amplification type imaging device according to the first implementation example.

FIG. 7 is a circuit diagram for explaining operation of a normal operation column in the differential-amplification type imaging device according to the first implementation example, and FIG. 8 is a circuit diagram for explaining operation of a bypass operation column in response to light incidence in the differential-amplification type imaging device according to the first implementation example. The normal operation column and the bypass operation column are different pixel columns at the same time. The same applies also to implementation examples mentioned later. In the case mentioned here as an example, a pixel in the (i+4)-th row is treated as a reference pixel 30, and a pixel in the (i+3)-th row is treated as a selection pixel 20.

The differential-amplification type imaging device according to the first implementation example has a configuration that uses, as a current path for bypass current, a bypass wire 54 provided for each pixel column along the pixel column. As a wire that specifies a clip connection destination that limits the voltage of the differential output node $N_1$, the bypass wire 54 is linked to a common connection node of the amplification transistor 24 (34) and the selection transistor 25 (35) of each pixel of the pixel array section 11. In addition, one end of the bypass wire 54 is connected to the bypass control section 53. In the bypass control section 53, a switch 533 is a selector switch for switching between activation and deactivation of the functionality of the bypass transistor 531.

In FIG. 7 and FIG. 8, a selector switch 55 on the output side of a reference signal I, a selector switch 56 on the output side of a signal current I, and a selector switch 57 of the reset voltage $V_{rst}$ are switches for switching between odd-numbered pixel rows/even-numbered pixel rows.

In the differential-amplification type imaging device according to the first implementation example having the configuration described above, at normal time when the bypass transistor 531 is turned off, the signal current I output from the PMOS transistor 512 of the current mirror circuit 51 flows through a path represented by a broken bold line in FIG. 7. That is, after passing through the amplification transistor 24 and the selection transistor 25 of the selection pixel 20 in the (i+3)-th row, the signal current I flows into the constant current source 52 through the common wire VCOM.

At a time of bypass when the bypass transistor 531 is turned on, a bypass current that flows through the bypass transistor 531 flows through a path represented by a broken bold line in FIG. 8. That is, after flowing through the amplification transistor 34 of the reference pixel 30 in the (i+4)-th row and the amplification transistor 24 of the selection pixel 20 in the (i+3)-th row through the bypass wire 54, the bypass current flows into the constant current source 52 through the common wire VCOM.

As mentioned above, in the differential-amplification type imaging device according to the first implementation example, because the bypass wire 54 is provided as a current path for bypass current along a pixel column, a bypass current at time when the bypass transistor 531 is turned on flows in the pixel array section 11 through the bypass wire 54, and then flows into the constant current source 52 through the common wire VCOM. Thereby, it is possible to reduce a difference between IR drop amounts from reference pixels 30 to the constant current sources 52 in a pixel column where a bypass current flows and a pixel column where a bypass current does not flow, and to reduce an electric potential difference; as a result, the occurrence of streaking can be reduced.

Second Implementation Example

A second implementation example is a modification example of the first implementation example, and is an example of reference pixel following and single-sided readout in which the constant current source 52 is arranged on a side opposite to the bypass transistor 531 sandwiching the pixel array section 11.

Figure 9:
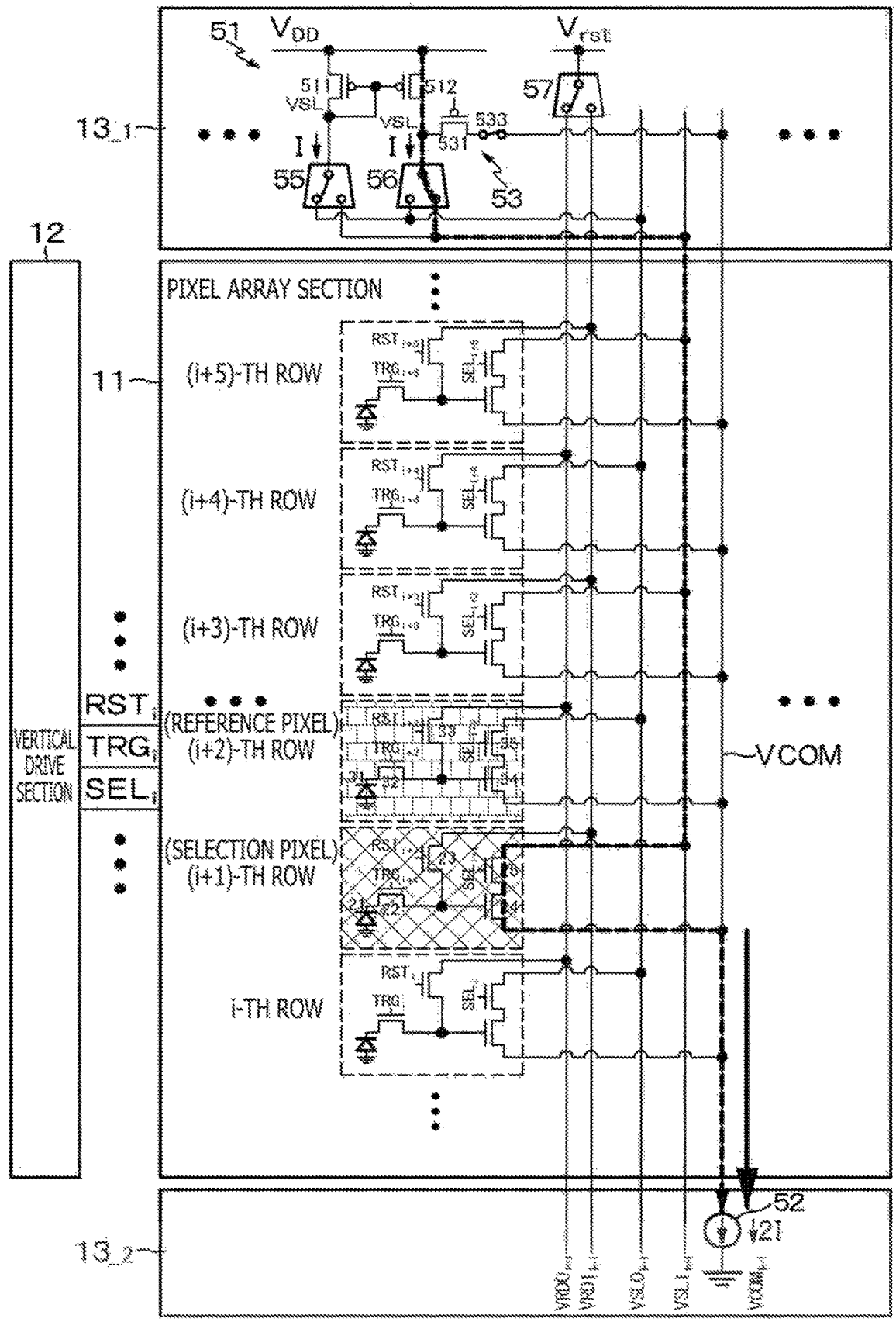
FIG. 9 is a circuit diagram for explaining operation of the normal operation column in the differential-amplification type imaging device according to a second implementation example.
Figure 10:
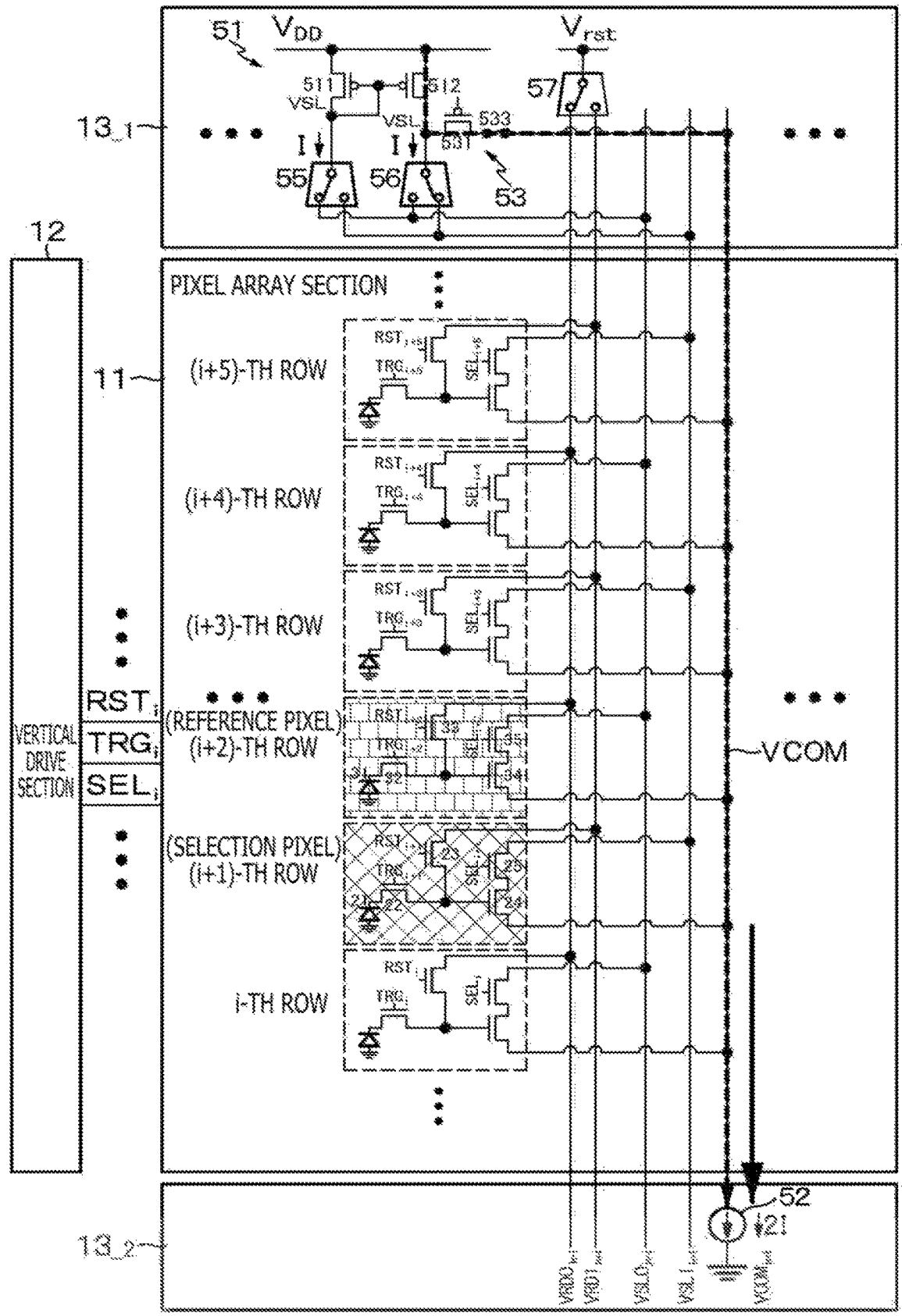
FIG. 10 is a circuit diagram for explaining operation of the bypass operation column in response to light incidence in the differential-amplification type imaging device according to the second implementation example.

FIG. 9 is a circuit diagram for explaining operation of a normal operation column in the differential-amplification type imaging device according to the second implementation example, and FIG. 10 is a circuit diagram for explaining operation of a bypass operation column in response to light incidence in the differential-amplification type imaging device according to the second implementation example. In the case mentioned here as an example, in the pixel array section 11, a pixel in the (i+2)-th row is treated as a reference pixel 30, and a pixel in the (i+1)-th row is treated as a selection pixel 20.

The differential-amplification type imaging device according to the second implementation example has a configuration in which the constant current source 52 connected to the common wire VCOM connecting the source electrodes of the amplification transistor 24 of the selection pixel 20 and the amplification transistor 34 of the reference pixel 30 in common is arranged on a side opposite to the bypass control section 53 sandwiching the pixel array section 11. The common wire VCOM is placed for each pixel column of the pixel array section 11 along the pixel column, and has one end connected to the bypass control section 53. Then, the other end of the common wire VCOM is connected with the constant current source 52.

In FIG. 9 and FIG. 10, the column readout circuit section 13 on a side where the bypass control section 53 is arranged is defined as a column readout circuit section 13_1, and the column readout circuit section 13 on a side where the constant current source 52 is arranged is defined as a column readout circuit section 132. Then, the differential-amplification type imaging device according to the second implementation example has a configuration in which the common wire VCOM doubles as a current path for bypass current.

In the differential-amplification type imaging device according to the second implementation example having the configuration described above, at normal time when the bypass transistor 531 is turned off, the signal current I output from the PMOS transistor 512 of the current mirror circuit 51 flows through a path represented by a broken bold line in FIG. 9. That is, after passing through the selection transistor 25 and the amplification transistor 24 of the selection pixel 20 in the (i+1)-th row, the signal current I flows into the constant current source 52 arranged on the column-readout-circuit-section-13_2 side through the common wire VCOM.

At a time of bypass when the bypass transistor 531 is turned on, a bypass current that flows through the bypass transistor 531 flows through a path represented by a broken bold line in FIG. 10. That is, the bypass current flows into the constant current source 52 arranged on the column-readout-circuit-section-13_2 side through the common wire VCOM as a current path for bypass current.

As mentioned above, because the differential-amplification type imaging device according to the second implementation example of reference pixel following and single-sided readout has a configuration in which the existing common wire VCOM doubles as a current path for bypass current, effects and advantages similar to those of the differential-amplification type imaging device according to the first implementation example can be attained without increasing the number of wires. That is, because the bypass current at time when the bypass transistor 531 is turned on flows into the constant current source 52 through the common wire VCOM which is a wire in the pixel array section 11, it is possible to reduce a difference between IR drop amounts from reference pixels 30 to the constant current sources 52 in a pixel column where a bypass current flows and a pixel column where a bypass current does not flow, and to reduce the occurrence of streaking.

Third Implementation Example

A third implementation example is an example of reference pixel fixation and single-sided readout in which a reference pixel 30 is arranged fixedly.

Figure 11:
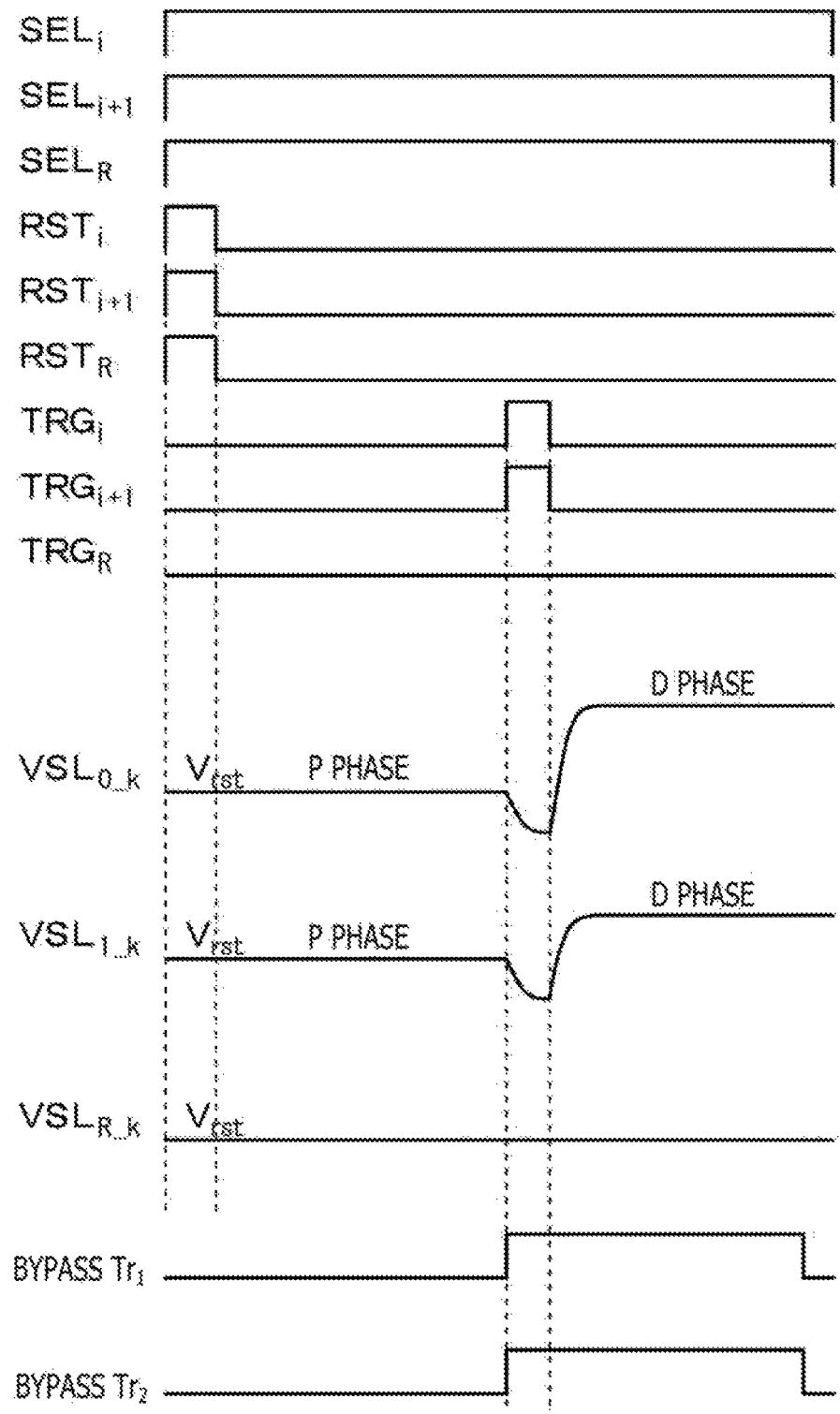
FIG. 11 is a timing chart in a case of reference pixel fixation.

A timing chart in a case of reference pixel fixation is depicted in FIG. 11. FIG. 11 depicts a timing relation among selection signals $SEL_i$, $SEL_{i+1}$, and $SEL_R$, reset signals $RST_i$, $RST_{i+1}$, and $RST_R$, transfer signals $TRG_i$, $TRG_{i+1}$, and $TRG_R$ and the bypass transistor 531. Here, the selection signal $SEL_R$, the reset signal $RST_R$, and the transfer signal $TRG_R$ are drive signals of the reference pixel 30.

FIG. 11 further depicts waveforms of signal levels $VSL_{0\_k}$, $VSL_{1\_k}$, and $VSL_{R\_k}$ of the vertical signal lines 112. The signal levels $VSL_{0\_k}$ and $VSL_{1\_k}$ of the vertical signal lines 112 include P phase (reset data) and D phase (signal data) to be sequentially read out from selection pixels 20. The signal level $VSL_{R\_k}$ is a signal level of the reference pixel 30.

Figure 12:
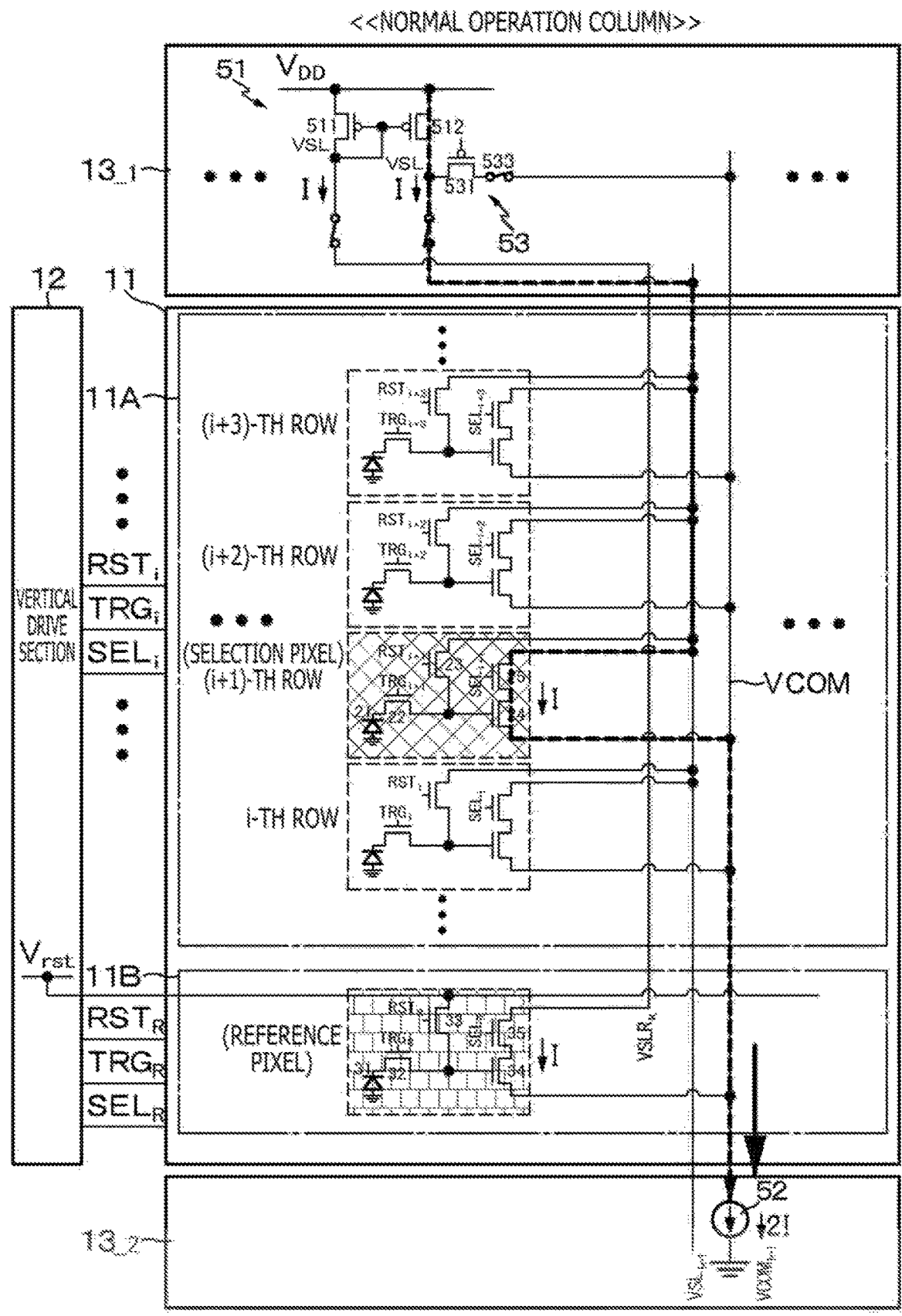
FIG. 12 is a circuit diagram for explaining operation of the normal operation column in the differential-amplification type imaging device according to a third implementation example.
Figure 13:
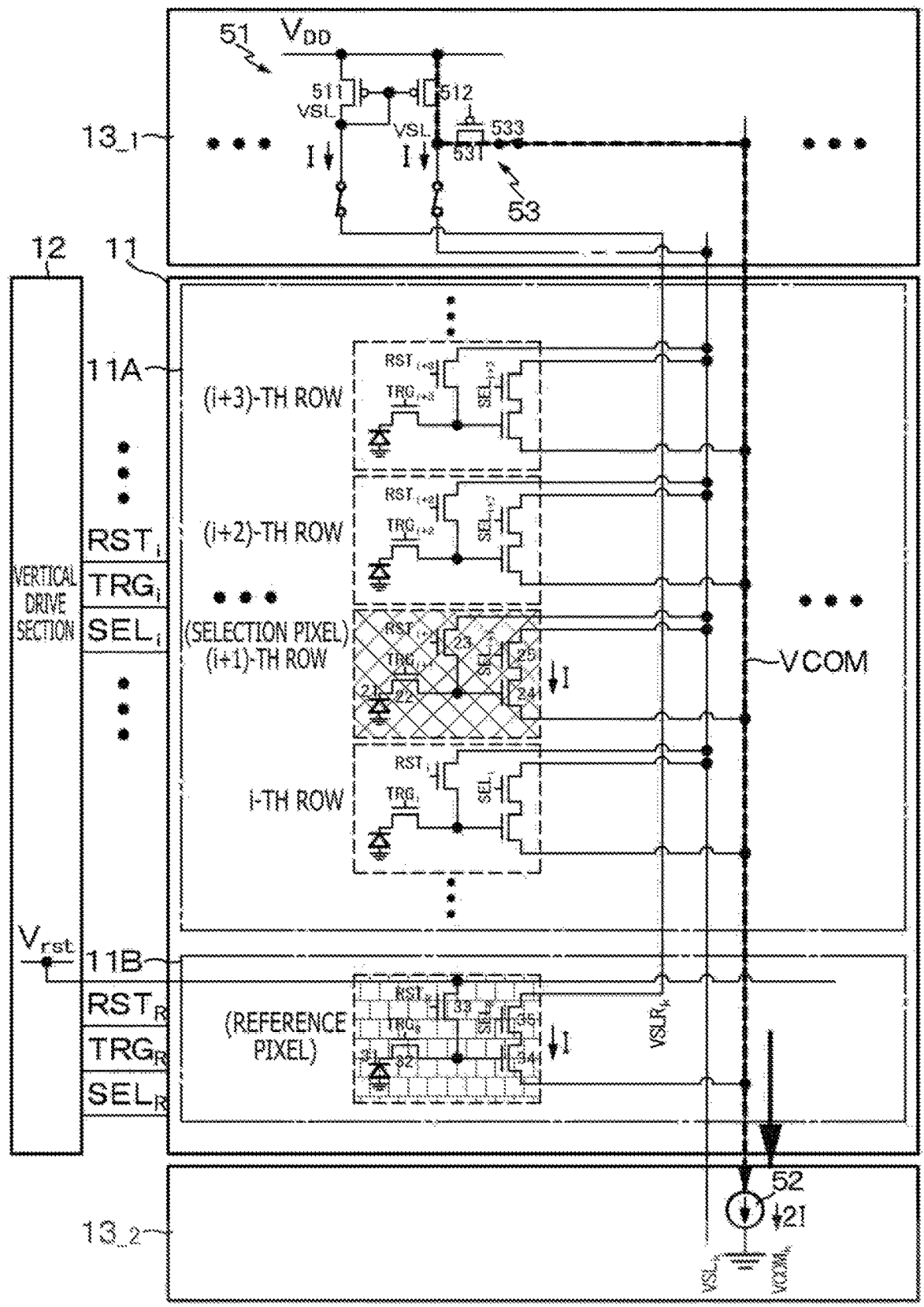
FIG. 13 is a circuit diagram for explaining operation of the bypass operation column in response to light incidence in the differential-amplification type imaging device according to the third implementation example.

FIG. 12 is a circuit diagram for explaining operation of a normal operation column in the differential-amplification type imaging device according to the third implementation example, and FIG. 13 is a circuit diagram for explaining operation of a bypass operation column in response to light incidence in the differential-amplification type imaging device according to the third implementation example.

In a case of single-sided readout and reference pixel fixation, the pixel array section 11 includes a selection pixel area 11A where selection pixels 20 are arranged, and a reference pixel area 11B where a reference pixel 30 is arranged. In the case mentioned as an example in the present example, a pixel in the (i+1)-th row is treated as a selection pixel 20 in the selection pixel area 11A.

Similarly to the case of the second implementation example, in the differential-amplification type imaging device according to the third implementation example, there are the column readout circuit section 131 where the bypass control section 53 is arranged, and the reference pixel area 11B which is on an opposite side sandwiching the selection pixel area 11A of the pixel array section 11. Note that, instead of being on the opposite side sandwiching the selection pixel area 11A, the reference pixel area 11B may be on the same side. Further, in this configuration, the constant current source 52 is arranged in the column readout circuit section 132 on the side opposite to the column readout circuit section 131 sandwiching the pixel array section 11, and also the common wire VCOM doubles as a current path for bypass current.

In the differential-amplification type imaging device according to the third implementation example having the configuration described above, at normal time when the bypass transistor 531 is turned off, the signal current I output from the PMOS transistor 512 of the current mirror circuit 51 flows through a path represented by a broken bold line in FIG. 12. That is, after passing through the selection transistor 25 and amplification transistor 24 of the selection pixel 20 in the (i+1)-th row, the signal current I flows into the constant current source 52 arranged on the column-readout-circuit-section-13$_{-2}$ side through the common wire VCOM.

At a time of bypass when the bypass transistor 531 is turned on, a bypass current that flows through the bypass transistor 531 flows through a path represented by a broken bold line in FIG. 13. That is, the bypass current flows into the constant current source 52 arranged on the column-readout-circuit-section-13$_{-2}$ side through the common wire VCOM as a current path for bypass current.

As mentioned above, according to the differential-amplification type imaging device according to the third implementation example of reference pixel fixation and single-sided readout, effects and advantages similar to those of the second implementation example can be attained. That is, because the existing common wire VCOM doubles as a current path for bypass current and a bypass current is caused to flow in the pixel array section 11, effects and advantages similar to those of the first implementation example can be attained, that is, it is possible to reduce a difference between IR drop amounts from reference pixels 30 to the constant current sources 52 in a pixel column where a bypass current flows and a pixel column where a bypass current does not flow, and to reduce the occurrence of streaking, without increasing the number of wires.

Fourth Implementation Example

A fourth implementation example is an example of reference pixel following and double-sided readout.

Figure 14:
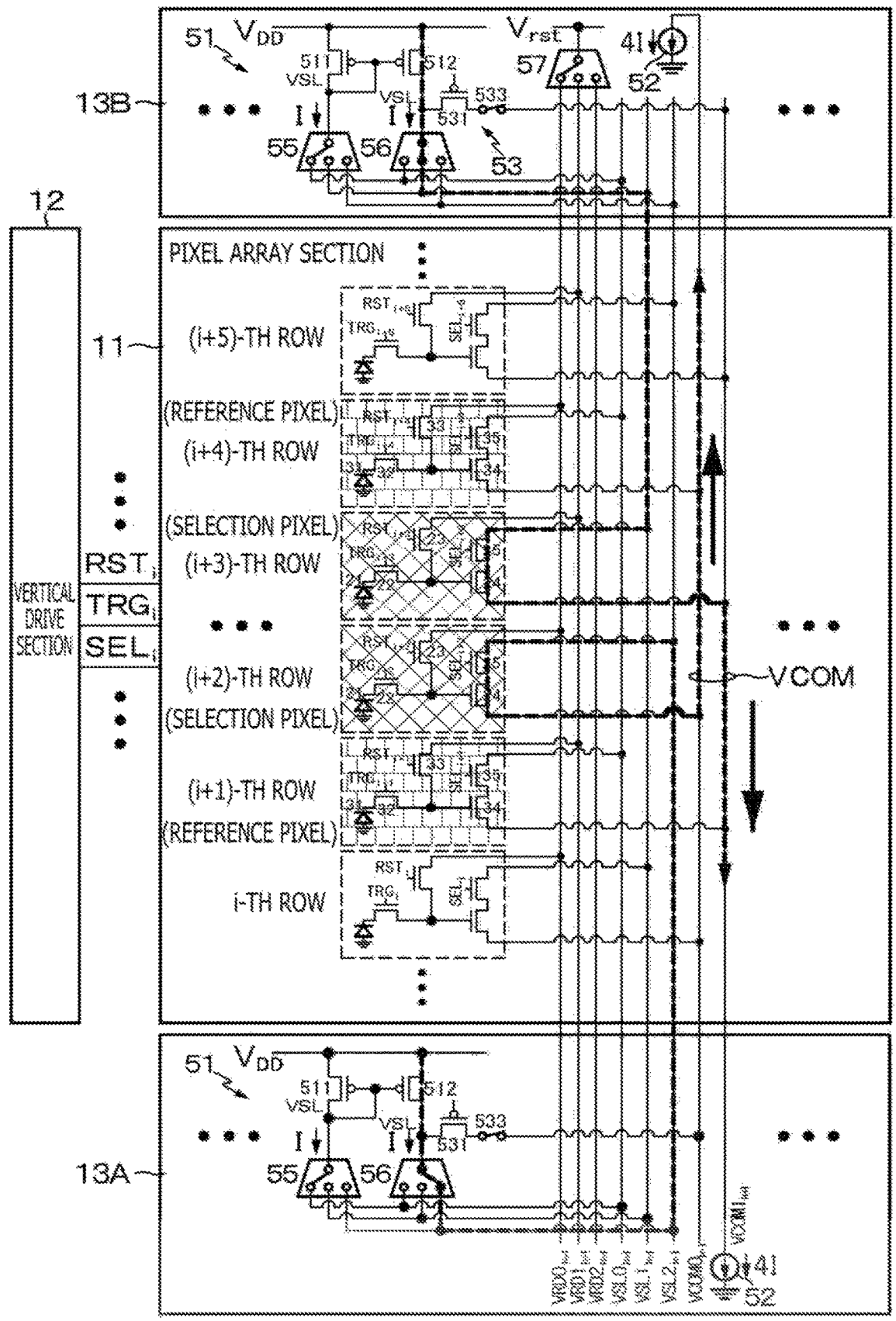
FIG. 14 is a circuit diagram for explaining operation of the normal operation column in the differential-amplification type imaging device according to a fourth implementation example.
Figure 15:
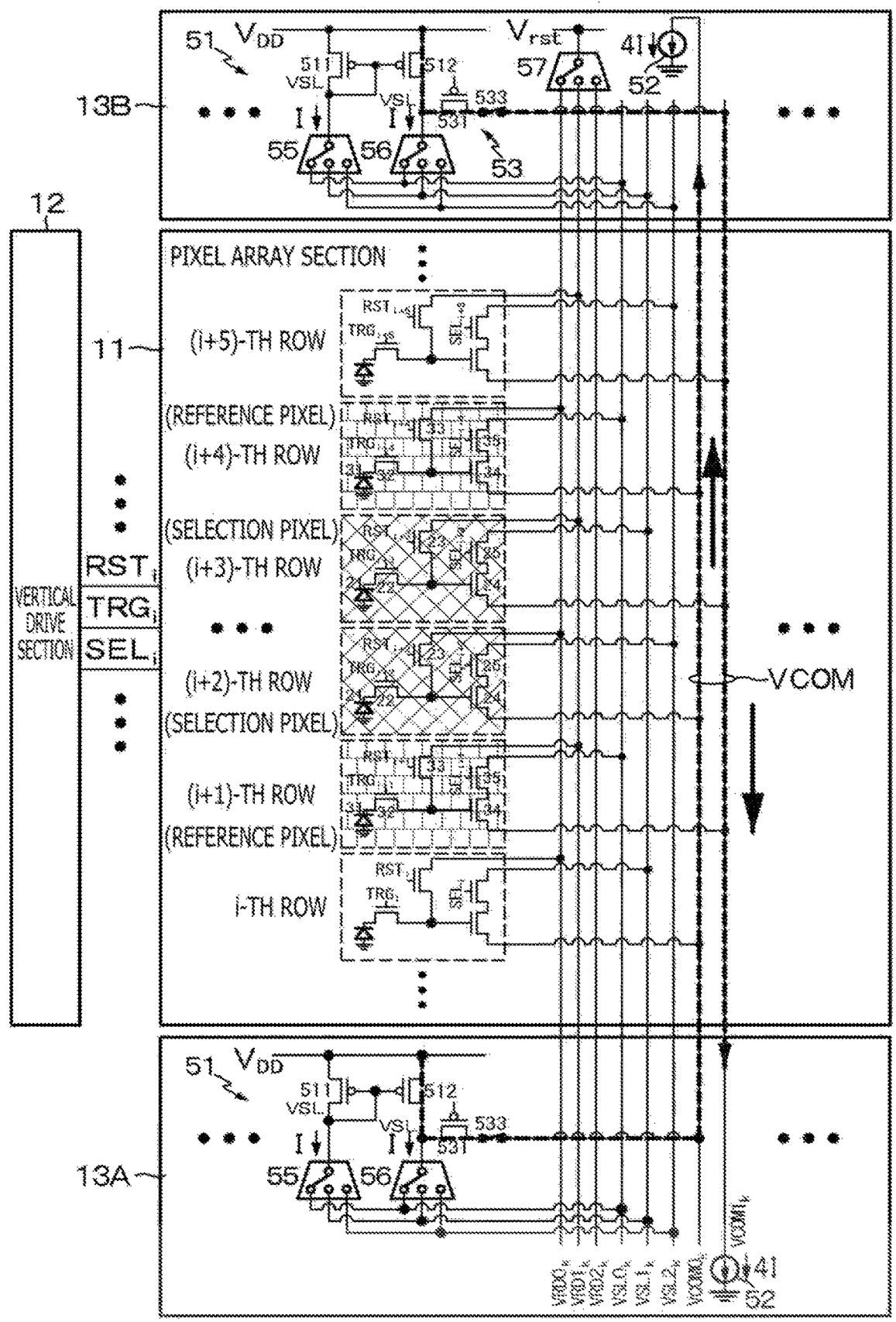
FIG. 15 is a circuit diagram for explaining operation of the bypass operation column in response to light incidence in the differential-amplification type imaging device according to the fourth implementation example.

FIG. 14 is a circuit diagram for explaining operation of a normal operation column in the differential-amplification type imaging device according to the fourth implementation example, and FIG. 15 is a circuit diagram for explaining operation of a bypass operation column in response to light incidence in the differential-amplification type imaging device according to the fourth implementation example.

In the double-sided readout imaging device, the column readout circuit section 13A and the column readout circuit section 13B are provided on the lower side and upper side sandwiching the pixel array section 11, and the constant current source 52 and the bypass control section 53 including the bypass transistor 531 are arranged in each of the column readout circuit section 13A and the column readout circuit section 13B. In the case mentioned here as an example, pixels in the (i+1)-th row and the (i+4)-th row are treated as reference pixels 30, and pixels in the (i+2)-th row and the (i+3)-th row are treated as double-sided readout selection pixels 20.

The differential-amplification type imaging device according to the fourth implementation example also has a configuration in which the common wires VCOM double as current paths for bypass current. The pixel array section 11 is provided with two common wires VCOM0 and VCOM1 as the common wires VCOM. One common wire VCOM0 connects the source electrode of the amplification transistor 24 of the selection pixel 20 in the (i+2)-th row and the source electrode of the amplification transistor 34 of the reference pixel 30 in the (i+4)-th row in common. The other common wire VCOM1 connects the source electrode of the amplification transistor 24 of the selection pixel 20 in the (i+3)-th row and the source electrode of the amplification transistor 34 of the reference pixel 30 in the (i+1)-th row in common.

In the differential-amplification type imaging device according to the fourth implementation example having the configuration described above, at normal time when the bypass transistors 531 are turned off, the signal currents I output from the PMOS transistors 512 of the current mirror circuits 51 on the column-readout-circuit-section-13A side and on the column-readout-circuit-section-13B side flow through paths represented by broken bold lines in FIG. 14. That is, after passing through the selection transistor 25 and the amplification transistor 24 of the selection pixel 20 in the (i+2)-th row, the signal current I on the column-readout-circuit-section-13A side flows into the constant current source 52 arranged on the column-readout-circuit-section-13B side through the common wire VCOM0. In addition, after passing through the selection transistor 25 and amplification transistor 24 of the selection pixel 20 in the (i+3)-th row, the signal current I on the column-readout-circuit-section-13B side flows into the constant current source 52 arranged on the column-readout-circuit-section-13A side through the common wire VCOM1.

At a time of bypass when the bypass transistors 531 are turned on, bypass currents that flow through the bypass transistors 531 on the column-readout-circuit-section-13A side and on the column-readout-circuit-section-13B side flow through paths represented by broken bold lines in FIG. 15. That is, the bypass current on the column-readout-circuit-section-13A side flows into the constant current source 52 arranged on the column-readout-circuit-section-13B side through the common wire VCOM0 as a current path for bypass current. In addition, the bypass current on the column-readout-circuit-section-13B side flows into the constant current source 52 arranged on the column-readout-circuit-section-13A side through the common wire VCOM1 as a current path for bypass current.

As mentioned above, because the differential-amplification type imaging device according to the fourth implementation example of reference pixel following and double-sided readout also has a configuration in which the existing common wires VCOM0 and VCOM1 double as current paths for bypass current, effects and advantages similar to those of the first implementation example can be attained without increasing the number of wires. That is, by causing the bypass currents to flow in the pixel array section 11 through the existing common wires VCOM0 and VCOM1, it is possible to reduce a difference between IR drop amounts from reference pixels 30 to the constant current sources 52 in a pixel column where a bypass current flows and a pixel column where a bypass current does not flow, and to reduce an electric potential difference, and as a result, the occurrence of streaking can be reduced.

Fifth Implementation Example

A fifth implementation example is an example of reference pixel fixation and double-sided readout.

Figure 16:
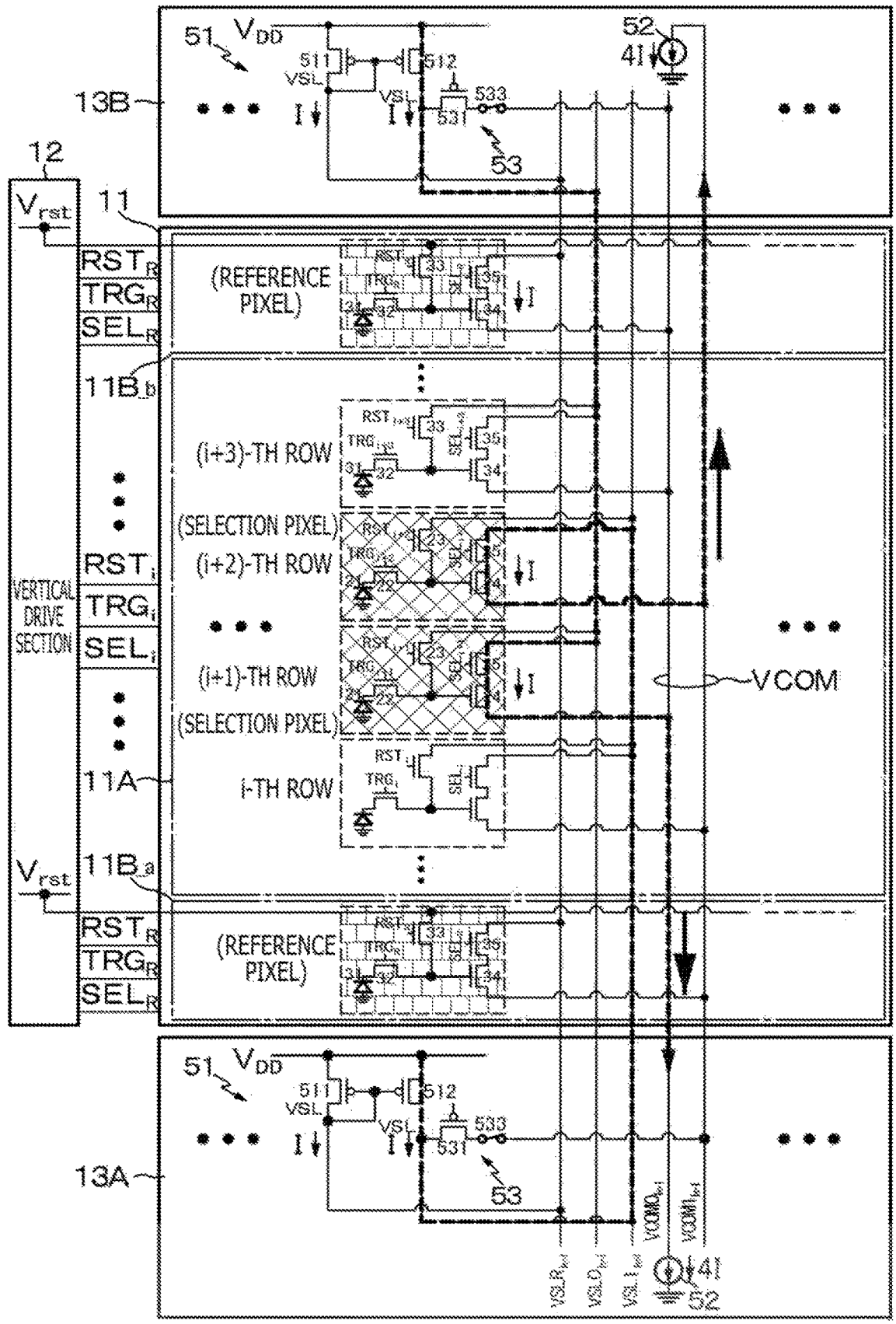
FIG. 16 is a circuit diagram for explaining operation of the normal operation column in the differential-amplification type imaging device according to a fifth implementation example.
Figure 17:
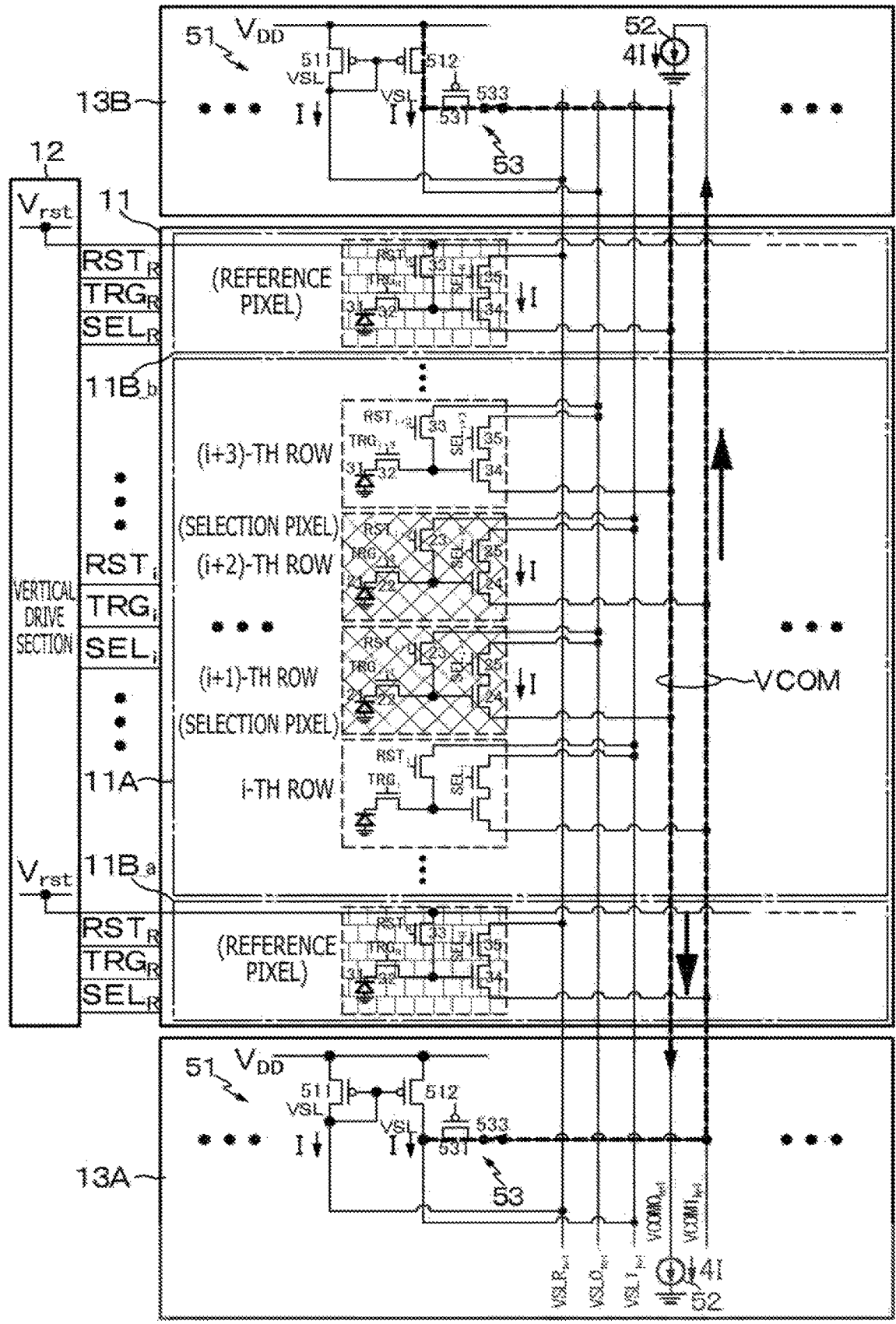
FIG. 17 is a circuit diagram for explaining operation of the bypass operation column in response to light incidence in the differential-amplification type imaging device according to the fifth implementation example.

FIG. 16 is a circuit diagram for explaining operation of a normal operation column in the differential-amplification type imaging device according to the fifth implementation example, and FIG. 17 is a circuit diagram for explaining operation of a bypass operation column in response to light incidence in the differential-amplification type imaging device according to the fifth implementation example.

In a case of double-sided readout and reference pixel fixation, the pixel array section 11 has a configuration in which the selection pixel area 11A where selection pixels 20 are arranged, and the reference pixel area 11B where reference pixels 30 are arranged are included, and further, the reference pixel area 11B includes a lower reference pixel area 11B$_{-a}$ and an upper reference pixel area 11B$_{-b}$ that sandwich the selection pixel area 11A.

In the case mentioned as an example in the present example, in the selection pixel area 11A, pixels in the (i+1)-th row and the (i+2)-th row are treated as double-sided readout selection pixels 20, and pixels in the reference pixel area 11B$_{-a}$ and the reference pixel area 11B$_{-b}$ are treated as double-sided readout reference pixels 30.

In the double-sided readout imaging device, the column readout circuit section 13A and the column readout circuit section 13B are provided on the lower side and upper side sandwiching the pixel array section 11, and the constant current source 52 and the bypass control section 53 including the bypass transistor 531 are arranged in each of the column readout circuit section 13A and the column readout circuit section 13B.

The differential-amplification type imaging device according to the fifth implementation example also has a configuration in which the common wires VCOM double as current paths for bypass current. The pixel array section 11 is provided with the two common wires VCOM0 and VCOM1 as the common wires VCOM. One common wire VCOM0 connects the source electrode of the amplification transistor 24 of the selection pixel 20 in the (i+1)-th row and the source electrode of the amplification transistor 34 of the reference pixel 30 on the reference-pixel-area-11B$_{-b}$ side in common. Then, one common wire VCOM0VCOM0 has one end connected to the bypass control section 53 on the column-readout-circuit-section-13B side, and the other end connected to the constant current source 52 on the column-readout-circuit-section-13A side. The other common wire VCOM1 connects the source electrode of the amplification transistor 24 of the selection pixel 20 in the (i+2)-th row and the source electrode of the amplification transistor 34 of the reference pixel 30 on the reference-pixel-area-11B$_{-a}$ side in common. Then, the other common wire VCOM1 has one end connected to the bypass control section 53 on the column-readout-circuit-section-13A side, and the other end connected to the constant current source 52 on the column-readout-circuit-section-13B side.

In the differential-amplification type imaging device according to the fifth implementation example having the configuration described above, at normal time when the bypass transistors 531 are turned off, the signal currents I output from the PMOS transistors 512 of the current mirror circuits 51 on the column-readout-circuit-section-13A side and on the column-readout-circuit-section-13B side flow through paths represented by broken bold lines in FIG. 16.

That is, after passing through the selection transistor 25 and the amplification transistor 24 of the selection pixel 20 in the (i+2)-th row, the signal current I on the column-readout-circuit-section-13A side flows into the constant current source 52 arranged on the column-readout-circuit-section-13A side through the common wire VCOM0. In addition, after passing through the selection transistor 25 and the amplification transistor 24 of the selection pixel 20 in the (i+1)-th row, the signal current I on the column-readout-circuit-section-13B side flows into the constant current source 52 arranged on the column-readout-circuit-section-13B side through the common wire VCOM1.

At a time of bypass when the bypass transistors 531 are turned on, bypass currents that flow through the bypass transistors 531 on the column-readout-circuit-section-13A side and on the column-readout-circuit-section-13B side flow through paths represented by broken bold lines in FIG. 17. That is, the bypass current on the column-readout-circuit-section-13A side flows into the constant current source 52 arranged on the column-readout-circuit-section-13B side through the common wire VCOM1 as a current path for bypass current. In addition, the bypass current on the column-readout-circuit-section-13B side flows into the constant current source 52 arranged on the column-readout-circuit-section-13A side through the common wire VCOM0 as a current path for bypass current.

As mentioned above, because the differential-amplification type imaging device according to the fifth implementation example of reference pixel fixation and double-sided readout also has a configuration in which the existing common wires VCOM0 and VCOM1 double as current paths for bypass current, effects and advantages similar to those of the first implementation example can be attained without increasing the number of wires. That is, by causing the bypass currents to flow in the pixel array section 11 through the existing common wires VCOM0 and VCOM1, it is possible to reduce a difference between IR drop amounts from reference pixels 30 to the constant current sources 52 in a pixel column where a bypass current flows and a pixel column where a bypass current does not flow, and to reduce an electric potential difference, and as a result, the occurrence of streaking can be reduced.

Sixth Implementation Example

A sixth implementation example is a modification example of the first implementation example, and is an example of reference pixel following and single-sided readout in which the bypass wire is provided adjacent to the common wire VCOM.

Figure 18:
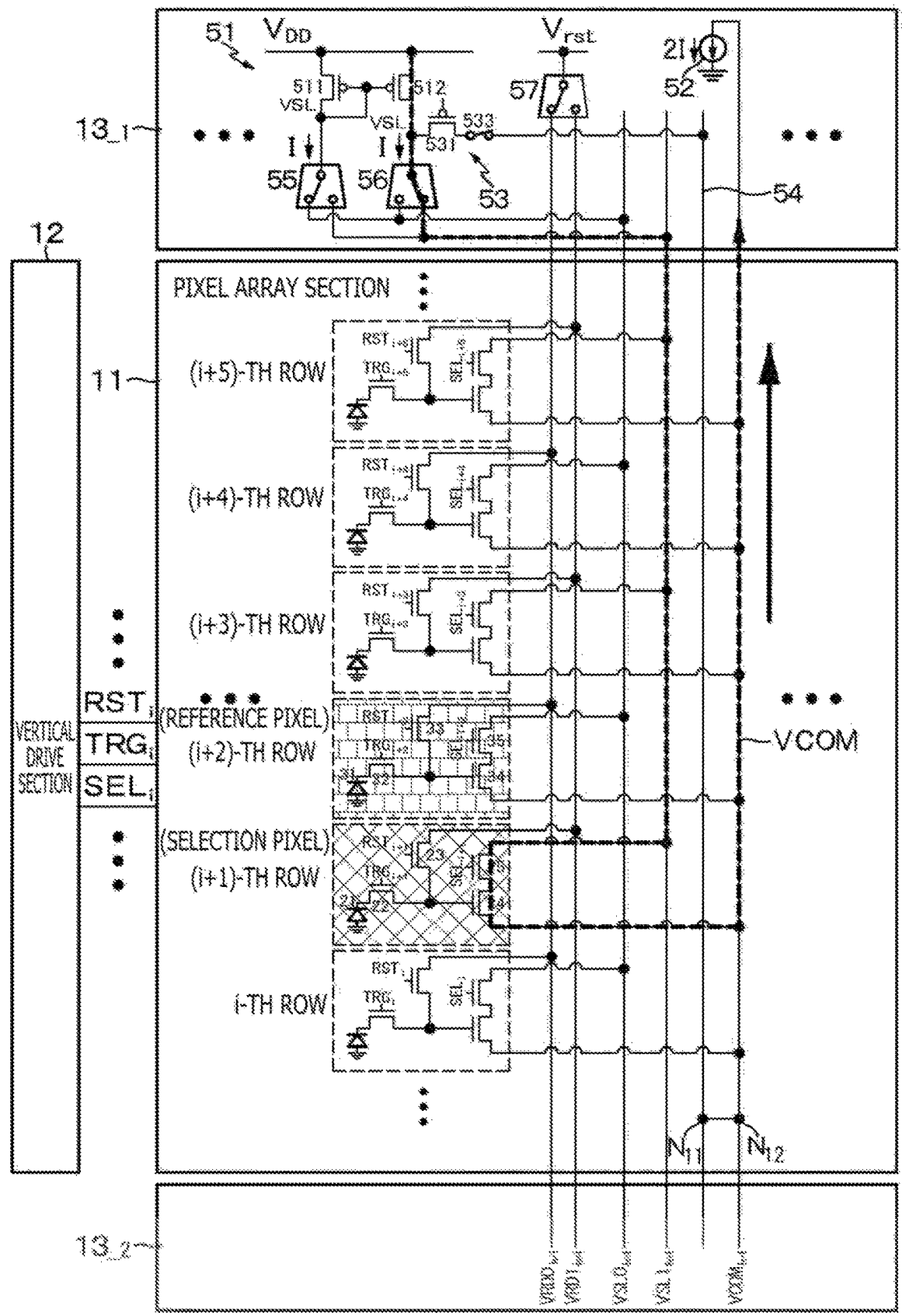
FIG. 18 is a circuit diagram for explaining operation of the normal operation column in the differential-amplification type imaging device according to a sixth implementation example.
Figure 19:
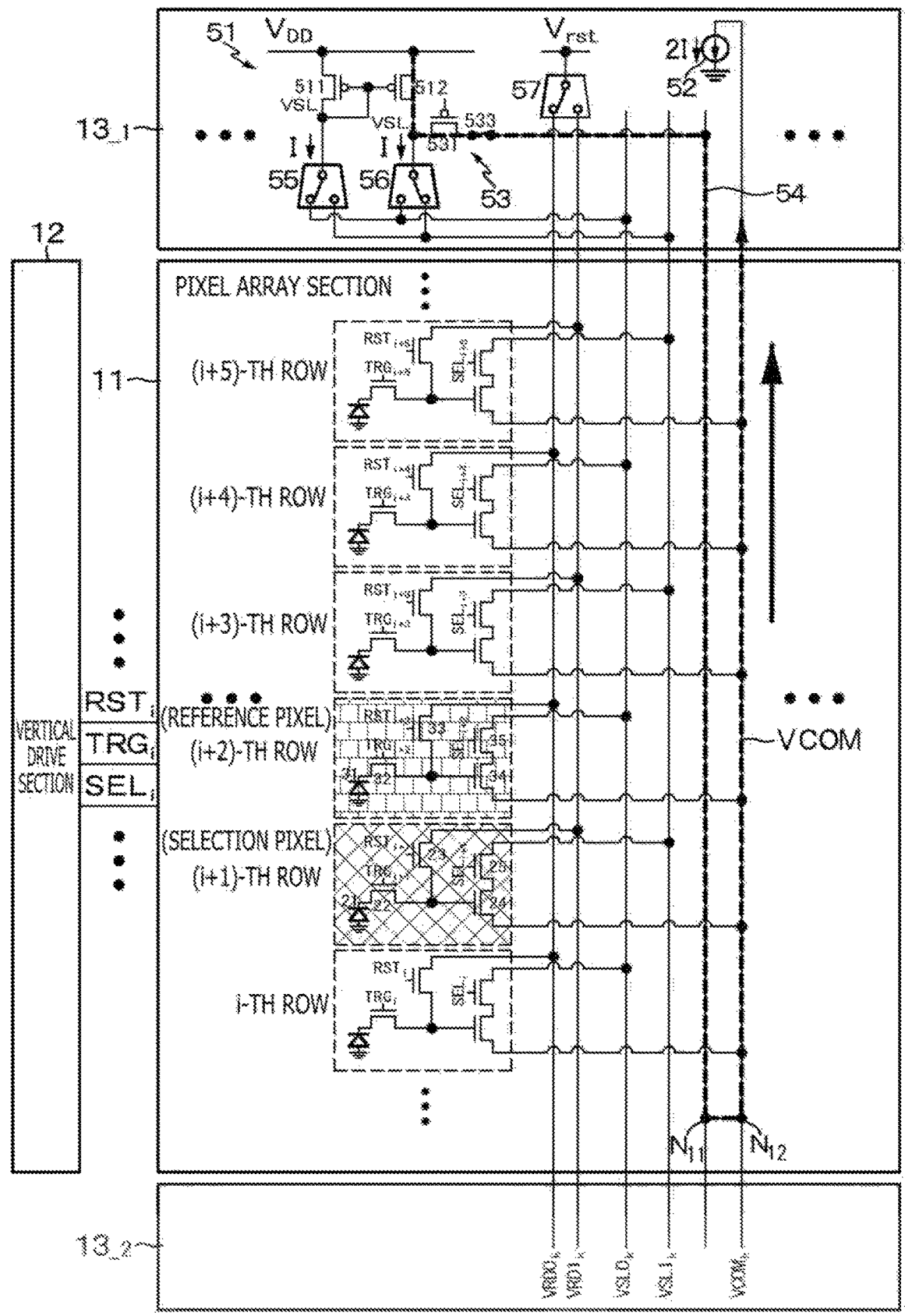
FIG. 19 is a circuit diagram for explaining operation of the bypass operation column in response to light incidence in the differential-amplification type imaging device according to the sixth implementation example.

FIG. 18 is a circuit diagram for explaining operation of a normal operation column in the differential-amplification type imaging device according to the sixth implementation example, and FIG. 19 is a circuit diagram for explaining operation of a bypass operation column in response to light incidence in the differential-amplification type imaging device according to the sixth implementation example. In the case mentioned here as an example, a pixel in the (i+2)-th row is treated as a reference pixel 30, and a pixel in the (i+1)-th row is treated as a selection pixel 20.

The differential-amplification type imaging device according to the sixth implementation example uses the bypass wire 54 and the common wire VCOM as current paths for bypass current. As a wire that specifies a clip connection destination to limit the voltage of the differential output node $N_1$, the bypass wire 54 is provided adjacent to the common wire VCOM provided for each pixel column in the pixel array section 11 along the pixel column.

Then, in the pixel array section 11, the bypass wire 54 and the common wire VCOM are electrically connected to each other near a pixel row at an end far from the bypass control section 53. Specifically, a node $N_{11}$ of the bypass wire 54 at an end far from the bypass control section 53 and a node $N_{12}$ of the common wire VCOM at an end far from the bypass control section 53 are linked to each other. Such a relation of the linkage position of the bypass wire 54 with the common wire VCOM enables movement of a reference pixel 30 to follow selection pixels 20.

In the differential-amplification type imaging device according to the sixth implementation example having the configuration described above, at normal time when the bypass transistor 531 is turned off, the signal current I output from the PMOS transistor 512 of the current mirror circuit 51 flows through a path represented by a broken bold line in FIG. 18. That is, after passing through the selection transistor 25 and the amplification transistor 24 of the selection pixel 20 in the (i+1)-th row, the signal current I flows into the constant current source 52 through the common wire VCOM.

At a time of bypass when the bypass transistor 531 is turned on, a bypass current that flows through the bypass transistor 531 flows through a path represented by a broken bold line in FIG. 19. That is, after flowing to the node $N_{11}$ through the bypass wire 54 and passing through the node $N_{12}$, the bypass current flows into the constant current source 52 through the common wire VCOM.

As mentioned above, in the differential-amplification type imaging device according to the sixth implementation example, effects and advantages similar to those of the first implementation example can be attained, although the number of wires increases by one as compared with the second implementation example to the fifth implementation example because the bypass wire 54 is provided additionally. That is, by causing the bypass current to flow in the pixel array section 11 through the bypass wire 54, it is possible to reduce a difference between IR drop amounts from reference pixels 30 to the constant current sources 52 in a pixel column where a bypass current flows and a pixel column where a bypass current does not flow, and to reduce an electric potential difference, and as a result, the occurrence of streaking can be reduced.

Seventh Implementation Example

A seventh implementation example is a modification example of the fourth implementation example, and is an example of reference pixel following and double-sided readout in which the bypass wire is provided adjacent to the common wire VCOM.

Figure 20:
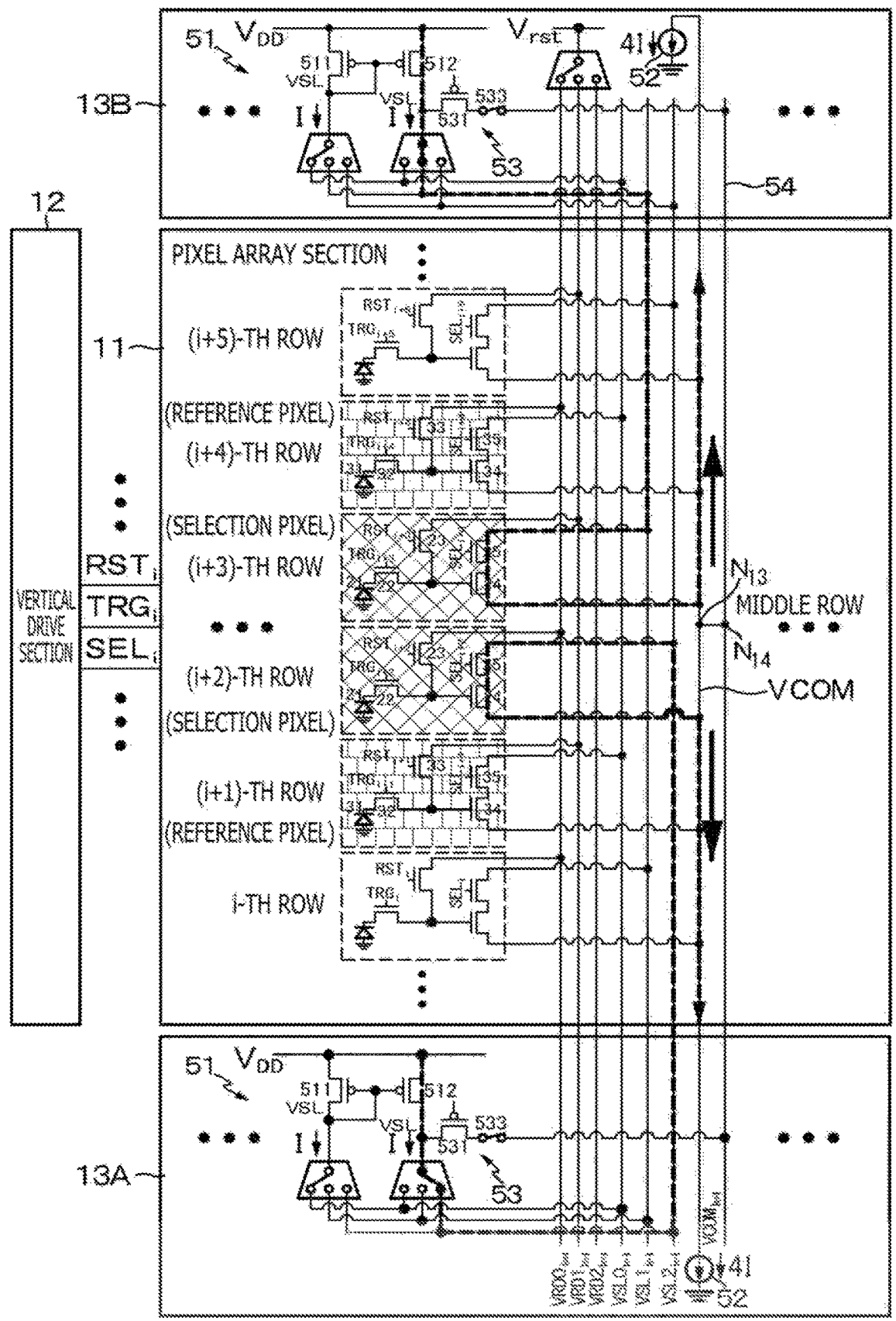
FIG. 20 is a circuit diagram for explaining operation of the normal operation column in the differential-amplification type imaging device according to a seventh implementation example.
Figure 21:
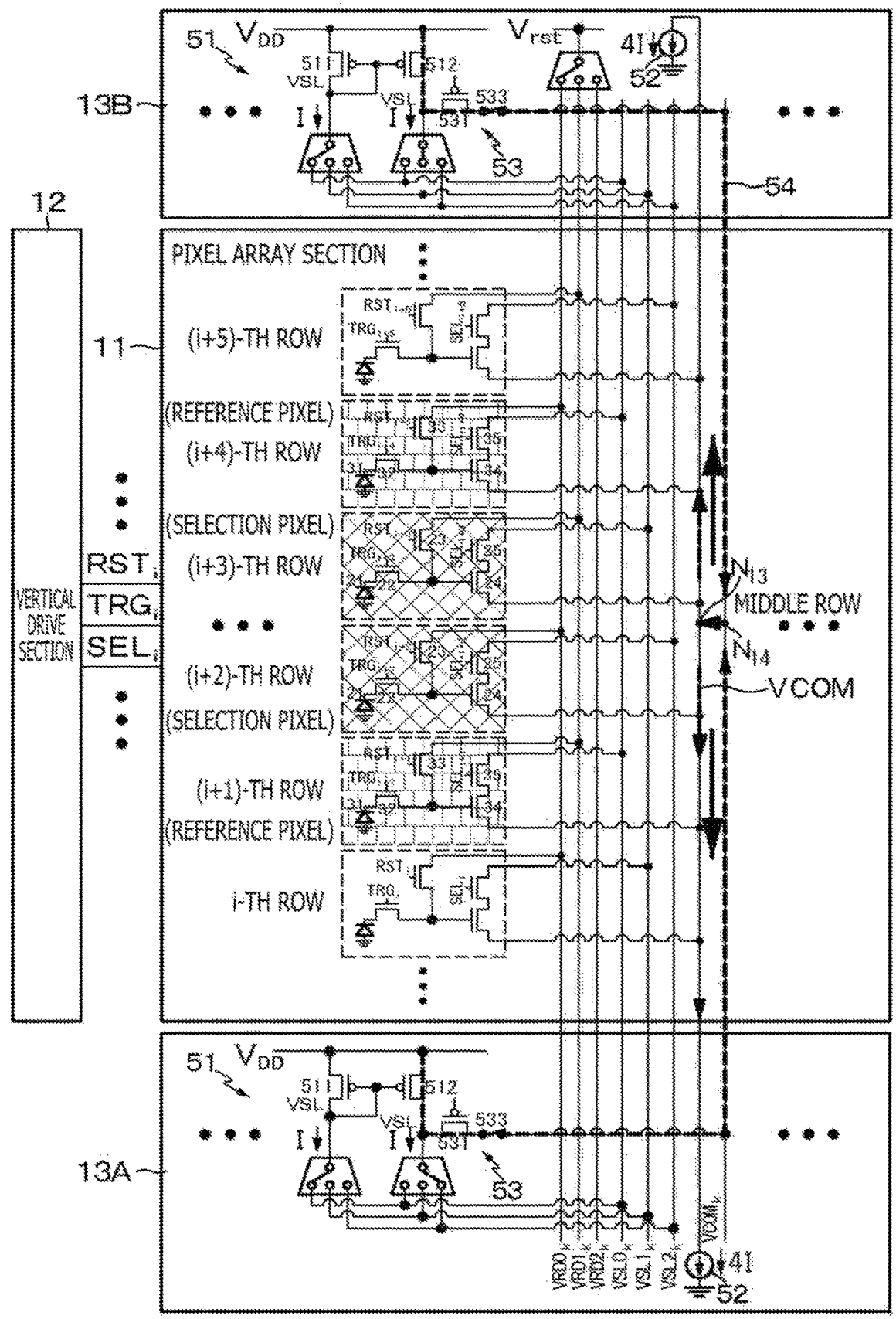
FIG. 21 is a circuit diagram for explaining operation of the bypass operation column in response to light incidence in the differential-amplification type imaging device according to the seventh implementation example.

FIG. 20 is a circuit diagram for explaining operation of a normal operation column in the differential-amplification type imaging device according to the seventh implementation example, and FIG. 21 is a circuit diagram for explaining operation of a bypass operation column in response to light incidence in the differential-amplification type imaging device according to the seventh implementation example.

In the double-sided readout imaging device, the column readout circuit section 13A and the column readout circuit section 13B are provided on the lower side and upper side sandwiching the pixel array section 11, and the constant current source 52 and the bypass control section 53 including the bypass transistor 531 are arranged in each of the column readout circuit section 13A and the column readout circuit section 13B. In the case mentioned here as an example, pixels in the (i+1)-th row and the (i+4)-th row are treated as reference pixels 30, and pixels in the (i+2)-th row and the (i+3)-th row are treated as double-sided readout selection pixels 20.

Similarly to the case of the sixth implementation example, the differential-amplification type imaging device according to the seventh implementation example also uses the bypass wire 54 and the common wire VCOM as current paths for bypass current. As a wire that specifies a clip connection destination to limit the voltage of the differential output node $N_1$, the bypass wire 54 is provided adjacent to the common wire VCOM provided for each pixel column in the pixel array section 11 along the pixel column. Then, in the pixel array section 11, the bypass wire 54 and the common wire VCOM are electrically connected to each other near a middle pixel row (middle row). Specifically, a node $N_{13}$ of the bypass wire 54 at a portion of the middle row and a node $N_{14}$ of the common wire VCOM at a portion of the middle row are linked to each other.

The differential-amplification type imaging device according to the seventh implementation example having the configuration described above is characterized in that the bypass wire 54 and the common wire VCOM can be used, in a shared manner, for double-sided readout to the column-readout-circuit-section-13A side and the column-readout-circuit-section-13B side. Specifically, at normal time when the bypass transistors 531 are turned off, the signal currents I output from the PMOS transistors 512 of the current mirror circuits 51 on the column-readout-circuit-section-13A side and on the column-readout-circuit-section-13B side flow through paths represented by broken bold lines in FIG. 20. That is, after passing through the selection transistor 25 and the amplification transistor 24 of the selection pixel 20 in the (i+2)-th row, the signal current I on the column-readout-circuit-section-13A side flows into the constant current source 52 arranged on the column-readout-circuit-section-13A side through the common wire VCOM0. In addition, after passing through the selection transistor 25 and the amplification transistor 24 of the selection pixel 20 in the (i+3)-th row, the signal current I on the column-readout-circuit-section-13B side flows into the constant current source 52 arranged on the column-readout-circuit-section-13B side through the common wire VCOM.

At a time of bypass when the bypass transistors 531 are turned on, bypass currents that flow through the bypass transistors 531 on the column-readout-circuit-section-13A side and on the column-readout-circuit-section-13B side flow through paths represented by broken bold lines in FIG. 21. That is, the bypass current on the column-readout-circuit-section-13A side flows to the node $N_{14}$ in the middle row through the bypass wire 54 as a current path for bypass current, passes through the node $N_{13}$, and then flows into the constant current source 52 arranged on the column-readout-circuit-section-13A side through the common wire VCOM. In addition, the bypass current on the column-readout-circuit-section-13B side flows to the node $N_{14}$ in the middle row through the bypass wire 54, passes through the node $N_{13}$, and then flows into the constant current source 52 arranged on the column-readout-circuit-section-13B side through the common wire VCOM.

As mentioned above, in the differential-amplification type imaging device according to the seventh implementation example also, effects and advantages similar to those of the first implementation example can be attained, although the number of wires increases by one as compared with the second implementation example to the fifth implementation example because the bypass wire 54 is provided additionally. That is, by causing the bypass current to flow in the pixel array section 11 through the bypass wire 54, it is possible to reduce a difference between IR drop amounts from reference pixels 30 to the constant current sources 52 in a pixel column where a bypass current flows and a pixel column where a bypass current does not flow, and to reduce an electric potential difference, and as a result, the occurrence of streaking can be reduced.

Eighth Implementation Example

An eighth implementation example is a modification example of the third implementation example, and is an example of reference pixel fixation and single-sided readout in which, in the pixel array section 11, the reference pixel area 11B is provided closer to the column readout circuit section 13 than the selection pixel area 11A is.

Figure 22:
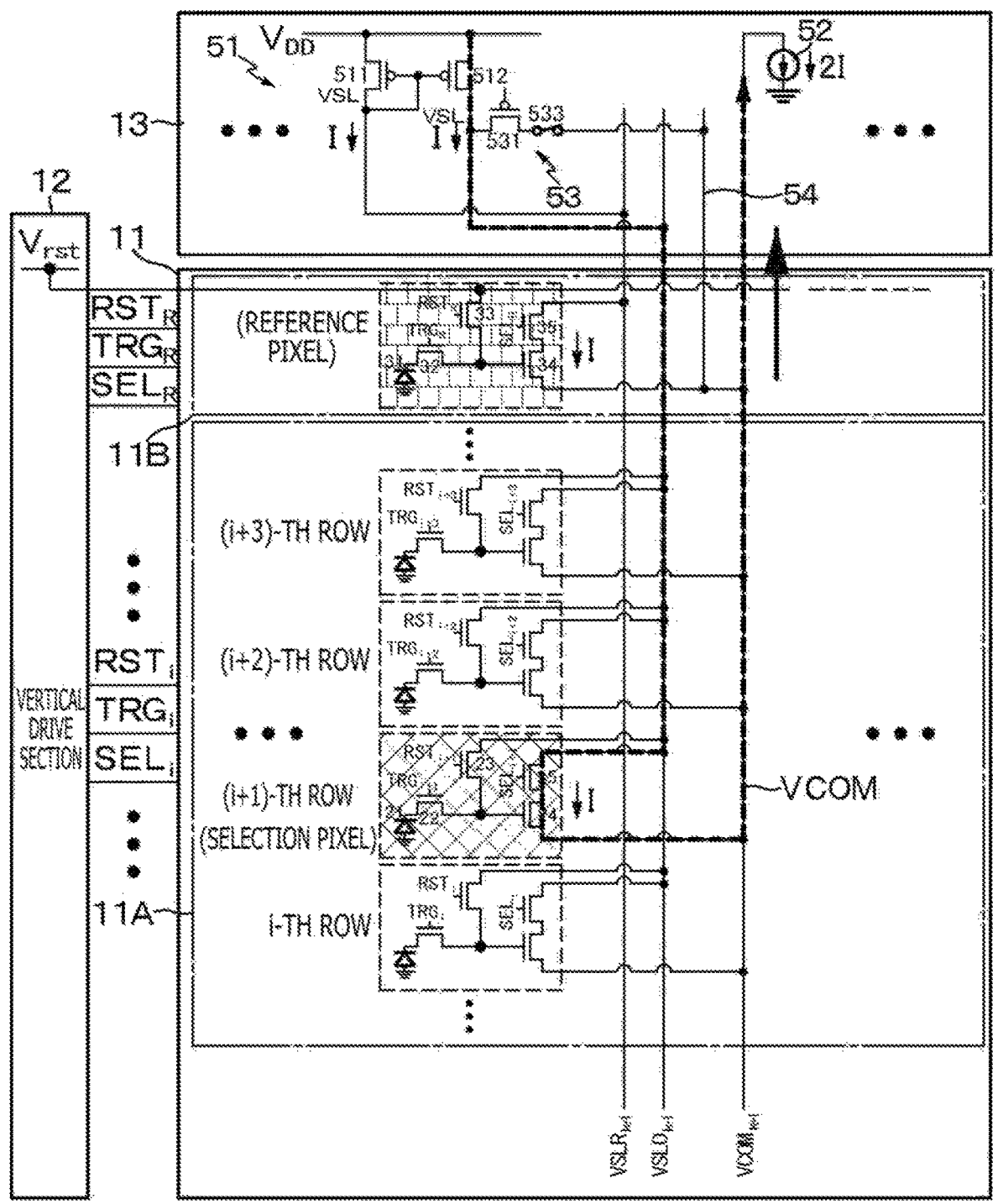
FIG. 22 is a circuit diagram for explaining operation of the normal operation column in the differential-amplification type imaging device according to an eighth implementation example.
Figure 23:
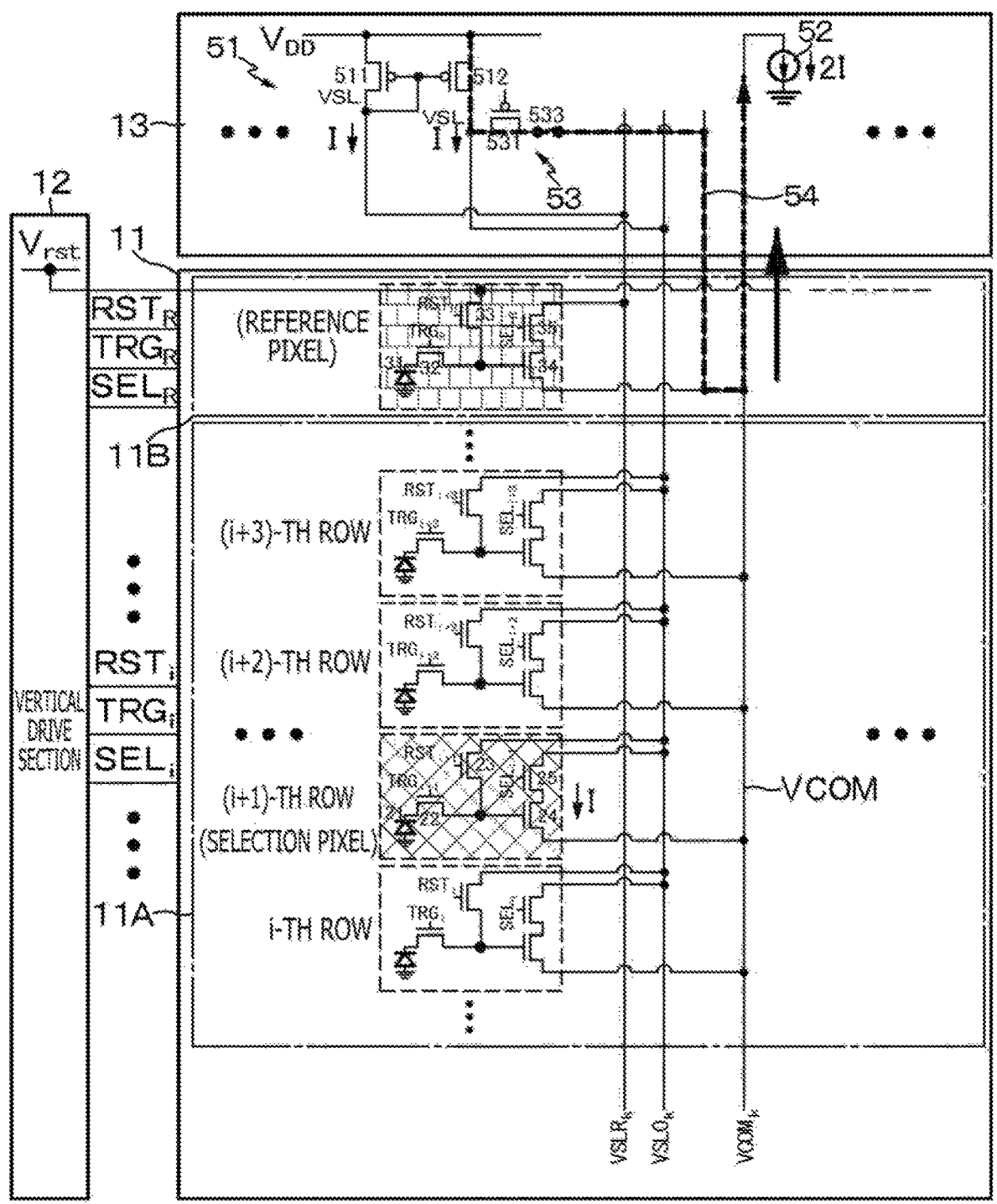
FIG. 23 is a circuit diagram for explaining operation of the bypass operation column in response to light incidence in the differential-amplification type imaging device according to the eighth implementation example.

FIG. 22 is a circuit diagram for explaining operation of a normal operation column in the differential-amplification type imaging device according to the eighth implementation example, and FIG. 23 is a circuit diagram for explaining operation of a bypass operation column in response to light incidence in the differential-amplification type imaging device according to the eighth implementation example.

In a case of single-sided readout and reference pixel fixation, the pixel array section 11 includes the selection pixel area 11A where selection pixels 20 are arranged and the reference pixel area 11B where a reference pixel 30 is arranged. In the case mentioned as an example here, a pixel in the (i+1)-th row is treated as a selection pixel 20 in the selection pixel area 11A. Then, the differential-amplification type imaging device according to the eighth implementation example has a configuration in which, in the pixel array section 11, the reference pixel area 11B including the reference pixel 30 is provided closer to the column readout circuit section 13 than the selection pixel area 11A is.

The differential-amplification type imaging device according to the eighth implementation example having the configuration described above also uses the bypass wire 54 and the common wire VCOM as current paths for bypass current. As a wire that specifies a clip connection destination that limits the voltage of the differential output node $N_1$, the bypass wire 54 is provided between the column readout circuit section 13 and the reference pixel area 11B, and is electrically connected with the common wire VCOM near the reference pixel area 11B. This is because it is sufficient if a difference between IR drop amounts from reference pixels 30 to the constant current sources 52 in a pixel column where a bypass current flows and a pixel column where a bypass current does not flow can be reduced.

Specifically, at normal time when the bypass transistor 531 is turned off, the signal current I output from the PMOS transistor 512 of the current mirror circuit 51 flows through a path represented by a broken bold line in FIG. 22. That is, after passing through the selection transistor 25 and the amplification transistor 24 of the selection pixel 20 in the (i+1)-th row, the signal current I flows into the constant current source 52 through the common wire VCOM.

At a time of bypass when the bypass transistor 531 is turned on, a bypass current that flows through the bypass transistor 531 flows through a path represented by a broken bold line in FIG. 23. That is, after flowing to the reference pixel 30 in the reference pixel area 11B through the bypass wire 54, the bypass current flows into the constant current source 52 through the common wire VCOM.

As mentioned above, in the differential-amplification type imaging device according to the eighth implementation example, the bypass current is caused to flow to the reference pixel area 11B of the pixel array section 11 through the bypass wire 54 provided between the column readout circuit section 13 and the reference pixel area 11B. Thereby, it is possible to reduce a difference between IR drop amounts from reference pixels 30 to the constant current sources 52 in a pixel column where a bypass current flows and a pixel column where a bypass current does not flow, and to reduce an electric potential difference, and as a result, the occurrence of streaking can be reduced.

Ninth Implementation Example

A ninth implementation example is a modification example of the fifth implementation example, and is an example of reference pixel fixation and double-sided readout in which two reference pixel areas $11B_{\_a}$ and $11B_{\_b}$ including reference pixels 30 are provided corresponding to double-sided readout.

Figure 24:
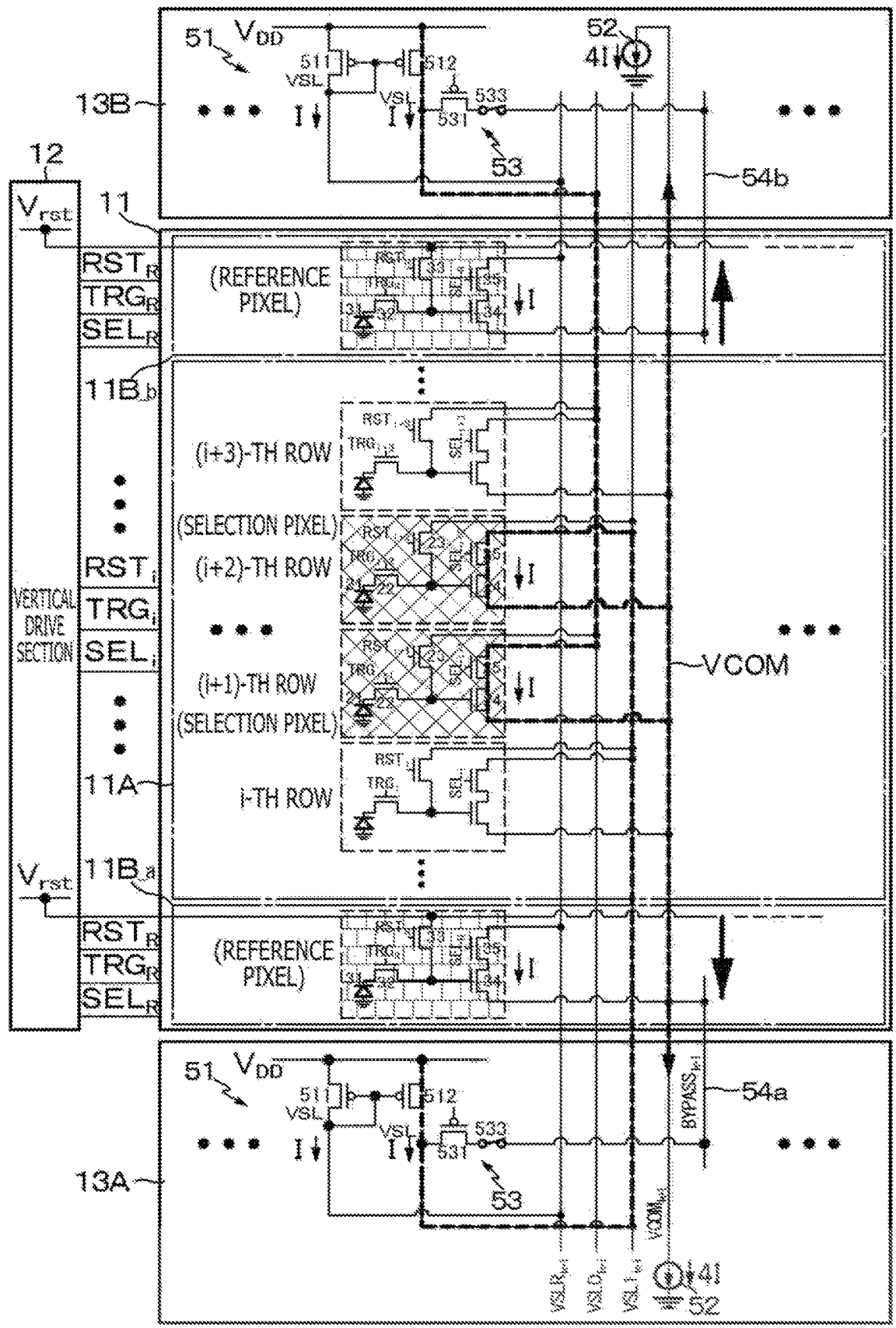
FIG. 24 is a circuit diagram for explaining operation of the normal operation column in the differential-amplification type imaging device according to a ninth implementation example.
Figure 25:
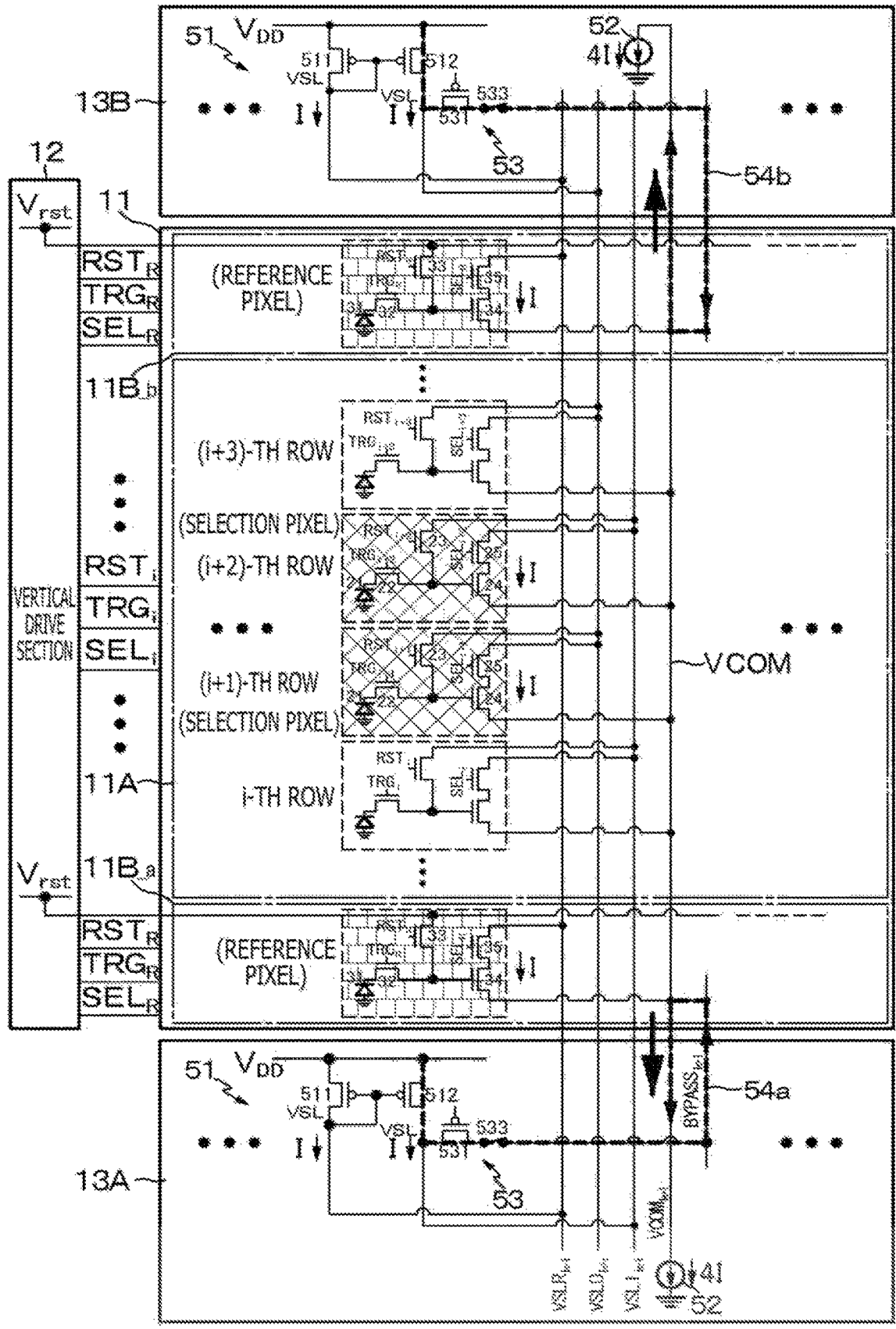
FIG. 25 is a circuit diagram for explaining operation of the bypass operation column in response to light incidence in the differential-amplification type imaging device according to the ninth implementation example.

FIG. 24 is a circuit diagram for explaining operation of a normal operation column in the differential-amplification type imaging device according to the ninth implementation example, and FIG. 25 is a circuit diagram for explaining operation of a bypass operation column in response to light incidence in the differential-amplification type imaging device according to the ninth implementation example.

In the case mentioned as an example in the present example, in the selection pixel area 11A, pixels in the (i+1)-th row and the (i+2)-th row are treated as double-sided readout selection pixels 20, and pixels in the reference pixel area $11B_{\_a}$ and the reference pixel area $11B_{\_b}$ are treated as double-sided readout reference pixels 30.

In the double-sided readout imaging device, the column readout circuit section 13A and the column readout circuit section 13B are provided on the lower side and upper side sandwiching the pixel array section 11, and the constant current source 52 and the bypass control section 53 including the bypass transistor 531 are arranged in each of the column readout circuit section 13A and the column readout circuit section 13B.

The differential-amplification type imaging device according to the ninth implementation example also uses the bypass wire 54 and the common wire VCOM as current paths for bypass current. As a wire that specifies a clip connection destination that limits the voltage of the differential output node $N_1$, the bypass wire 54 has a bypass wire 54a on the column-readout-circuit-section-13A side and a bypass wire 54b on the column-readout-circuit-section-13B side.

Then, for a reason similar to the case of the eighth implementation example, in this configuration, the bypass wire 54a is provided between the column readout circuit section 13A and the reference pixel area $11B_{\_a}$, and is electrically connected with the common wire VCOM in the reference pixel area $11B_{\_a}$, and the bypass wire 54b is provided between the column readout circuit section 13B and the reference pixel area $11B_{\_b}$, and is electrically connected with the common wire VCOM in the reference pixel area $11B_{\_b}$.

In the differential-amplification type imaging device according to the ninth implementation example having the configuration described above, at normal time when the bypass transistors 531 are turned off, the signal currents I output from the PMOS transistors 512 of the current mirror circuits 51 on the column-readout-circuit-section-13A side and on the column-readout-circuit-section-13B side flow through paths represented by broken bold lines in FIG. 24.

That is, after passing through the selection transistor 25 and the amplification transistor 24 of the selection pixel 20 in the (i+2)-th row, the signal current I on the column-readout-circuit-section-13A side flows into the constant current source 52 arranged on the column-readout-circuit-section-13B side through the common wire VCOM. After passing through the selection transistor 25 and amplification transistor 24 of the selection pixel 20 in the (i+1)-th row, the signal current I on the column-readout-circuit-section-13B side flows into the constant current source 52 arranged on the column-readout-circuit-section-13A side through the common wire VCOM.

At a time of bypass when the bypass transistors 531 are turned on, bypass currents that flow through the bypass transistors 531 on the column-readout-circuit-section-13A side and on the column-readout-circuit-section-13B side flow through paths represented by broken bold lines in FIG. 25.

That is, after flowing to the reference pixel 30 in the reference pixel area $11B_{\_a}$ through the bypass wire 54a, the bypass current on the column-readout-circuit-section-13A side flows into the constant current source 52 arranged on the column-readout-circuit-section-13A side through the common wire VCOM. After flowing to the reference pixel 30 in the reference pixel area $11B_{\_b}$ through the bypass wire 54b, the bypass current on the column-readout-circuit-section-13B side flows into the constant current source 52 arranged on the column-readout-circuit-section-13B side through the common wire VCOM.

As mentioned above, in the differential-amplification type imaging device according to the ninth implementation example, the bypass currents are caused to flow to the reference pixel areas $11B_{\_a}$ and $11B_{\_b}$ of the pixel array section 11 through the bypass wires 54A and 54b provided between the column readout circuit sections 13A and 13B and the reference pixel areas $11B_{\_a}$ and $11B_{\_b}$, respectively. Thereby, it is possible to reduce a difference between IR drop amounts from reference pixels 30 to the constant current sources 52 in a pixel column where a bypass current flows and a pixel column where a bypass current does not flow, and to reduce an electric potential difference, and as a result, the occurrence of streaking can be reduced.

Second Embodiment of Present Disclosure

In the first embodiment of the present disclosure explained above, a current path for bypass current where a bypass current for clipping the voltage of the differential output node $N_1$ (see FIG. 5) of the differential amplification circuit 50 to a predetermined voltage flows is provided in the pixel array section 11. In contrast to this, in a second embodiment of the present disclosure, a wire (described as an "inactive wire" below) that is included in existing wires provided for each pixel column along the pixel column and does not contribute to signal readout at a time of differential amplification readout of reading out a signal of a selection pixel 20 by the differential amplification circuit 50, in particular in a D phase (signal data) period, is used as a current path for bypass current.

By using, as a current path for bypass current through which a bypass current is caused to flow, the inactive wire that is included in the existing wires provided for each pixel column along the pixel column and does not contribute to signal readout at a time of differential amplification readout in this manner, the number of wires provided for each pixel column along the pixel column can be reduced as compared to the case of the first embodiment in which a current path for bypass current is provided in the pixel array section 11. Because the number of wires that can be reduced is equal to the total number of pixel columns, an advantage of the reduction of the number of wires is extremely significant, and accordingly, it is possible to attempt to realize a simplification of the wiring structure of the pixel array section 11 and a cost reduction along with it.

Meanwhile, the imaging device according to the second embodiment of the present disclosure has a configuration in which, as readout methods of reading out signals of selection pixels 20, switching between a differential amplification readout method of reading out the signals by the differential amplification circuit 50 and a source follower (SF) readout method of reading out the signals by an SF circuit including the amplification transistor 24 and the constant current source 52 is possible. The same applies to the imaging device according to the first embodiment mentioned earlier.

In the differential amplification readout method, signal readout of selection pixels 20 can be performed at high conversion efficiency. On the contrary, for example, at a time of bright light, it is desirable that signals of selection pixels 20 be read out by the SF readout method that enables a wide dynamic range. Accordingly, by using the differential amplification readout method and the SF readout method by performing switching therebetween as appropriate, it becomes possible to perform more appropriate readout of signals of selection pixels 20.

Possible examples of an inactive wire that does not contribute to signal readout in the second embodiment in the imaging device having configuration in which switching between the differential amplification readout method and the SF readout method is possible include a vertical signal line (VSL) that is used at a time of SF readout, but is not used at a time of differential amplification readout, and a reset line (VRD) that is used only at a time of reset in differential amplification readout. The reset line (VRD) is a wire that transfers a reset voltage $V_{rst}$ for resetting a selection pixel 20 and is used as a current path for bypass current at a time of P phase (reset data) and at a time of D phase (signal data).

[Regarding Selection-Pixel Reset Methods]

The reset line (VRD) mentioned here as an example is one of existing wires provided for each pixel column along the pixel column. Meanwhile, in the first implementation example to the tenth implementation example mentioned earlier, a reset line (VRD) is provided for each pixel column along the pixel column in the configurations of the first implementation example, the second implementation example, the fourth implementation example, the sixth implementation example, the seventh implementation example, and the tenth implementation example, and reset lines (VRD) are not provided along pixel columns in the configurations of the third implementation example, the fifth implementation example, the eighth implementation example, and the ninth implementation example. This difference results from a difference of reset methods for selection pixels 20. Possible examples of reset methods for selection pixels 20 include the three methods explained below, for example.

(Reset Method 1)

Figure 27:
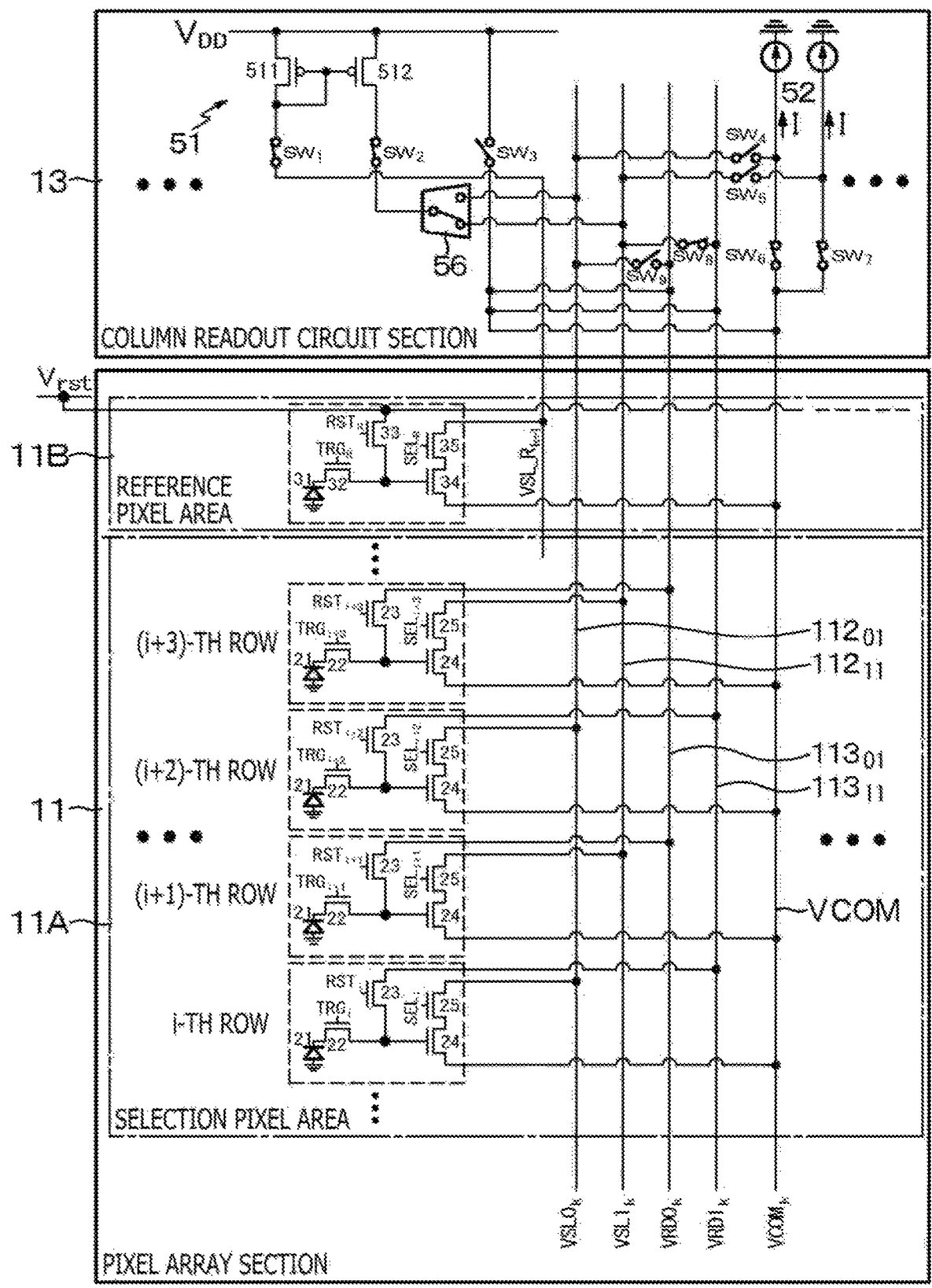
FIG. 27 is a circuit diagram depicting a wiring example at a time of differential readout in a reset method 1.

A reset method 1 is an example of what is generally called VRD wiring method in which a wire of a reset line (VRD) is provided for each pixel column along the pixel column. FIG. 27 is a circuit diagram depicting a wiring example at a time of differential amplification readout in the reset method 1, and FIG. 28 is a circuit diagram depicting a wiring example at a time of SF readout in the reset method 1.

Note that an imaging device explained here as an example has a configuration in which signals of selection pixels 20 in a plurality of pixel rows (e.g. two pixel rows) are read out simultaneously in SF readout. The same applies to other reset methods mentioned later. By reading out signals of selection pixels 20 in a plurality of pixel rows simultaneously in SF readout, it is possible to attempt to increase the speed of signal readout. It should be noted that this is not the sole example, and, instead of simultaneous readout of a plurality of pixel rows, each pixel row may be read out in the reset method 1. The same also applies to other reset methods mentioned later.

Figure 28:
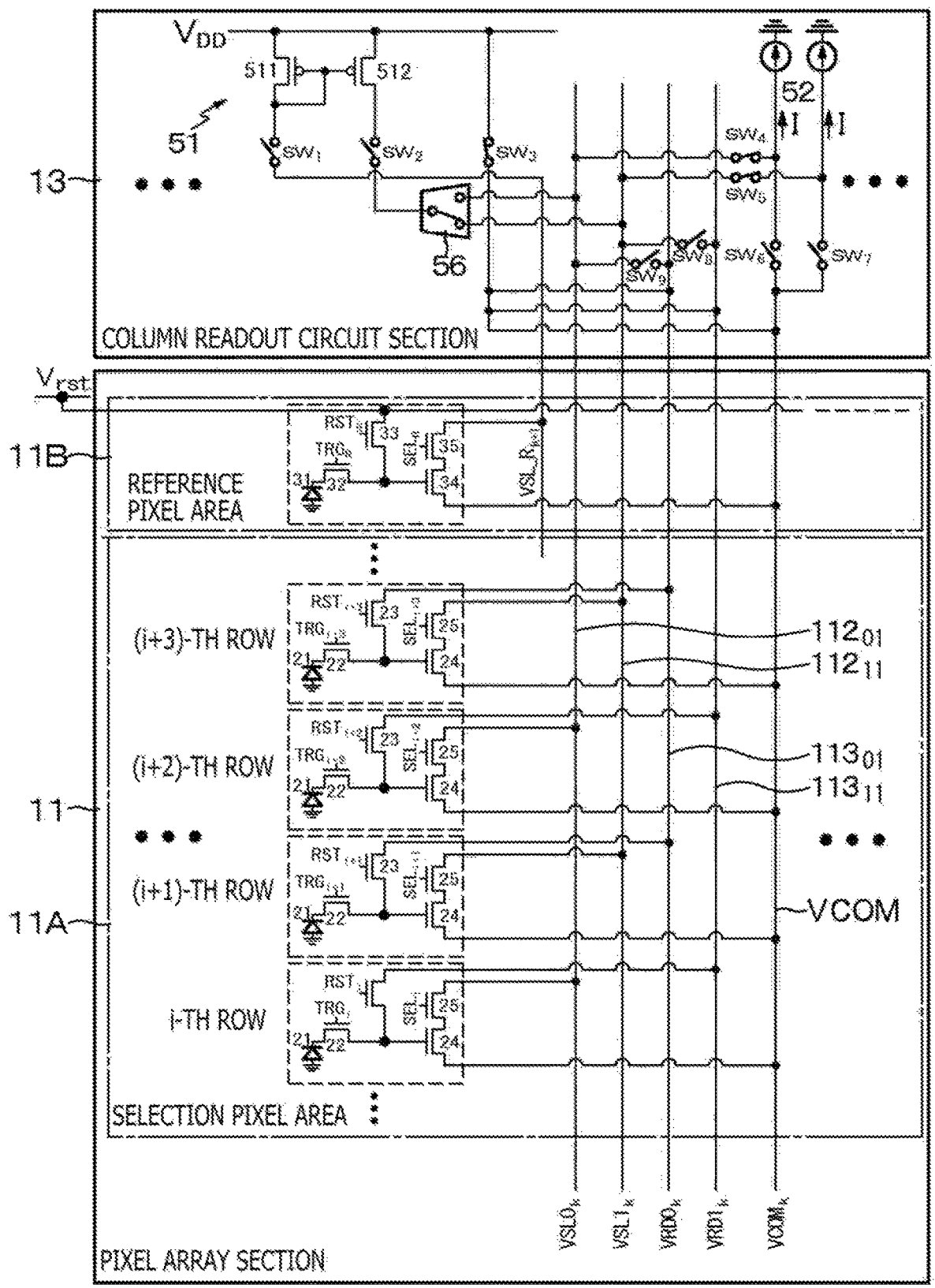
FIG. 28 is a circuit diagram depicting a wiring example at a time of SF readout in the reset method 1.

As depicted in FIG. 27 and FIG. 28, for simultaneous readout of two pixel rows, two vertical signal lines $112_{01}$ and $112_{11}$ are provided for each pixel row along the pixel row. The same applies to other reset methods mentioned later. In the circuit diagrams depicted here, one of the two vertical signal lines $112_{01}$ and $112_{11}$ enters the activated state at a time of differential amplification readout, and the two vertical signal lines $112_{01}$ and $112_{11}$ both enter the activated states at a time of SF readout. It should be noted that it is also possible to make the numbers of activated wires of the two vertical signal lines $112_{01}$ and $112_{11}$ the same both at a time of differential amplification readout and at a time of SF readout.

In the reset method 1, for simultaneous readout of two pixel rows, regarding reset lines (VRD) also, two reset lines $113_{01}$ and $113_{11}$ are provided for each pixel row along the pixel row.

As depicted in FIG. 27, by switches $SW_1$ and $SW_2$ being turned on (closed) in the column readout circuit section 13 at a time of differential amplification readout, a differential amplification circuit including the current mirror circuit 51 is formed. The selector switch 56 is a switch for switching between odd-numbered pixel rows/even-numbered pixel rows. As depicted in FIG. 28, at a time of SF readout, the switches $SW_1$ and $SW_2$ are turned off (opened).

A switch $SW_3$ is turned off (opened) at a time of differential amplification readout, and by being turned on (closed) at a time of reset in SF readout, the switch $SW_3$ applies the power source voltage $V_{DD}$ to the two reset lines $113_{01}$ and $113_{11}$ and the common wire VCOM. Switches $SW_4$ and $SW_5$ are turned off (opened) at a time of differential amplification readout, and by being turned on (closed) at a time of SF readout, the switches $SW_4$ and $SW_5$ electrically connect the two reset lines $113_{01}$ and $113_{11}$ and the constant current source 52.

By being turned on (closed) at a time of differential amplification readout, switches $SW_6$ and $SW_7$ electrically connect the common wire VCOM and the constant current source 52. At a time of SF readout, the switches $SW_6$ and $SW_7$ are turned off (opened).

By being turned on (closed) at a time of reset in differential amplification readout, a switch $SW_8$ electrically connects the vertical signal line $112_{11}$ and the reset line $113_{11}$. At this time, a switch $SW_9$ is turned off (opened). At a time of SF readout, both of the switches $SW_8$ and $SW_9$ are turned off (opened).

(Reset Method 2)

Figure 29:
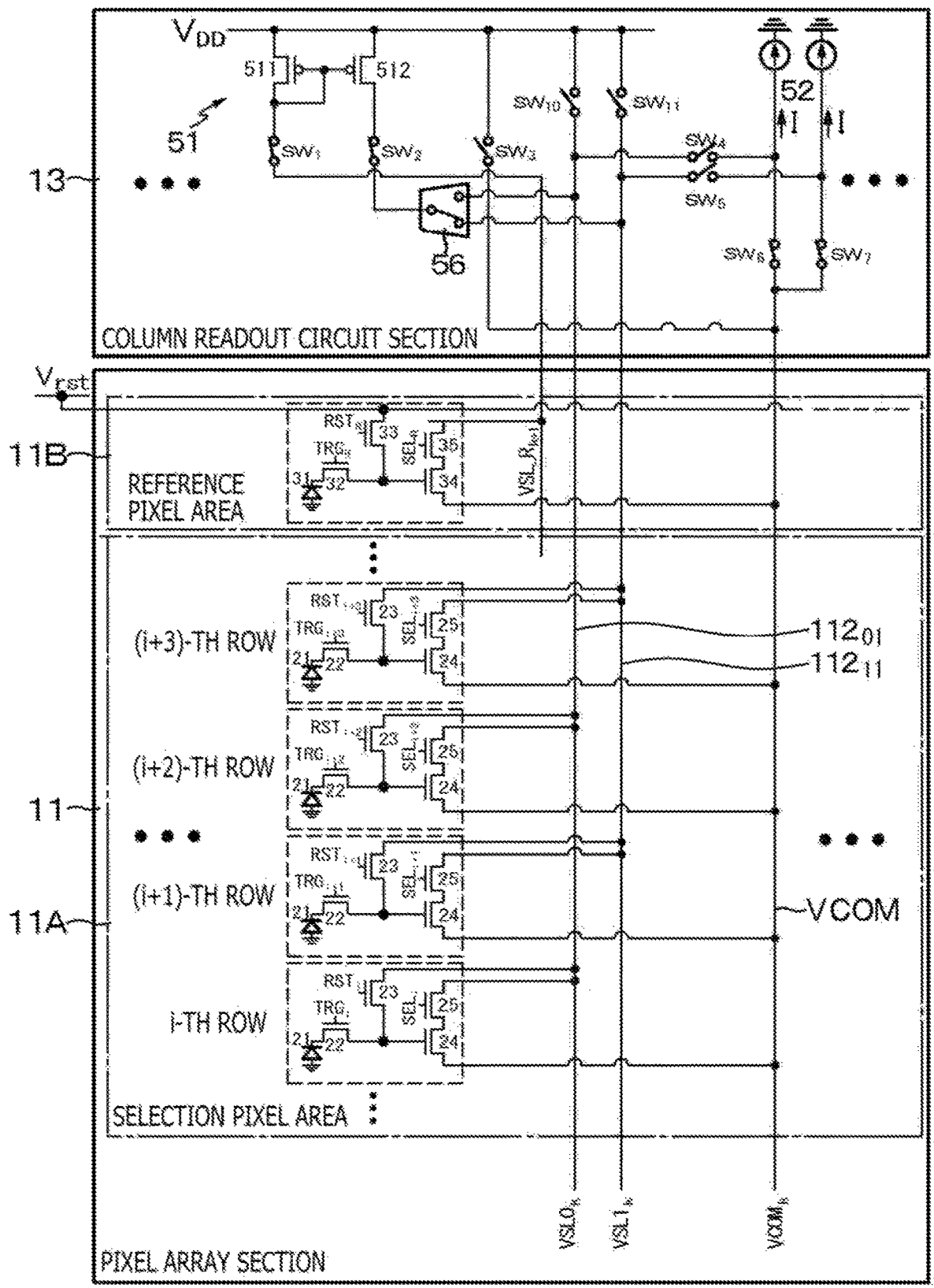
FIG. 29 is a circuit diagram depicting a wiring example at a time of differential amplification readout in a reset method 2.

A reset method 2 is an example in which the two vertical signal lines $112_{01}$ and $112_{11}$ double as reset lines (VRD). FIG. 29 is a circuit diagram depicting a wiring example at a time of differential amplification readout in the reset method 2, and FIG. 30 is a circuit diagram depicting a wiring example at a time of SF readout in the reset method 2.

Figure 30:
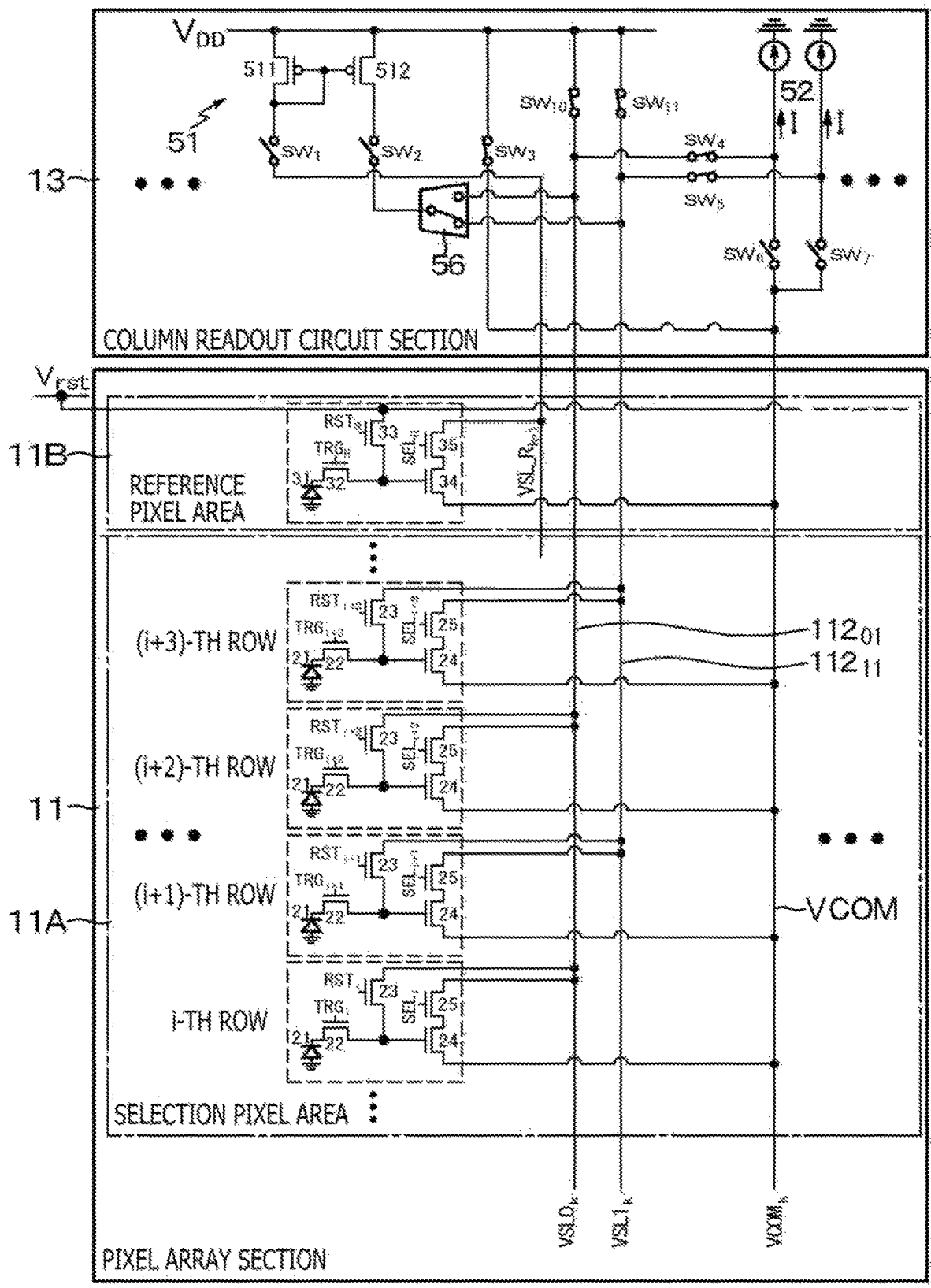
FIG. 30 is a circuit diagram depicting a wiring example at a time of SF readout in the reset method 2.

As depicted in FIG. 29 and FIG. 30, in the reset method 2, the reset transistors 23 of selection pixels 20 are connected alternately to the two vertical signal lines $112_{01}$ and $112_{11}$ every other pixel row. That is, in the reset method 2, reset lines (VRD) are not placed along pixel rows.

As depicted in FIG. 29, by the switches $SW_1$ and $SW_2$ being turned on (closed) in the column readout circuit section 13 at a time of differential amplification readout, a differential amplification circuit including the current mirror circuit 51 is formed, and, as depicted in FIG. 30, the switches SW' and $SW_2$ are turned off (opened) at a time of SF readout.

The switch $SW_3$ is turned off (opened) at a time of differential amplification readout, and by being turned on (closed) at a time of SF readout, the switch $SW_3$ applies the power source voltage $V_{DD}$ to the common wire VCOM. The switches $SW_4$ and $SW_5$ are turned off (opened) at a time of differential amplification readout, and by being turned on (closed) at a time of SF readout, the switches $SW_4$ and $SW_5$ electrically connect the two reset lines $113_{01}$ and $113_{11}$ and the constant current source 52.

By being turned on (closed) at a time of differential amplification readout, the switches $SW_6$ and $SW_7$ electrically connect the common wire VCOM and the constant current source 52. At a time of SF readout, the switches $SW_6$ and $SW_7$ are turned off (opened).

Switches $SW_{10}$ and $SW_{11}$ are turned off (opened) at a time of differential amplification readout, and by being turned on (closed) at a time of reset in SF readout, the switches $SW_{10}$ and $SW_{11}$ apply the power source voltage $V_{DD}$ to the two vertical signal lines $112_{01}$ and $112_{11}$. Thereby, it is possible for the two vertical signal lines $112_{01}$ and $112_{11}$ to double as reset lines (VRD).

(Reset Method 3)

Figure 31:
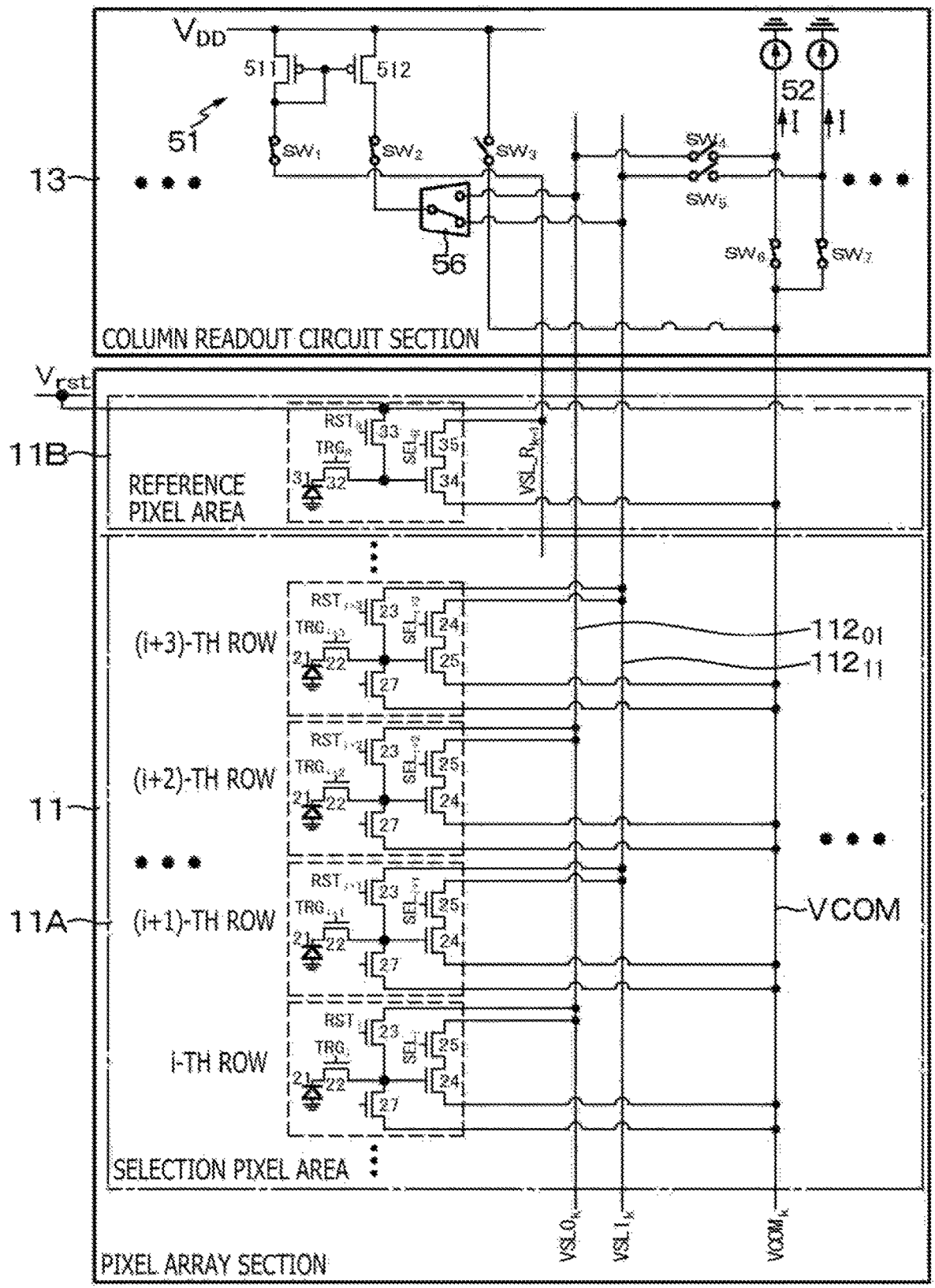
FIG. 31 is a circuit diagram depicting a wiring example at a time of differential amplification readout in a reset method 3.
Figure 32:
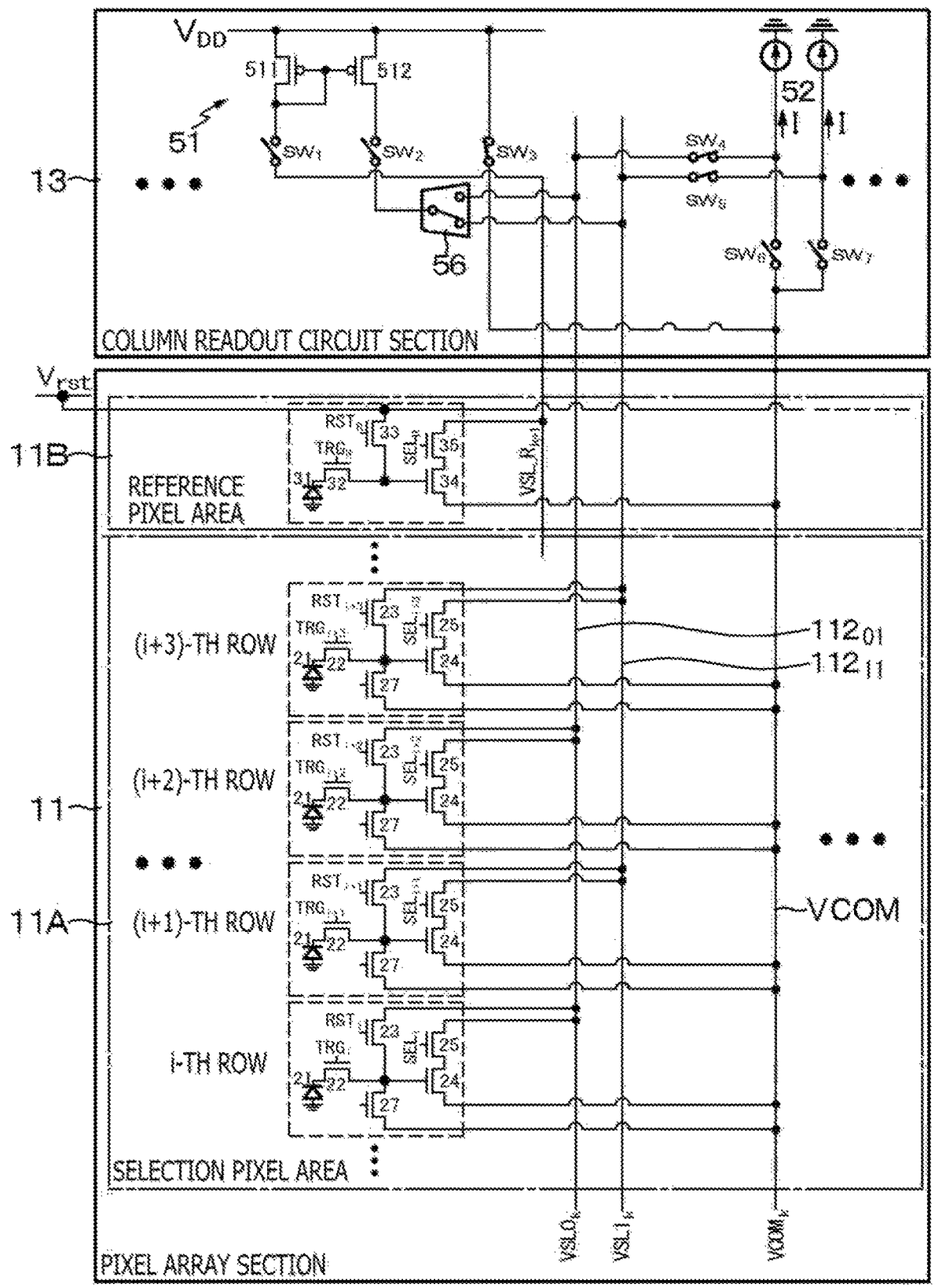
FIG. 32 is a circuit diagram depicting a wiring example at a time of SF readout in the reset method 3.

A reset method 3 is an example in which a selection pixel 20 has two reset transistors. FIG. 31 is a circuit diagram depicting a wiring example at a time of differential amplification readout in the reset method 3, and FIG. 32 is a circuit diagram depicting a wiring example at a time of SF readout in reset method 3.

The reset method 3 is the same as the reset method 2 in that the reset transistors 23 of selection pixels 20 are alternately connected to the two vertical signal lines $112_{01}$ and $112_{11}$ every other pixel row. In the configuration in the reset method 3, the selection pixels 20 have reset transistors 27 in addition to the reset transistors 23. The reset transistors 27 are connected between the common wire VCOM and the gate electrodes of the amplification transistors 24.

As depicted in FIG. 31, by the switches $SW_1$ and $SW_2$ being turned on (closed) in the column readout circuit section 13 at a time of differential amplification readout, a differential amplification circuit including the current mirror circuit 51 is formed. As depicted in FIG. 32, at a time of SF readout, the switches $SW_1$ and $SW_2$ are turned off (opened).

The switch $SW_3$ is turned off (opened) at a time of differential amplification readout, and by being turned on (closed) at a time of reset in SF readout, the switch $SW_3$ applies the power source voltage $V_{DD}$ to the common wire VCOM. The switches $SW_4$ and $SW_5$ are turned off (opened) at a time of differential amplification readout, and by being turned on (closed) at a time of SF readout, the switches $SW_4$ and $SW_5$ electrically connect the two reset lines $113_{01}$ and $113_{11}$ and the constant current source 52.

By being turned on (closed) at a time of differential amplification readout, the switches $SW_6$ and $SW_7$ electrically connect the common wire VCOM and the constant current source 52. At a time of SF readout, the switches $SW_6$ and $SW_7$ are turned off (opened).

Specific implementation examples of the second embodiment are explained below. In the second embodiment, an inactive wire that is included in existing wires provided for each pixel column along the pixel column and does not contribute to signal readout in a D phase (signal data) period at a time of differential amplification readout of reading out signals of selection pixels 20 by the differential amplification circuit 50 is used as a current path for bypass current.

Tenth Implementation Example

A tenth implementation example is an example in which vertical signal lines (VSL) which are used at a time of SF readout, but are not used at a time of differential amplification readout are used as current paths for bypass current.

Figure 33:
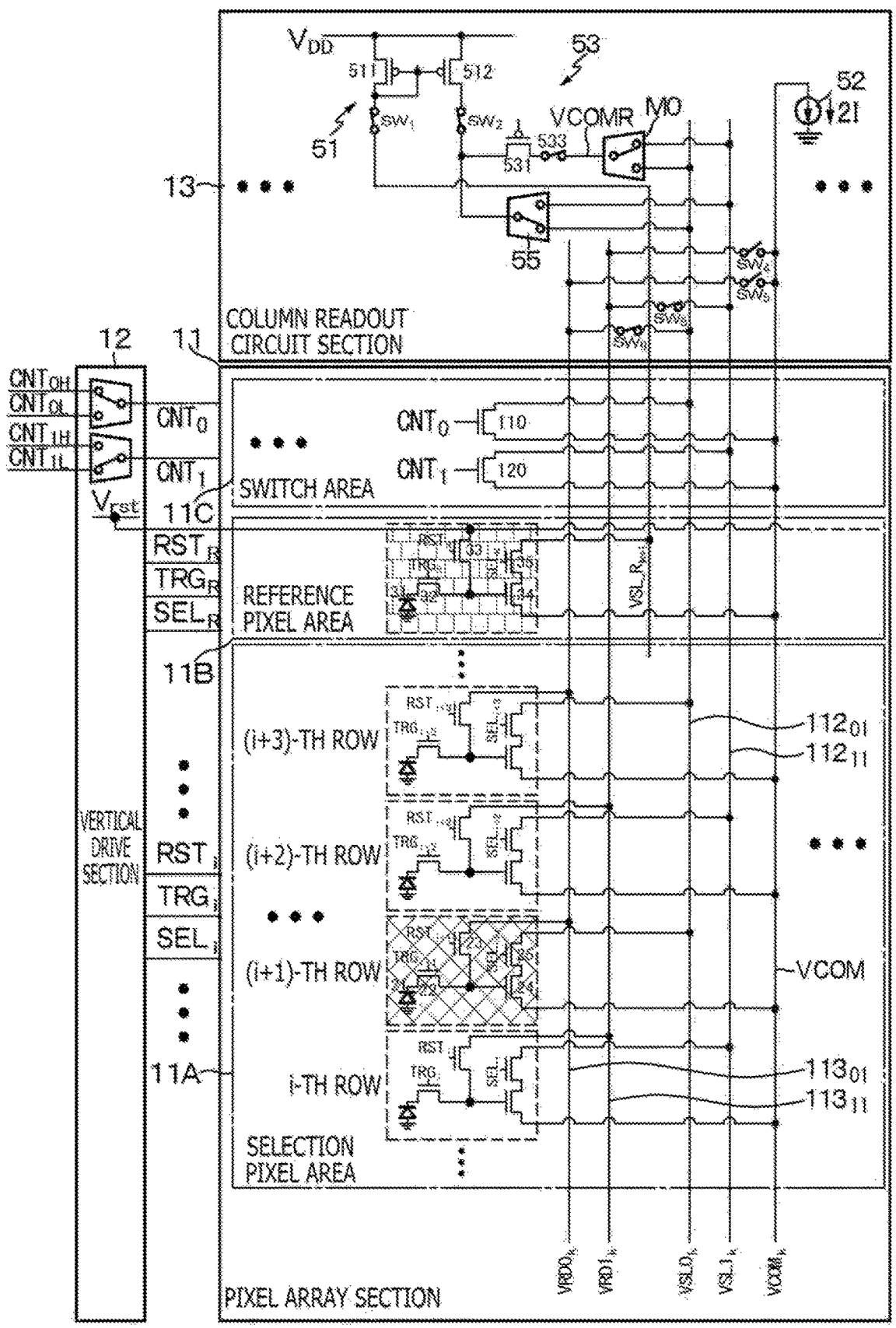
FIG. 33 is a circuit diagram depicting a wiring example regarding current paths for bypass current in the differential-amplification type imaging device according to a tenth implementation example.

FIG. 33 is a circuit diagram depicting a wiring example regarding current paths for bypass current in the differential-amplification type imaging device according to a tenth implementation example. The imaging device explained as an example here has a configuration in which switching between the differential amplification readout method and the SF readout method is possible and, for example, signals of selection pixels 20 in two pixel rows are read out simultaneously in SF readout. The same applies to an eleventh implementation example and a twelfth implementation example mentioned later. In addition, whereas a case of reference pixel fixation is mentioned as an example, the technology can be applied similarly also to a case of reference pixel following.

In the tenth implementation example, the vertical signal lines (VSL0 and VSL1) $112_{01}$ and $112_{11}$ in FIG. 33 that are used at a time of SF readout, but are not used at a time of differential amplification readout are used as current paths for bypass current where bypass currents for clipping the voltage of the differential output node $N_1$ (see FIG. 5) of the differential amplification circuit 50 to a predetermined voltage flow.

In order to use the vertical signal lines (VSL0 and VSL1) $112_{01}$ and $112_{11}$ as current paths for bypass current, the column readout circuit section 13 is provided with a selector switch M0 that electrically connects an output wire VCOMR (specifically, the output wire VCOMR connected to the switch 533) of the bypass control section 53, and the vertical signal lines $112_{01}$ and $112_{11}$ as inactive wires. Furthermore, a switch area 11C of the pixel array section 11 is provided with selector switches 110 and 120 that electrically connect the common wire VCOM and the vertical signal lines $112_{01}$ and $112_{11}$ as inactive wires.

The selector switches 110 and 120 in the switch area 11C can include transistors. Similarly to pixel transistors, the transistors of the selector switches 110 and 120 formed in the pixel array section 11 preferably are N-channel MOS transistors rather than P-channel MOS transistors in terms of sizes. It should be noted that, in a case of N-channel MOS transistors, currents that are allowed to flow therethrough are limited. Because of this, the transistors of the selector switches 110 and 120 to be used are preferably depression-type N-channel MOS transistors. ON/OFF control of the selector switches 110 and 120 including depression-type N-channel MOS transistors is performed according to switch control signals CNT0 and CNT1 generated in the vertical drive section 12.

Figure 34:
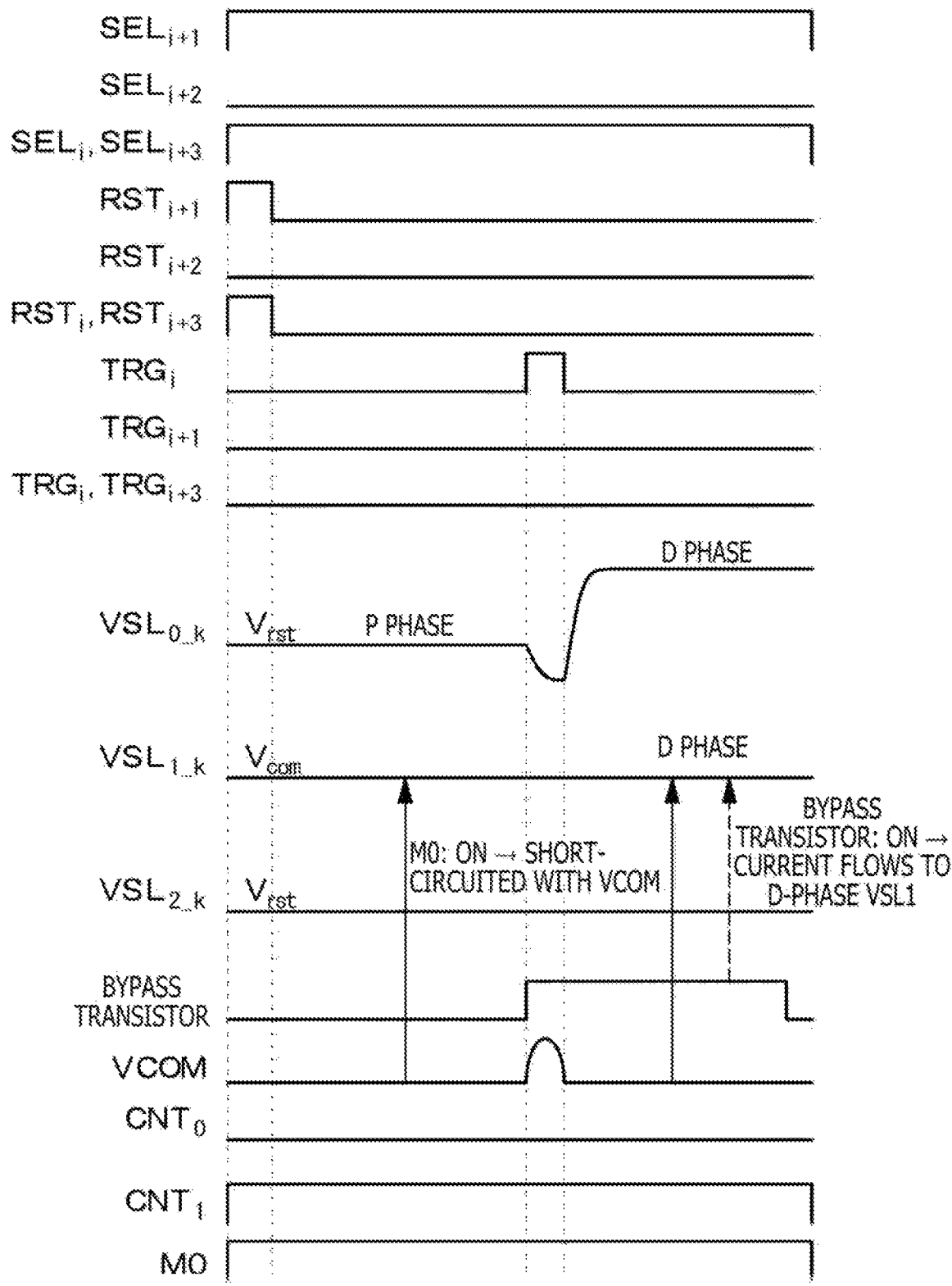
FIG. 34 is a timing waveform diagram for explaining operation in a case of reference pixel fixation in the differential-amplification type imaging device according to the tenth implementation example.
Figure 35:
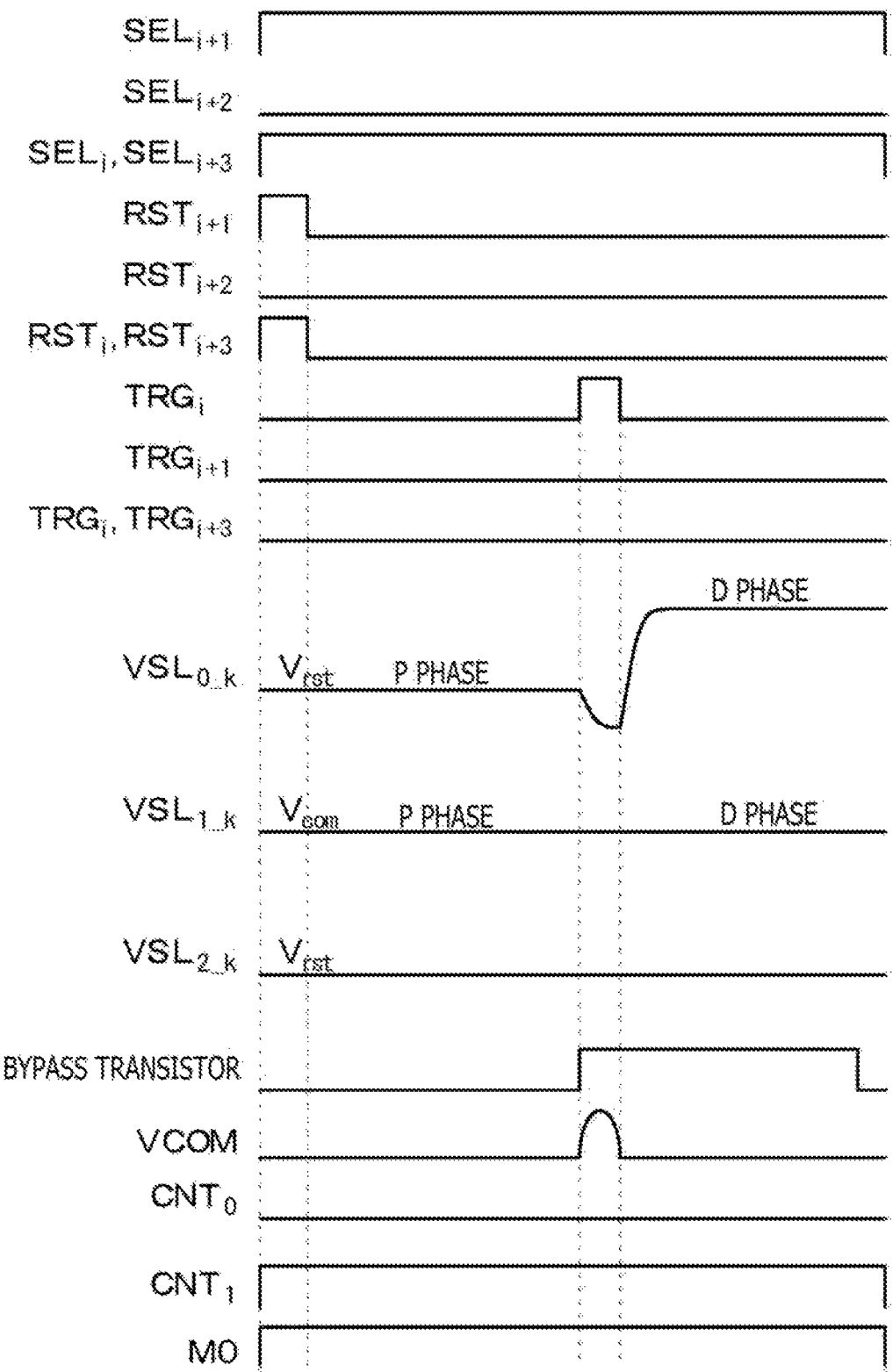
FIG. 35 is a timing waveform diagram for explaining operation in a case of reference pixel following in the differential-amplification type imaging device according to the tenth implementation example.

FIG. 33 depicts a state where the selector switch M0 has selected the vertical signal line (VSL1) $112_{11}$ in a case of reference pixel fixation. FIG. 34 depicts a timing waveform diagram for explaining operation in a case of reference pixel fixation. In a state where the selector switch M0 has selected the vertical signal line (VSL1) $112_{11}$, the switch control signal CNT1 becomes a high level, and, in response to this, the selector switch 120 is turned on. As a result, the vertical signal line (VSL1) $112_{11}$ is electrically connected to the common wire VCOM. Then, because the bypass transistor 531 of the bypass control section 53 is turned on in a D phase (signal data) period at a time of differential amplification readout, a bypass current flows to the common wire VCOM through the selector switch M0 and the selector switch 120. Meanwhile, FIG. 35 depicts a timing waveform diagram for explaining operation in a case of reference pixel following.

As mentioned above, in the differential-amplification type imaging device according to the tenth implementation example, the vertical signal lines (VSL0 and VSL1) $112_{01}$ and $112_{11}$ which are inactive wires that are used at a time of SF readout, but are not used at a time of differential amplification readout are used as current paths for bypass current. The vertical signal lines (VSL0 and VSL1) $112_{01}$ and $112_{11}$ are existing wires provided for each pixel column along the pixel column. Accordingly, it is not necessary to provide current paths for bypass current in the pixel array section 11, so that the number of wires to be provided for each pixel column along the pixel column can be reduced.

Then, due to a reduction of the number of wires to be provided for each pixel column along the pixel column, a simplification of the wiring structure of the pixel array section 11, and a cost reduction along with it become possible, and also, effects and advantages like the ones mentioned below can be attained in the stacked semiconductor chip structure depicted in FIG. 3B. That is, when the first semiconductor chip 44 where the pixel array section 11 is formed is treated as a pixel chip, and the second semiconductor chip 45 where the column readout circuit section 13 and the like are formed is treated as a circuit chip in the stacked semiconductor chip structure depicted in FIG. 3B, the number of connection sections such as Cu—Cu connections that electrically connect both chips can be reduced.

Figure 36:
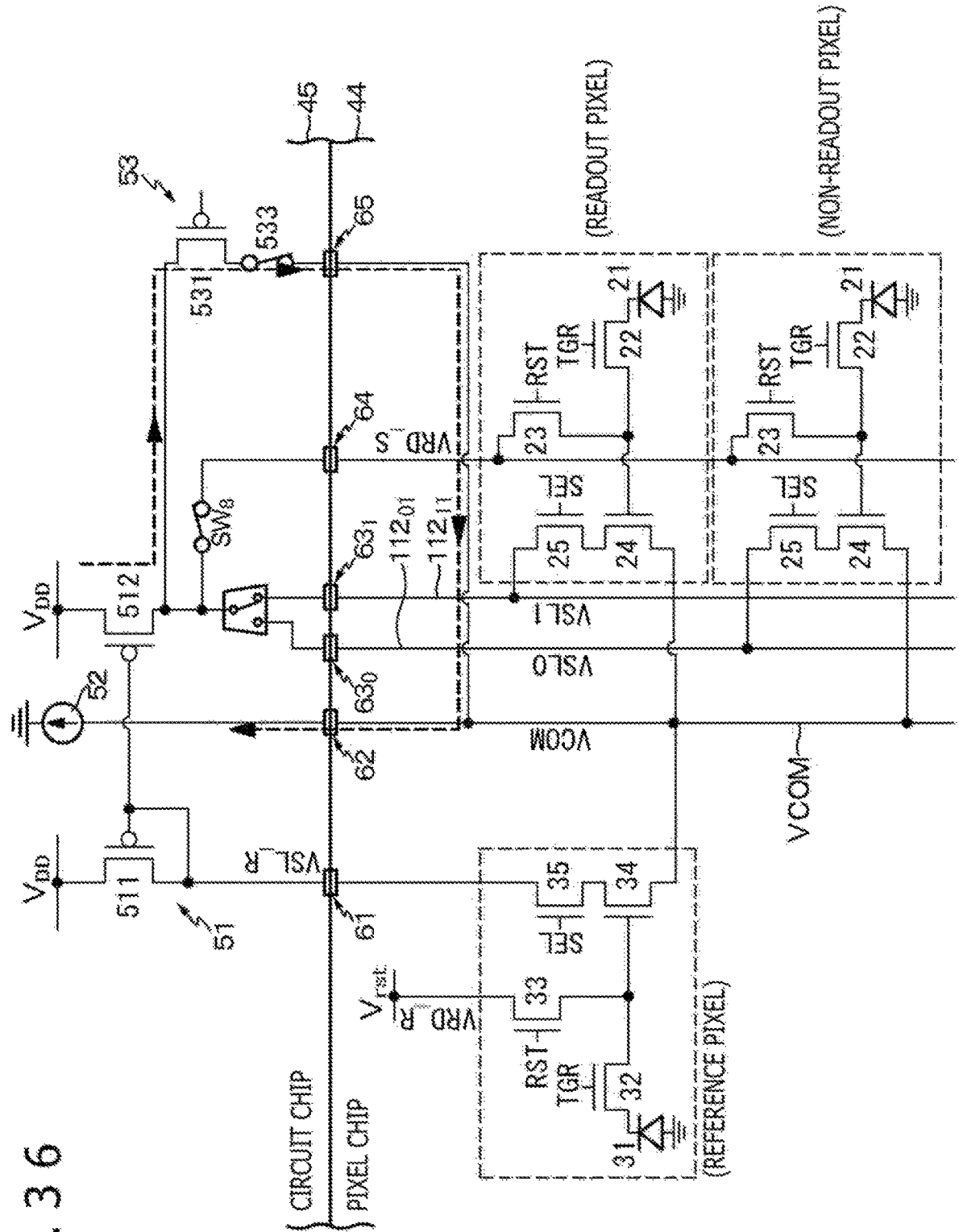
FIG. 36 is a circuit diagram depicting the configuration of connection sections such as Cu—Cu connections in a case in which a current path for bypass current is provided in the pixel array section.
Figure 37:
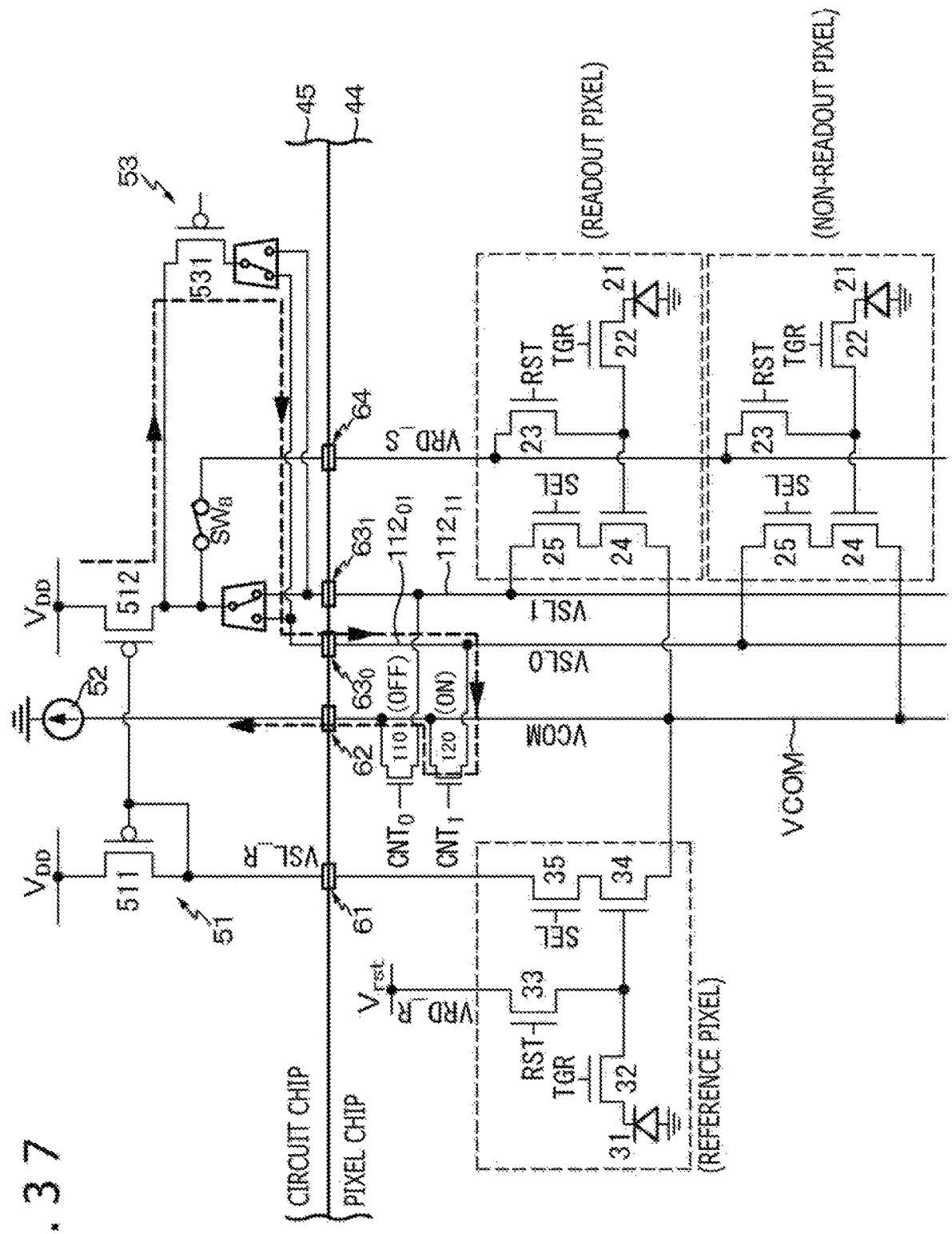
FIG. 37 is a circuit diagram depicting a configuration of connection sections such as Cu—Cu connections in the differential-amplification type imaging device according to the tenth implementation example.

Specifically, in a case in which current paths for bypass current are provided in the pixel array section 11, as depicted in FIG. 36, for example, six connection sections in total which are a connection section 61 for the signal line VSL_R on the reference-pixel side, a connection section 62 for the common wire VCOM, connection sections $63_0$ and $63_1$ for the vertical signal lines (VSL0 and VSL1) $112_{01}$ and $112_{11}$, a connection section 64 for the reset line VRD_S on the readout-pixel (selection-pixel) side, and a connection section 65 for a current path for bypass current are necessary as connection sections such as Cu—Cu connections. In contrast to this, in a case of the tenth implementation example in which the vertical signal lines (VSL0 and VSL1) $112_{01}$ and $112_{11}$ are used as current paths for bypass current, as depicted in FIG. 37, the connection section 65 for a current path for bypass current becomes unnecessary, so that the number of connection sections such as Cu—Cu connections can be reduced by one per pixel column. Accordingly, the number of connection sections such as Cu—Cu connections in the pixel array section 11 as a whole can be reduced by the number of pixel columns, and accordingly, the effect of the reduction is extremely significant. In FIG. 36 and FIG. 37, current paths through which bypass currents flow are represented by arrows with broken lines.

Eleventh Implementation Example

Figure 38:
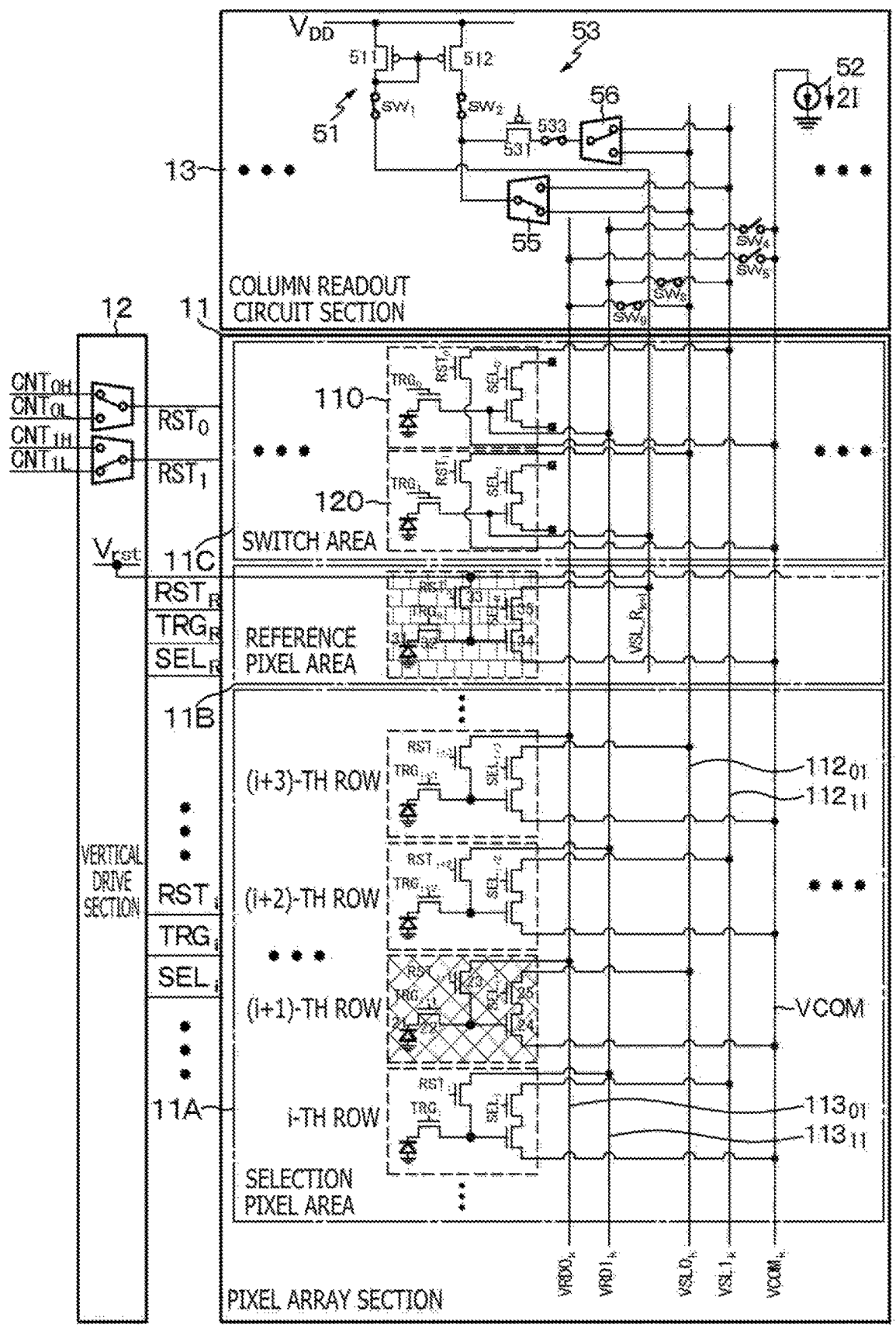
FIG. 38 is a circuit diagram depicting a wiring example regarding current paths for bypass current in the differential-amplification type imaging device according to an eleventh implementation example.

An eleventh implementation example is a modification example of the tenth implementation example, and is another configuration example of the selector switches that electrically connect the vertical signal lines and the common wire. FIG. 38 is a circuit diagram depicting a wiring example regarding current paths for bypass current in the differential-amplification type imaging device according to the eleventh implementation example.

As depicted in FIG. 38, in the configuration of the eleventh implementation example, in the switch area 11C, the selector switches 110 and 120 that electrically connect the common wire VCOM and the vertical signal lines $112_{01}$ and $112_{11}$ as inactive wires are formed by using pixel circuits similar to pixels in the pixel array section 11. More specifically, in pixel circuits similar to selection pixels 20 and reference pixels 30, reset transistors (RSTs) are used as switch elements.

As mentioned above, in the differential-amplification type imaging device according to the eleventh implementation example, the selector switches 110 and 120 that electrically connect the vertical signal lines $112_{01}$ and $112_{11}$ and the common wire VCOM include pixel circuits similar to pixels in the pixel array section 11. Accordingly, the selector switches 110 and 120 can be formed in a process of forming the pixels in the pixel array section 11, so that it is possible to attempt to realize a simplification of processes as compared to a case that the selector switches 110 and 120 are formed through a process which is different from a process for the pixels.

In addition, also in a case of the eleventh implementation example, effects and advantages similar to those of the case of the tenth implementation example can be attained. That is, the number of wires provided for each pixel column along the pixel column can be reduced, and also the number of connection sections such as Cu—Cu connections that electrically connect the pixel chip where the pixel array section 11 is formed and the circuit chip where the column readout circuit section 13 and the like are formed can be reduced by one per pixel column. Then, the number of connection sections such as Cu—Cu connections in the pixel array section 11 as a whole can be reduced by the number of pixel columns.

Twelfth Implementation Example

Figure 39:
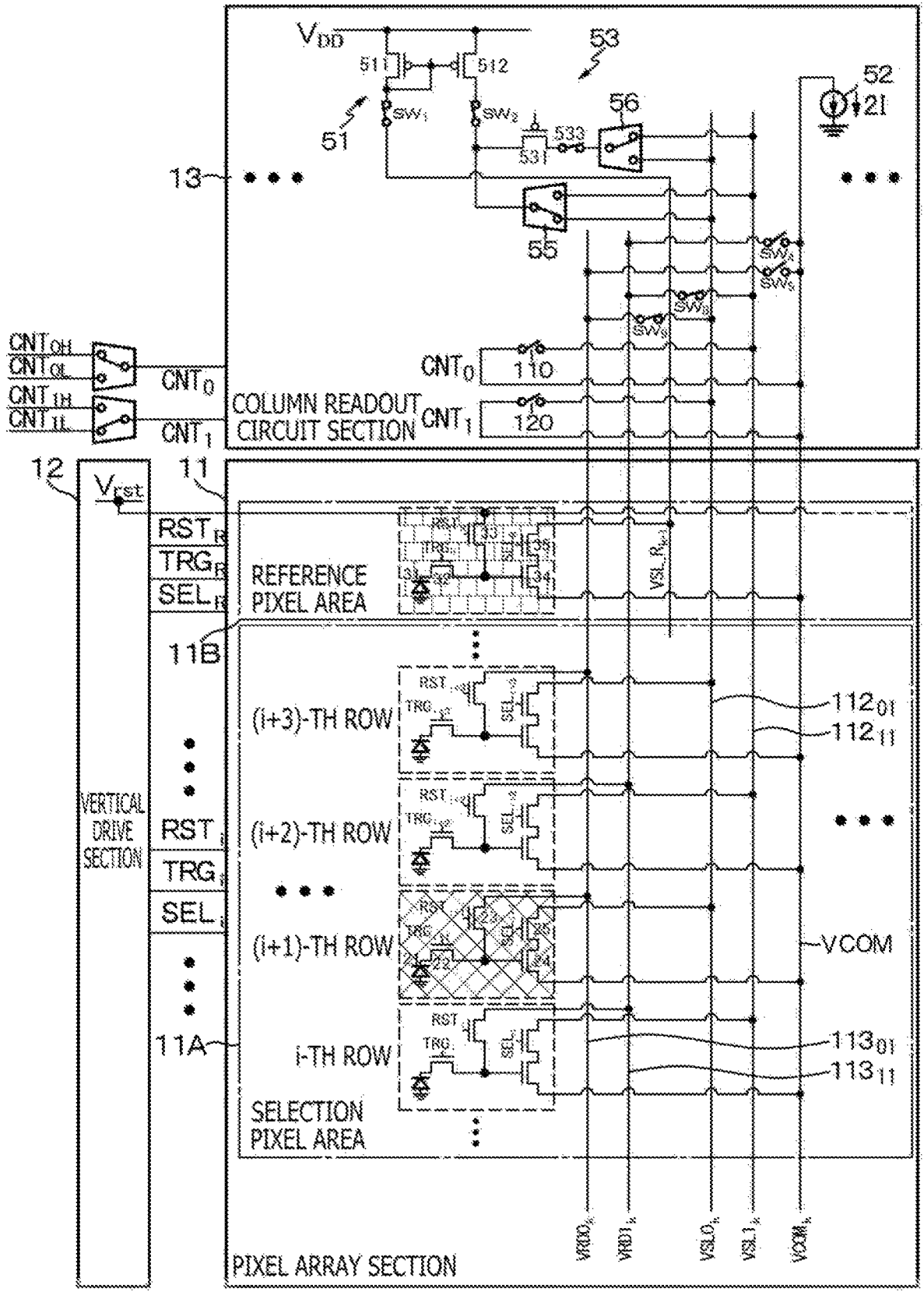
FIG. 39 is a circuit diagram depicting a wiring example regarding current paths for bypass current in the differential-amplification type imaging device according to a twelfth implementation example.

A twelfth implementation example is an example in which the selector switches that electrically connect the vertical signal lines and the common wire are formed in the column readout circuit section. FIG. 39 is a circuit diagram depicting a wiring example regarding current paths for bypass current in the differential-amplification type imaging device according to the twelfth implementation example.

As depicted in FIG. 39, in the configuration of the twelfth implementation example, the selector switches 110 and 120 that electrically connect the common wire VCOM and the vertical signal lines $112_{01}$ and $112_{11}$ as inactive wires are formed in the column readout circuit section 13. The selector switches 110 and 120 can include transistors.

As mentioned above, by forming the selector switches 110 and 120 that connect the vertical signal lines $112_{01}$ and $112_{11}$ and the common wire VCOM in the column readout circuit section 13, transistors that form the selector switches 110 and 120 are not limited (constrained) as compared to a case that the selector switches 110 and 120 are formed in the pixel array section 11. That is, as transistors that form the selector switches 110 and 120, P-channel MOS transistors can be used, and N-channel MOS transistors can also be used.

In addition, in a case of the twelfth implementation example also, effects and advantages similar to those of the case of the tenth implementation example can be attained. That is, the number of wires provided for each pixel column along the pixel column can be reduced, and also the number of connection sections such as Cu—Cu connections that electrically connect the pixel chip where the pixel array section 11 is formed and the circuit chip where the column readout circuit section 13 and the like are formed can be reduced by one per pixel column. Then, the number of connection sections such as Cu—Cu connections in the pixel array section 11 as a whole can be reduced by the number of pixel columns.

Thirteenth Implementation Example

A thirteenth implementation example is an example in which, in the differential-amplification type imaging device that uses, as a reset method for selection pixels 20, the reset method 1 mentioned earlier, that is, the VRD wiring method in which a wire of a reset line (VRD) is provided for each pixel column along the pixel column, the reset line (VRD) used only at a time of reset in differential amplification readout is used as a current path for bypass current.

Figure 40:
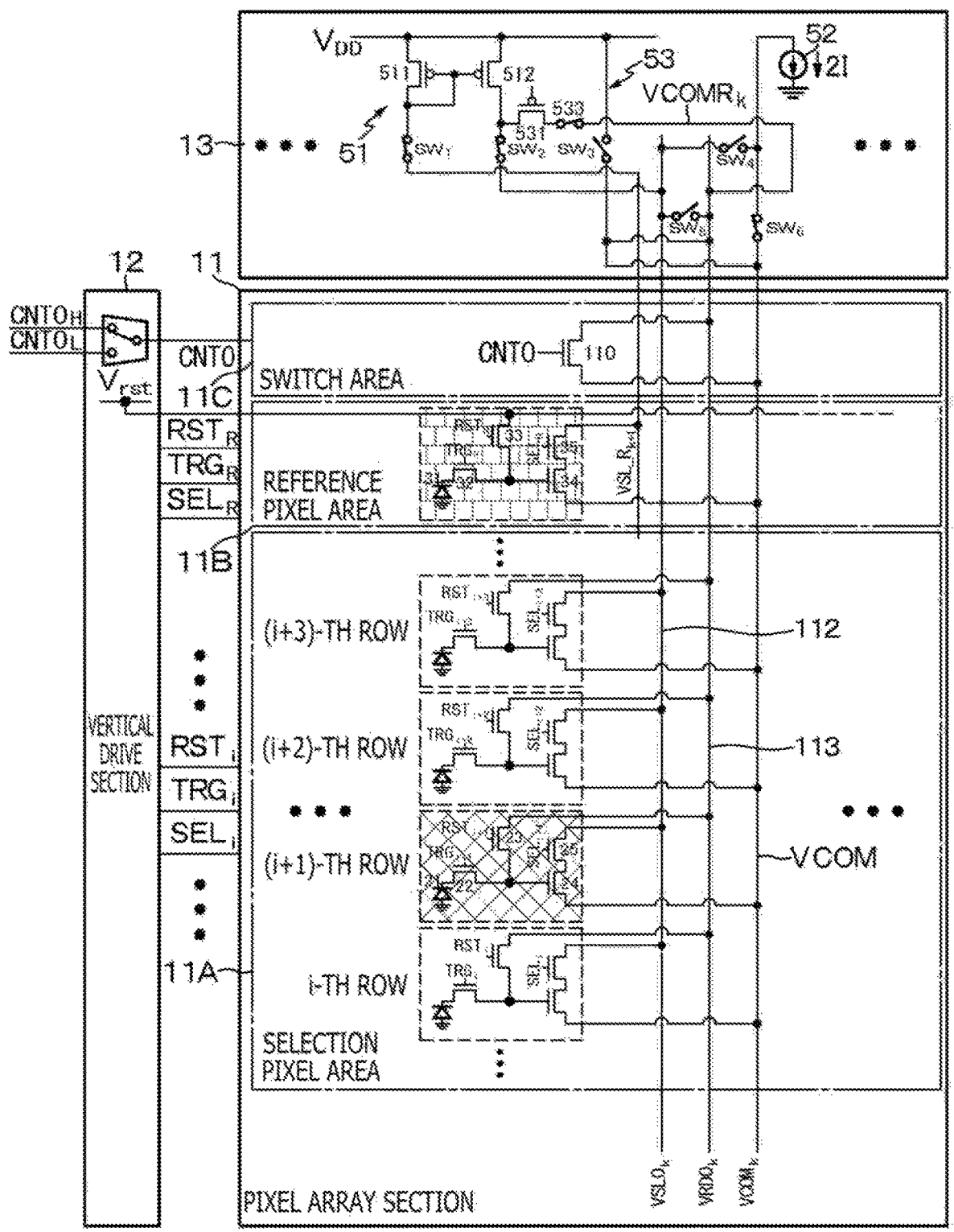
FIG. 40 is a circuit diagram depicting a wiring example regarding current paths for bypass current in the differential-amplification type imaging device according to a thirteenth implementation example.

FIG. 40 is a circuit diagram depicting a wiring example regarding current paths for bypass current in the differential-amplification type imaging device according to the thirteenth implementation example. The imaging device explained as an example here has a configuration in which signals of selection pixels 20 are read out sequentially for each pixel row in SF readout. Accordingly, in a case of the imaging device, one vertical signal line (VSL) 112 and one reset line (VRD) 113 are provided for each pixel column. The reset line (VRD) 113 is a wire that is used only at a time of reset in differential amplification readout.

In the thirteenth implementation example, the reset line (VRD) 113 that is used only at a time of reset in differential amplification readout is used as a current path for bypass current where a bypass current for clipping the voltage of the differential output node $N_1$ (see FIG. 5) of the differential amplification circuit 50 to a predetermined voltage flows. That is, the reset line (VRD) 113 that is used at a time of reset is used as a current path for bypass current in P phase (reset data) and D phase (signal data).

In order to use the reset line (VRD) 113 as a current path for bypass current, the reset line (VRD) 113 as an inactive wire is electrically connected to the output wire VCOMR (specifically, the output wire VCOMR connected to the switch 533) of the bypass control section 53. Further, the switch area 11C of the pixel array section 11 is provided with the selector switch 110 that electrically connects the common wire VCOM and the reset line (VRD) 113 as an inactive wire.

As mentioned above, in the differential-amplification type imaging device according to the thirteenth implementation example, the reset line (VRD) 113 that is used only at a time of reset in differential amplification readout is used as a current path for bypass current. In the differential-amplification type imaging device adopting the VRD wiring method as a reset method for selection pixels 20, the reset line (VRD) 113 is an existing wire provided for each pixel column along the pixel column. Accordingly, similarly to the case of the tenth implementation example, it is not necessary to provide current paths for bypass current in the pixel array section 11, so that the number of wires to be provided for each pixel column along the pixel column can be reduced.

Then, due to a reduction of the number of wires to be provided for each pixel column along the pixel column, a simplification of the wiring structure of the pixel array section 11, and a cost reduction along with it become possible, and also, effects and advantages like the ones mentioned below can be attained in the stacked semiconductor chip structure depicted in FIG. 3B. That is, similarly to the case of the tenth implementation example, in the stacked semiconductor chip structure depicted in FIG. 3B, the number of connection sections such as Cu—Cu connections that electrically connect the pixel chip where the pixel array section 11 is formed and the circuit chip where the column readout circuit section 13 and the like are formed can be reduced.

Figure 41:
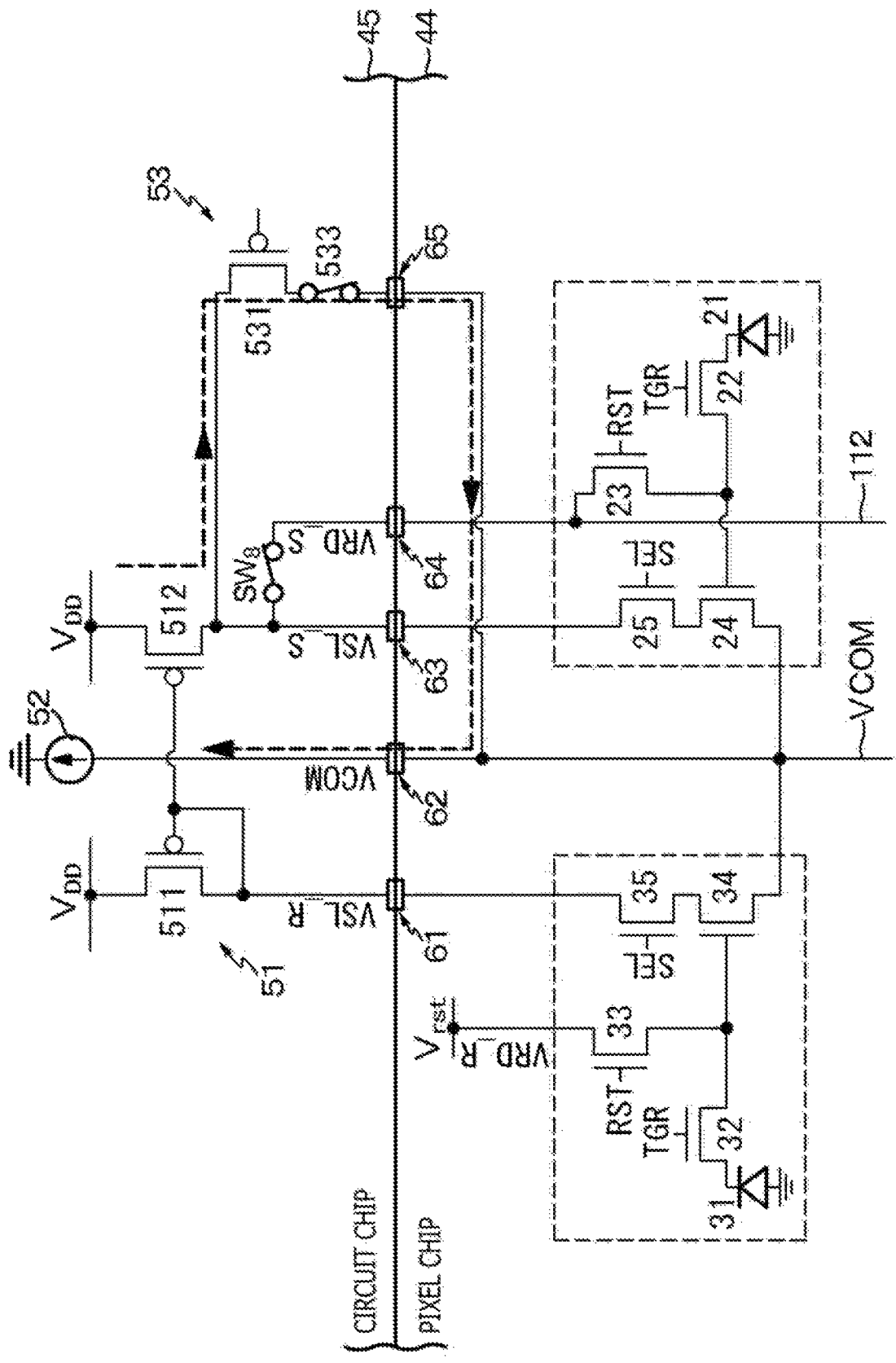
FIG. 41 is a circuit diagram depicting a configuration of connection sections such as Cu—Cu connections in a case in which a current path for bypass current is provided in the pixel array section.
Figure 42:
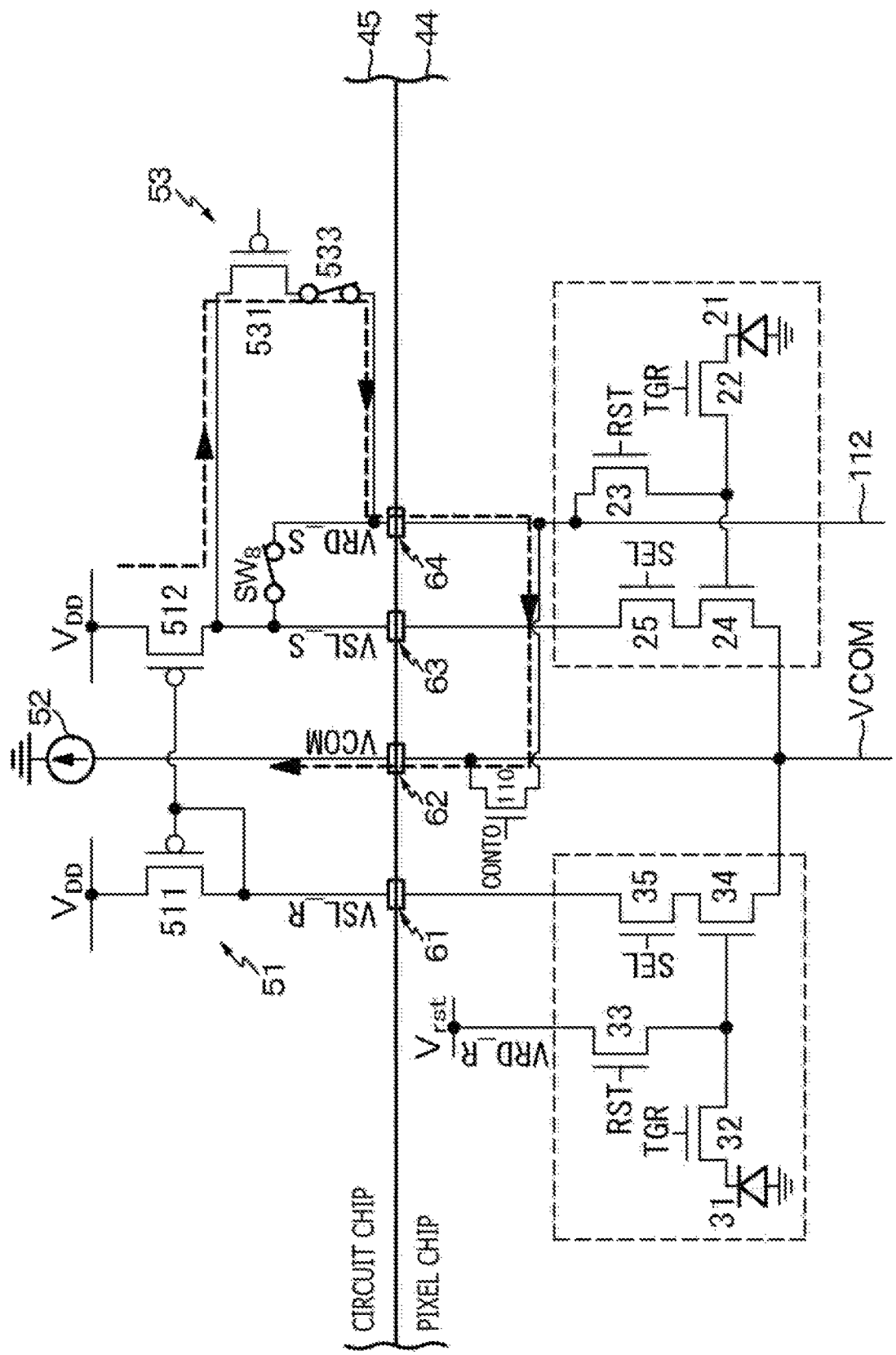
FIG. 42 is a circuit diagram depicting a configuration of connection sections such as Cu—Cu connections in the differential-amplification type imaging device according to the thirteenth implementation example.

Specifically, in a case in which current paths for bypass current are provided in the pixel array section 11, as depicted in FIG. 41, for example, five connection sections in total which are the connection section 61 for the signal line VSL_R on the reference-pixel side, the connection section 62 for the common wire VCOM, the connection section 63 for the vertical signal line VSL_S, the connection section 64 for the reset line VRD_S on the readout-pixel (selection-pixel) side, and the connection section 65 for a current path for bypass current are necessary as connection sections such as Cu—Cu connections. In contrast to this, in a case of the thirteenth implementation example in which the reset line (VRD) 113 used only at a time of reset in differential amplification readout is used as a current path for bypass current, as depicted in FIG. 42, the connection section 65 for a current path for bypass current becomes unnecessary, the number of connection sections such as Cu—Cu connections can be reduced by one per pixel column, and accordingly, the effect of the reduction is extremely significant. In FIG. 41 and FIG. 42, current paths through which bypass currents flow are represented by arrows with broken lines.

Third Embodiment of Present Disclosure

As one of differential-amplification type imaging devices including the bypass control section 53 and having a voltage clipping functionality of limiting (clipping) the voltage (differential output voltage) of the differential output node $N_1$ (see FIG. 5) to a predetermined voltage, there is an imaging device having a functionality of connecting, widthwise, pixel columns on the reference-pixel 30 side in the column readout circuit section 13 for the purpose of reducing noise on the reference-pixel 30 side (see WO 2018/190127 A1, for example).

Because, in the differential-amplification type imaging device having the functionality of widthwise connection described above, IR drop amounts resulting from the wire resistances of the common wires VCOM differ between a case of bypassing due to the bypass control section 53 and a case of not bypassing, an electric potential difference is generated at a widthwise connection position of the common wires VCOM between pixel columns in the pixel array section 11 which are a pixel column where a bypass current flows and a pixel column where a bypass current does not flow, and streaking occurs. In addition, because the wire resistances of the common wires VCOM vary depending on the positions of selection pixels 20, IR drop amounts change, and the changes appear as streaking.

Fourteenth Implementation Example

A fourteenth implementation example is an example to be applied to the differential-amplification type imaging device having a voltage clipping functionality of limiting the voltage of the differential output node $N_1$ and a functionality of widthwise connection on the reference-pixel 30 side for a noise reduction on the reference-pixel 30 side. Whereas cases that the fourteenth implementation example is applied to reference pixel following and single-sided readout, and reference pixel fixation and single-sided readout are explained as examples below, the fourteenth implementation example can be applied also to reference pixel following and double-sided readout, and reference pixel fixation and double-sided readout.

(Case of Reference Pixel Following and Single-Sided Readout)

Figure 43:
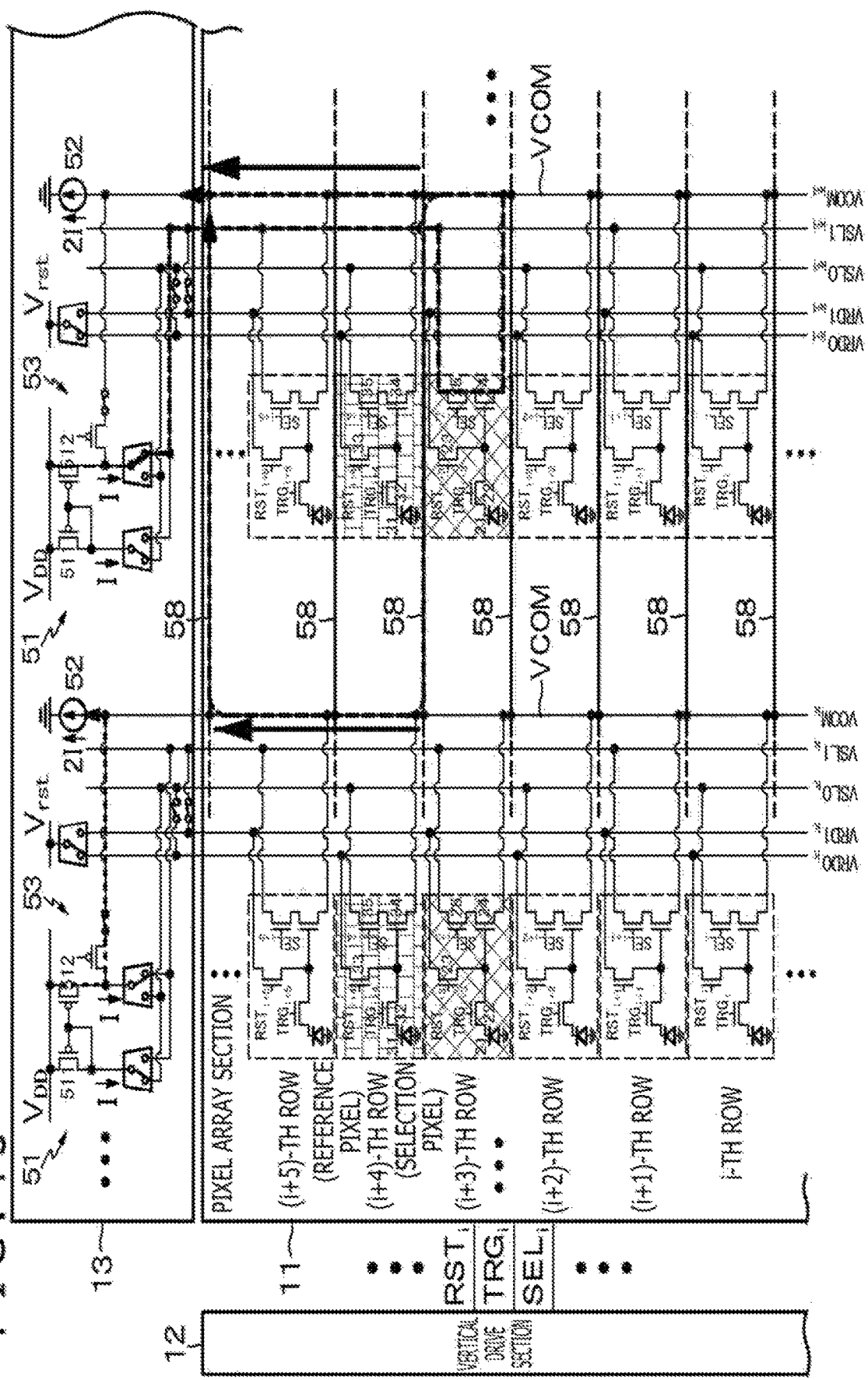
FIG. 43 is a circuit diagram of a main section of the differential-amplification type imaging device according to a fourteenth implementation example in a case of reference pixel following and single-sided readout.

FIG. 43 is a circuit diagram of a main section of the differential-amplification type imaging device according to the fourteenth implementation example of reference pixel following and single-sided readout. In the case mentioned here as an example, in the pixel array section 11, a pixel in the (i+4)-th row is treated as a reference pixel 30, and a pixel in the (i+3)-th row is treated as a selection pixel 20.

For the purpose of reducing noise on the reference-pixel 30 side, the configuration of the differential-amplification type imaging device according to the fourteenth implementation example of reference pixel following and single-sided readout has, in the pixel array section 11, widthwise connection wires 58 that connect, widthwise, pixel columns on the reference-pixel 30 side, and specifically connect (link), widthwise, the common wires VCOM of the pixel columns. A widthwise connection wire 58 may be provided for each pixel or may be provided for each set of a plurality of pixels. Whereas the widthwise connection wires 58 are wires that connect, widthwise, pixel columns on the reference-pixel 30 side for the purpose of reducing noise on the reference-pixel 30 side, the widthwise connection wires 58 are provided for all pixel rows because the differential-amplification type imaging device according to the fourteenth implementation example is a reference pixel following imaging device.

In the differential-amplification type imaging device according to the fourteenth implementation example of reference pixel following and single-sided readout having the configuration described above, at a time of bypass when the bypass transistor 531 is turned on, a bypass current that flows through the bypass transistor 531 flows through a path represented by a dotted bold line in FIG. 43. That is, the bypass current flows from the bypass transistor 531 through the common wire VCOM to the constant current source 52.

At normal time when intense light is not entering and the bypass transistor 531 is turned off, the signal current I output from the PMOS transistor 512 of the current mirror circuit 51 flows through a path in a circuit on the right column represented by a broken bold line in FIG. 43. That is, after passing through the selection transistor 25 and the amplification transistor 24 of the selection pixel 20 in the (i+3)-th row, the signal current I flows into the constant current source 52 through the common wire VCOM, and also is distributed to the common wire VCOM in another pixel column by way of a widthwise connection wire 58. Then, in order to keep the current that flows to the constant current source 52 constant, the signal current I returns to the common wire VCOM in the original column through a widthwise connection wire 58 close to the constant current source 52. In addition, in the stacked semiconductor chip structure, a current returns also from a widthwise connection wire in the upper chip, and, if there is a widthwise connection wire in the lower chip, a current returns to the same column also from a widthwise connection wire in the lower chip.

As mentioned above, by establishing widthwise connection on the reference-pixel 30 side for each pixel column or for each set of a plurality of pixel columns by using the widthwise connection wires 58, noise on the reference-pixel 30 side is averaged through the widthwise connection wires 58, so that noise on the reference-pixel 30 side can be reduced. That is, the widthwise connection wires 58 have a functionality as common wire column linkage paths that reduce an electric potential difference of common wires between pixel columns in the pixel array section 11 which are a pixel column where a bypass current flows and a pixel column where a bypass current does not flow. Further, because the widthwise connection wires 58 are provided in the pixel array section 11, as represented by the broken bold line in FIG. 43, a current is distributed to pixel columns through the widthwise connection wires 58, and accordingly, a difference between IR drop amounts from reference pixels 30 to the constant current sources 52 resulting from the wire resistances of the common wires VCOM decreases. Thereby, an electric potential difference between pixel columns at widthwise connection positions can be reduced, so that the occurrence of streaking can be reduced.

Whereas a case of reference pixel following and single-sided readout is explained as an example here, a case of reference pixel following and double-sided readout is similar to the case of reference pixel following and single-sided readout.

(Case of Reference Pixel Fixation and Single-Sided Readout)

Figure 44:
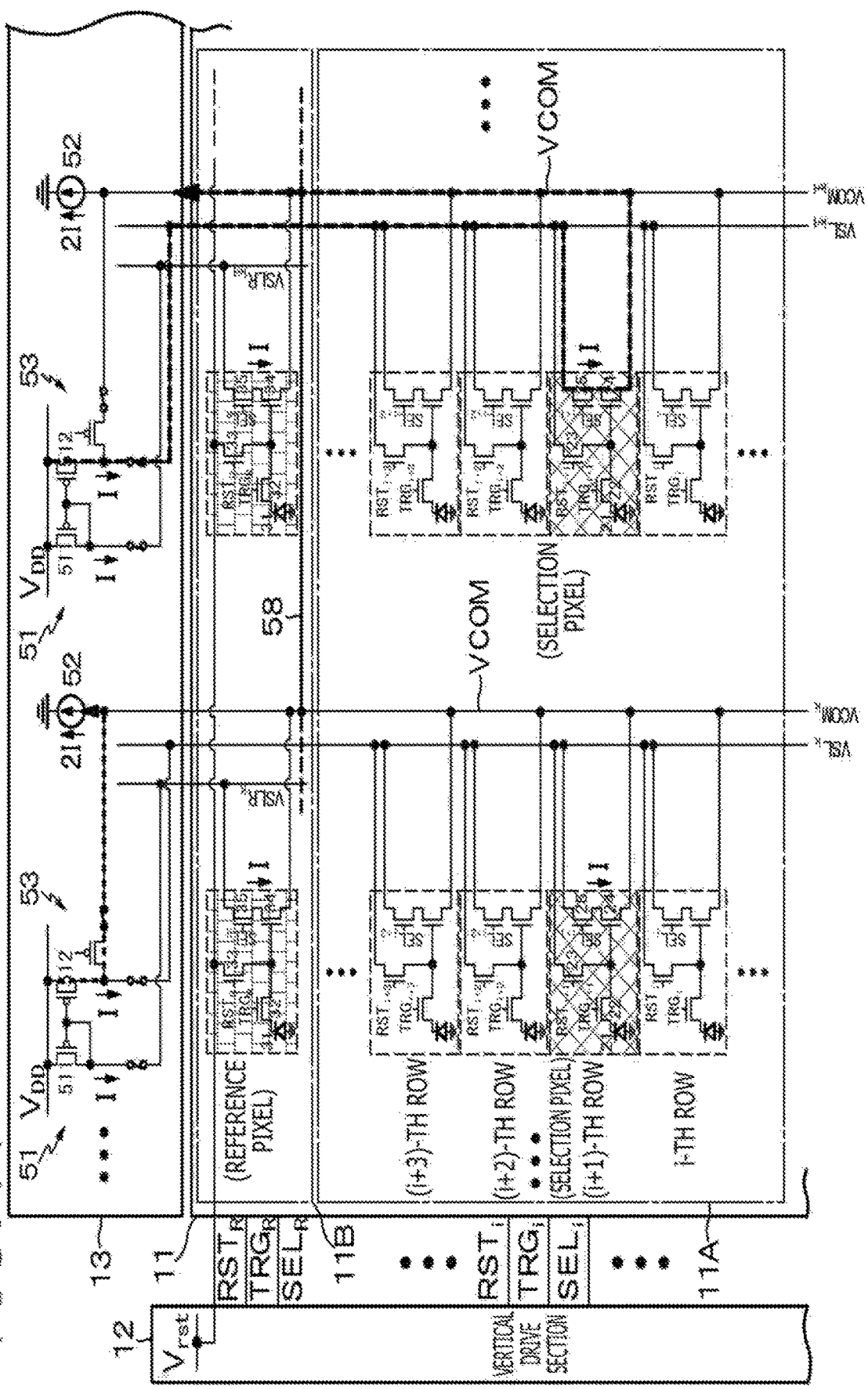
FIG. 44 is a circuit diagram of a main section of the differential-amplification type imaging device according to the fourteenth implementation example in a case of reference pixel fixation and single-sided readout.

FIG. 44 is a circuit diagram of a main section of the differential-amplification type imaging device according to the fourteenth implementation example in a case of reference pixel fixation and single-sided readout.

In a case of single-sided readout and reference pixel fixation, the pixel array section 11 includes the selection pixel area 11A where selection pixels 20 are arranged, and the reference pixel area 11B where reference pixels 30 are arranged. In the case mentioned as an example here, pixels in the (i+1)-th row are treated as selection pixels 20 in the selection pixel area 11A.

For the purpose of reducing noise on the reference-pixel 30 side, the configuration of the differential-amplification type imaging device according to the fourteenth implementation example of reference pixel fixation and single-sided readout has, in a particular area in the pixel array section 11, that is, in the reference pixel area 11B, a widthwise connection wire 58 that connects, widthwise, pixel columns on the reference-pixel 30 side, and specifically connects (links), widthwise, the common wires VCOM of the pixel columns. The widthwise connection wire 58 may be provided for each pixel or may be provided for each set of a plurality of pixels.

In the differential-amplification type imaging device according to the fourteenth implementation example of reference pixel fixation and single-sided readout having the configuration described above, at a time of bypass when the bypass transistor 531 is turned on, a bypass current that flows through the bypass transistor 531 flows through a path represented by a dotted bold line in FIG. 44. That is, the bypass current flows from the bypass transistor 531 through the common wire VCOM to the constant current sources 52.

At normal time when the bypass transistor 531 is turned off, the signal current I output from the PMOS transistor 512 of the current mirror circuit 51 flows through a path represented by a broken bold line in FIG. 44, and flows into the constant current source 52 through the common wire VCOM.

By providing the widthwise connection wire 58 provided in the reference pixel area 11B for reference pixels 30 also in the differential-amplification type imaging device of reference pixel fixation and single-sided readout mentioned above, an electric potential difference between the common wires at a widthwise connection linkage position of a pixel column where a bypass current flows and a pixel column where a bypass current does not flow can be reduced. Thereby, noise on the reference-pixel side can be reduced.

Also, because there is a linkage only for one row widthwise, current does not flow widthwise, and a vertical electric potential difference of the common wires VCOM is not generated. As a result, the occurrence of streaking can be reduced.

Whereas a case of reference pixel fixation and single-sided readout is explained as an example here, a case of reference pixel fixation and double-sided readout is similar to the case of reference pixel fixation and single-sided readout.

MODIFICATION EXAMPLES

Whereas the technology according to the present disclosure has been explained thus far on the basis of preferred embodiments, the technology according to the present disclosure is not limited to the embodiments. The configuration and structure of the imaging device explained in the embodiments described above are depicted as examples and can be changed as appropriate.

Application Examples

Figure 45:
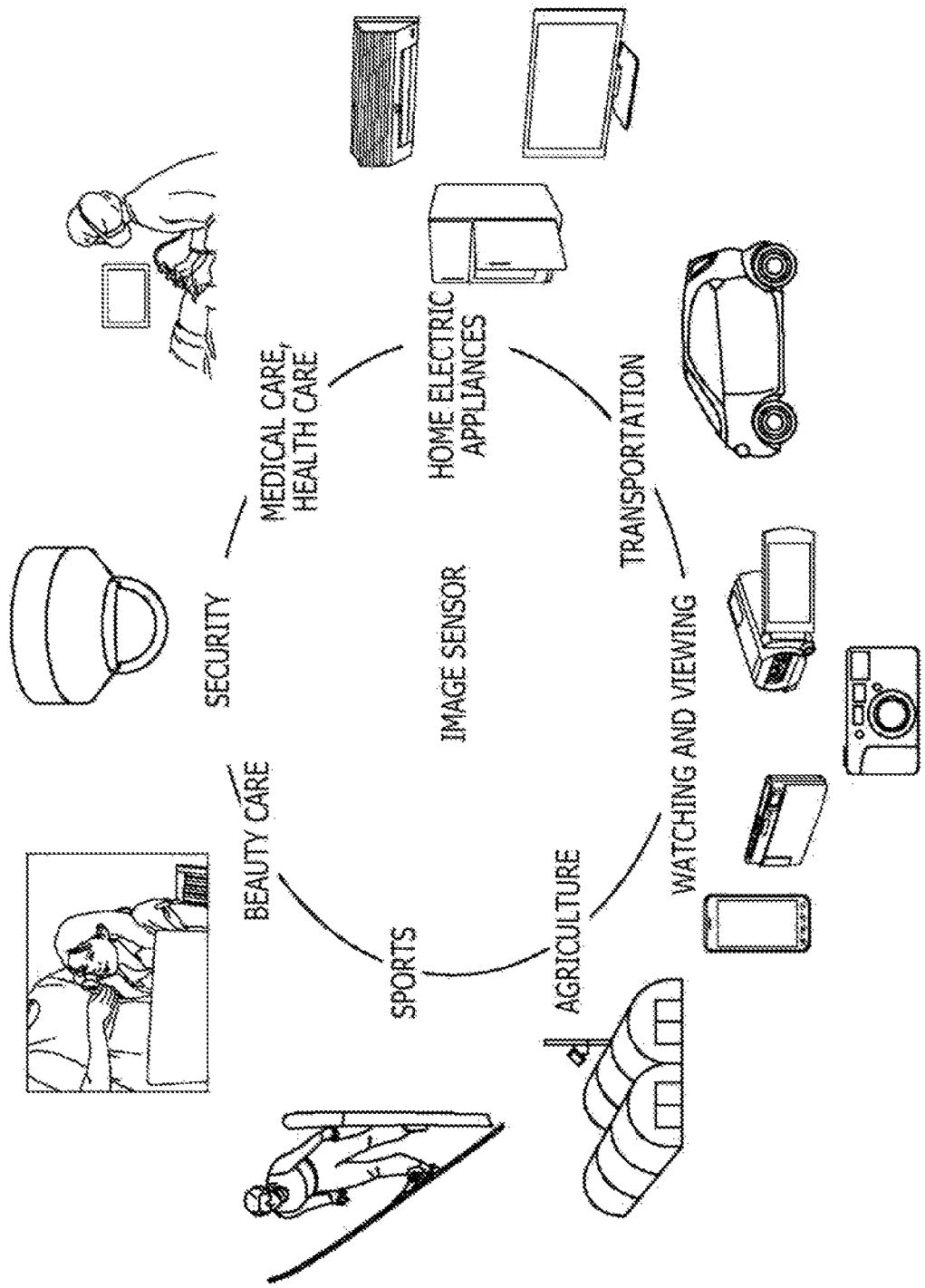
FIG. 45 is a figure depicting application examples of the technology according to the present disclosure.

The imaging device according to the present embodiments explained above can be used for various devices that sense light such as visible light, infrared light, ultraviolet light, or X-rays as depicted in FIG. 45, for example. Specific examples of the various devices are listed below.

Devices, such as digital cameras or mobile equipment having camera functions, that capture images aimed for watching and viewing Devices aimed for transportation such as vehicle-mounted sensors that capture images of a space in front of a car, a space behind the car, spaces around the car, the interior of the car, or the like, monitoring cameras that monitor travelling vehicles and roads, or distance measurement sensors that perform measurement of distances between vehicles and the like, for safe driving by automatic stops or the like, recognition of the state of the driver, and the like Devices aimed for home electric appliances such as TVs, refrigerators, or air conditioners for performing equipment operation according to gestures of a user captured by the devices Devices aimed for medical care or health care such as endoscopes or devices that perform capturing of an image of blood vessels by receiving infrared light Devices aimed for security such as monitoring cameras for crime prevention uses or cameras for human authentication uses Devices aimed for beauty care such as skin measurement devices that capture images of skin or microscopes that capture images of scalps Devices aimed for sports such as action cameras or wearable cameras targeted at sports uses or the like Devices aimed for agriculture such as cameras for monitoring the states of fields and crops Application Examples of Technology According to Present Disclosure The technology according to the present disclosure can be applied to various products. More specific application examples are explained below.

[Electronic Equipment of Present Disclosure]

In the case explained here, the technology according to the present disclosure is applied to electronic equipment such as an imaging system such as a digital still camera or a video camera, a mobile terminal device such as a mobile phone having an imaging functionality or a copying machine that uses an imaging element for an image reading section.

(Example of Imaging System)

Figure 46:
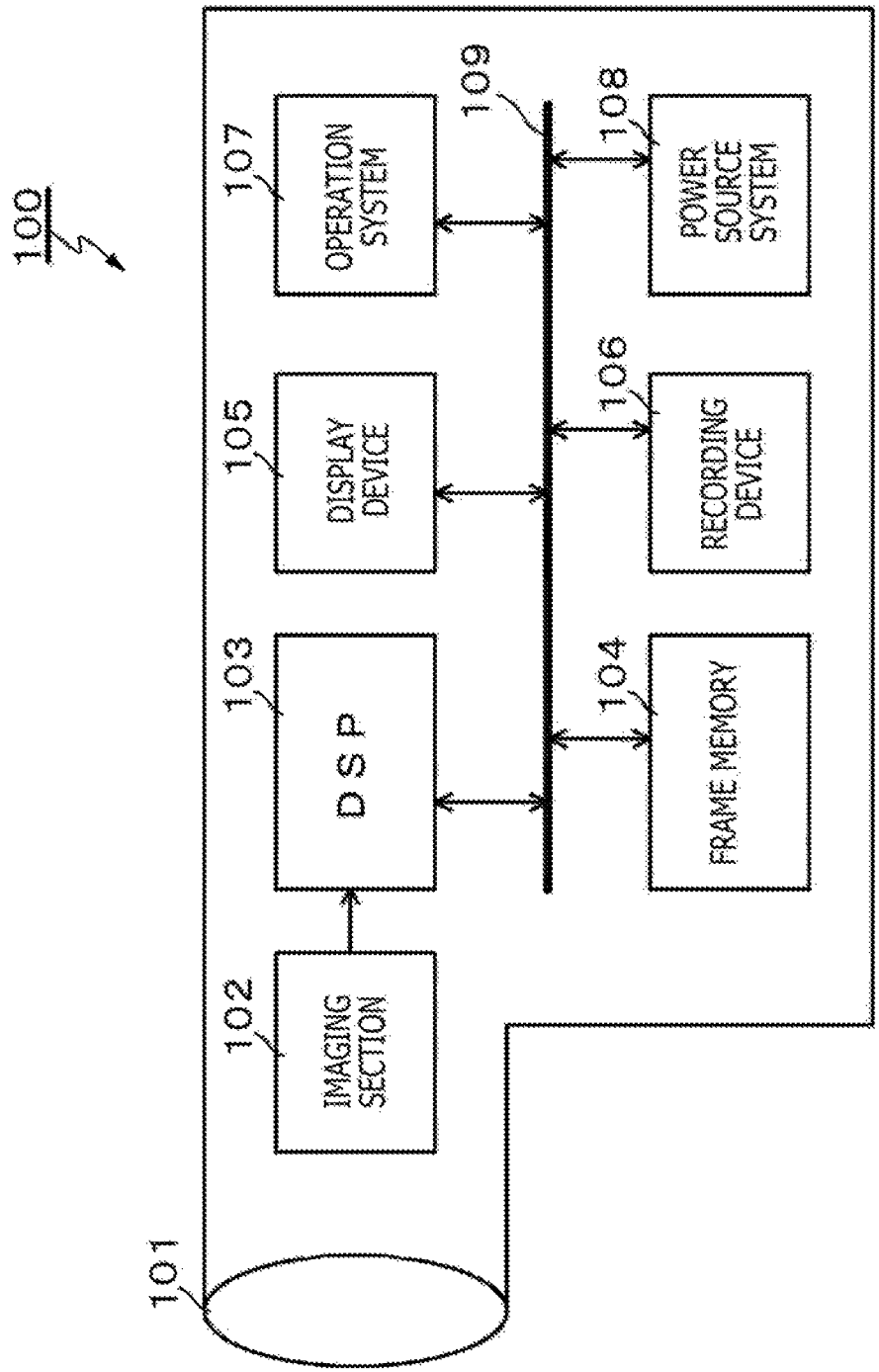
FIG. 46 is a block diagram depicting an overview of a configuration example of an imaging system which is an example of electronic equipment of the present disclosure.

FIG. 46 is a block diagram depicting a configuration example of an imaging system which is an example of electronic equipment of the present disclosure.

As depicted in FIG. 46, an imaging system 100 according to the present example has an imaging optical system 101 including a lens group and the like; an imaging section 102, a DSP (Digital Signal Processor) circuit 103, a frame memory 104, a display device 105, a recording device 106, an operation system 107, a power source system 108, and the like. Then, the imaging system 100 has configuration in which the DSP circuit 103, the frame memory 104, the display device 105, the recording device 106, the operation system 107 and the power source system 108 are interconnected via a bus line 109.

The imaging optical system 101 takes in incident light (image light) from a subject, and forms an image of the incident light on an imaging surface of the imaging section 102. The imaging section 102 converts, for each pixel, into an electric signal, the light amount of the incident light whose image has been formed on the imaging surface by the optical system 101, and outputs the electric signal as a pixel signal. The DSP circuit 103 performs typical camera signal processing, for example, a white balance process, a demosaicing process, a gamma correction process, and the like.

The frame memory 104 is used for storing data in the course of the signal processing at the DSP circuit 103 as appropriate. The display device 105 includes a panel-type display device such as a liquid crystal display device or an organic EL (electro luminescence) display device, and displays moving images or still images captured by the imaging section 102. The recording device 106 records the moving images or still images captured by the imaging section 102 on a recording medium such as a portable semiconductor memory, an optical disc or a HDD (Hard Disk Drive).

The operation system 107 gives operation commands for various functionalities of the imaging device 100 under operation by a user. The power source system 108 supplies various types of power source as operation power sources of the DSP circuit 103, the frame memory 104, the display device 105, the recording device 106, and the operation system 107 to those supply targets as appropriate.

The imaging device according to the embodiments mentioned earlier can be used as the imaging section 102 in the imaging system 100 having the configuration described above. The imaging device can reduce the occurrence of streaking, and as a result, high-quality captured images without noise such as streaking can be obtained.

Examples of Application to Mobile Bodies

The technology according to the present disclosure (the present technology) can be applied to various products. For example, the technology according to the present disclosure may be implemented as an imaging device to be mounted on a mobile body of any type such as a vehicle, an electric vehicle, a hybrid electric vehicle, a motorcycle, a bicycle, a personal mobility, an airplane, a drone, a ship, a robot, a construction machine, or an agricultural machine (tractor).

Figure 47:
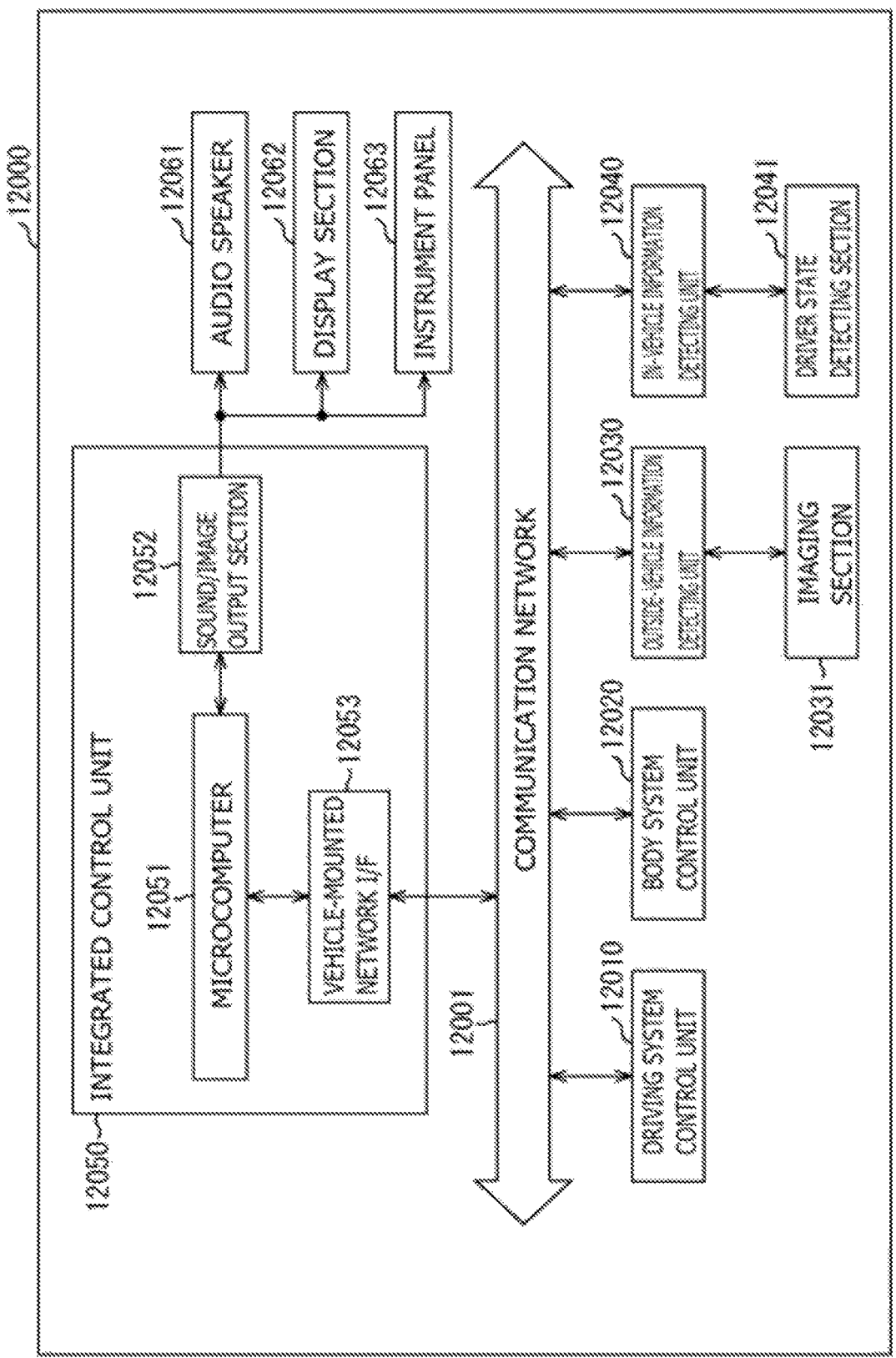
FIG. 47 is a block diagram depicting an example of schematic configuration of a vehicle control system.

FIG. 47 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 47, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 47, an audio speaker 12061, a display section 12062, and an instrument panel 12063 are illustrated as the output device. The display section 12062 may, for example, include at least one of an on-board display and a head-up display.

Figure 48:
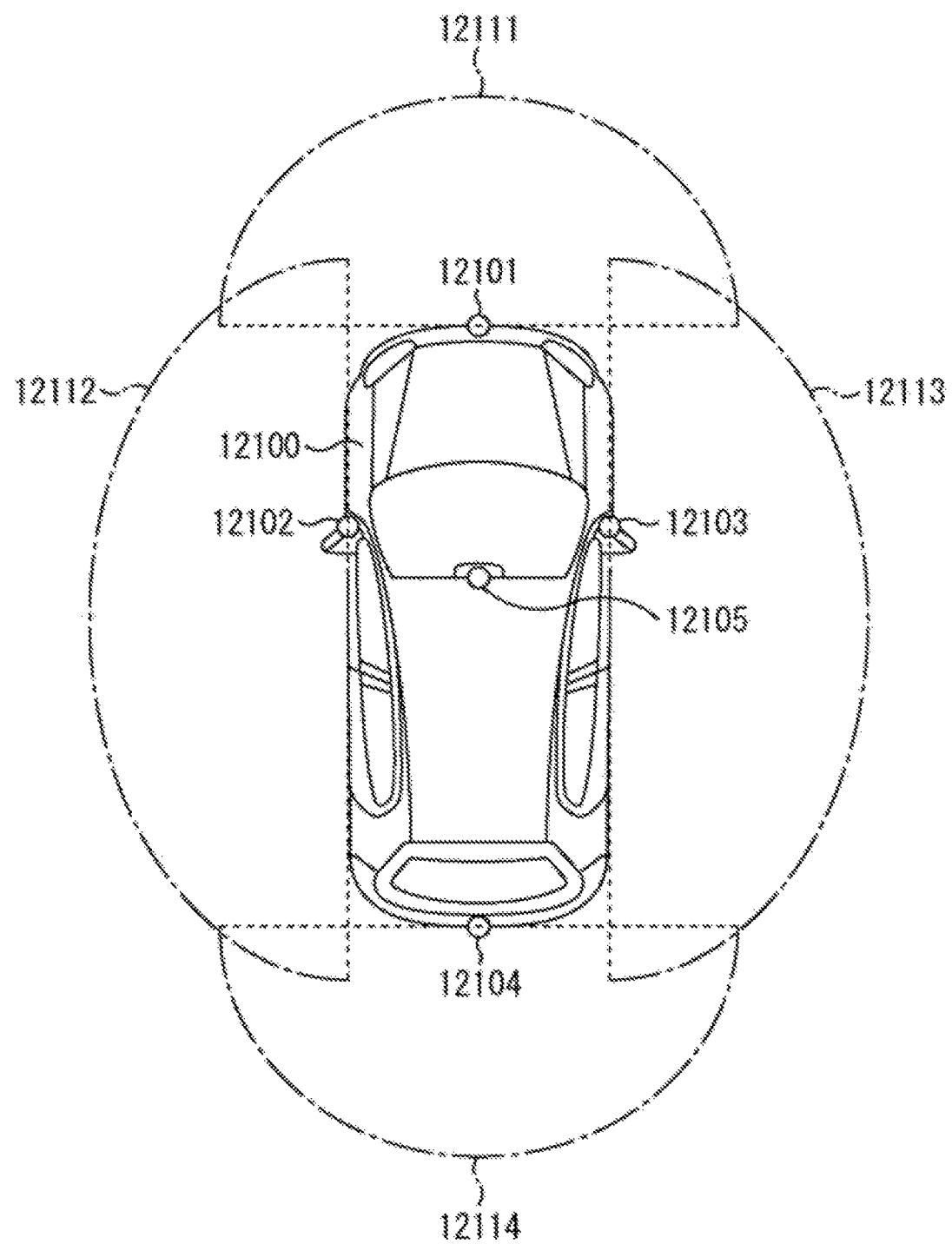
FIG. 48 is a diagram of assistance in explaining an example of installation positions of an outside-vehicle information detecting section and an imaging section.

FIG. 48 is a diagram depicting an example of the installation position of the imaging section 12031.

In FIG. 48, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 48 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of vehicle control systems to which the technology according to the present disclosure can be applied has been explained thus far. The technology according to the present disclosure can be applied to the imaging section 12031 or the like, for example, in the configuration explained above. Then, by applying the technology according to the present disclosure to the imaging section 12031 or the like, the occurrence of streaking can be reduced; as a result, high-quality captured images without noise such as streaking can be obtained.

<Configuration that Present Disclosure can Have>

Note that the present disclosure can also have a configuration like the ones mentioned below.

<<A. Imaging Device>>

[A-1]

An imaging device in which, in a pixel array section in which a selection pixel where signal readout is performed and a reference pixel where signal readout is not performed are arranged in a pixel array section, an amplification transistor of the selection pixel and an amplification transistor of the reference pixel each source electrode of which is connected in common to a common wire are connected with a constant current source via the common wire to form a differential amplification circuit, the imaging device including:

a bypass control section which selectively establishes connection between the constant current source and a differential output node of the differential amplification circuit, and limits a voltage of the differential output node to a predetermined voltage by causing a bypass current to flow between the constant current source and the differential output node; and a current path for bypass current that supplies the bypass current to the constant current source through the pixel array section.

[A-2]

The imaging device according to [A-1] above, in which the reference pixel is fixedly arranged in a particular area of the pixel array section.

[A-3]

The imaging device according to [A-2] above, in which the pixel array section includes a selection pixel area in which the selection pixel is arranged and a reference pixel area in which the reference pixel is arranged.

[A-4]

The imaging device according to [A-3] above, in which the reference pixel area is provided on an opposite side sandwiching the selection pixel area or is provided on a same side of a column readout circuit section including the bypass control section.

[A-5]

The imaging device according to [A-3] above, in which the reference pixel area is provided closer to a column readout circuit section including the bypass control section than the selection pixel area is.

[A-6]

The imaging device according to [A-4] or [A-5] above, in which the current path for bypass current includes a bypass wire placed between the bypass control section and the reference pixel, and the common wire placed along a pixel column and having one end connected to the bypass control section, and the bypass wire and the common wire are electrically connected to each other near the reference pixel area.

[A-7]

The imaging device according to [A-3] above, in which a column readout circuit section including the bypass control section and the constant current source has a double-sided readout configuration arranged on each side of the pixel array section in a pixel column direction, and the reference pixel area is provided on each side of the selection pixel area sandwiching the selection pixel area.

[A-8]

The imaging device according to [A-1] above, in which the current path for bypass current includes a bypass wire placed for each pixel column of the pixel array section along the pixel column and having one end connected to the bypass control section.

[A-9]

The imaging device according to [A-8] above, in which the reference pixel moves to follow the selection pixel that moves along with selection and scanning, and the bypass wire is a wire which specifies a clip connection destination that limits the voltage of the differential output node and which is linked with a common connection node of the amplification transistor and a selection transistor for each pixel of the pixel array section.

[A-10]

The imaging device according to [A-9] above, in which the bypass current flows through the selection transistor of the reference pixel and the selection transistor of the selection pixel through the bypass wire, and then flows into the constant current source through the common wire.

[A-11]

The imaging device according to [A-1] above, in which the common wire is placed for each pixel column of the pixel array section along the pixel column, and has one end connected to the bypass control section, and the current path for bypass current includes the common wire.

[A-12]

The imaging device according to [A-11] above, in which the constant current source is arranged on a side opposite to the bypass control section sandwiching the pixel array section, and connected to the other end of the common wire.

[A-13]

The imaging device according to [A-12] above, in which the bypass current flows into the constant current source through the common wire.

[A-14]

The imaging device according to [A-11] or [A-13] above, in which a column readout circuit section including the bypass control section and the constant current source has a double-sided readout configuration arranged on each side of the pixel array section in a pixel column direction, and two common wires are provided corresponding to the double-sided readout configuration, and each of the two common wires has one end connected to the bypass control section and the other end connected to the constant current source.

[A-15]

The imaging device according to [A-1] above, in which the current path for bypass current includes a bypass wire placed for each pixel column of the pixel array section along the pixel column, and the common wire placed along the pixel column and having one end connected to the bypass control section, and in the pixel array section, the bypass wire and the common wire are electrically connected to each other near a pixel row at an end far from the bypass control section.

[A-16]

The imaging device according to [A-1] above, in which a column readout circuit section including the bypass control section and the constant current source has a double-sided readout configuration arranged on each side of the pixel array section in a pixel column direction, the current path for bypass current includes a bypass wire placed for each pixel column of the pixel array section along the pixel column, and the common wire placed along the pixel column and having one end connected to the bypass control section, and in the pixel array section, the bypass wire and the common wire are electrically connected to each other near a middle pixel row.

[A-17]

The imaging device according to [A-1] above, in which the current path for bypass current is an inactive wire that is included in existing wires provided for each pixel column of the pixel array section along the pixel column and that does not contribute to signal readout at a time of readout of reading out a signal of the selection pixel by the differential amplification circuit.

[A-18]

The imaging device according to [A-17] above, including:

a first selector switch that electrically connects the inactive wire and an output wire of the bypass control section; and a second selector switch that electrically connects the inactive wire and the common wire to each other.

[A-19]

The imaging device according to [A-18] above, in which the second selector switch is formed in the pixel array section.

[A-20]

The imaging device according to [A-19] above, in which the second selector switch includes a depression-type N-channel MOS type field effect transistor.

[A-21]

The imaging device according to any of [A-17] to [A-19] above, in which the inactive wire includes a vertical signal line that is not used at the time of readout of reading out a signal of the selection pixel by the differential amplification circuit.

[A-22]

The imaging device according to any of [A-17] to [A-19] above, in which the inactive wire includes a reset line that is used only at a time of reset in the readout of reading out a signal of the selection pixel by the differential amplification circuit.

[A-23]

The imaging device according to any of [A-17] to [A-19] above, including:

a stacked semiconductor chip structure in which a first semiconductor chip where the pixel array section is formed and a second semiconductor chip where a column readout circuit section including the bypass control section is formed are stacked one on another, in which the first semiconductor chip and the second semiconductor chip are electrically connected to each other via a connection section provided for each of the wires.

<<B. Another Imaging Device>>

[B-1]

An imaging device in which, in a pixel array section in which a selection pixel where signal readout is performed and a reference pixel where signal readout is not performed are arranged in a pixel array section, an amplification transistor of the selection pixel and an amplification transistor of the reference pixel each source electrode of which is connected in common to a common wire are connected with a constant current source via the common wire to form a differential amplification circuit, the imaging device including:

a bypass control section which selectively establishes connection between the constant current source and a differential output node of the differential amplification circuit, and limits a voltage of the differential output node to a predetermined voltage by causing a bypass current to flow between the constant current source and the differential output node; and a widthwise connection wire that connects, widthwise, the common wire of each pixel column of the pixel array section for each pixel or for each set of a plurality of pixels.

[B-2]

The imaging device according to [B-1] above, in which the reference pixel moves to follow the selection pixel that moves along with selection and scanning, and the widthwise connection wire is provided in all pixel rows of the pixel array section.

[B-3]

The imaging device according to [B-1] above, in which the reference pixel is fixedly arranged in a particular area of the pixel array section, and the widthwise connection wire is provided in the particular area of the pixel array section.

<<C. Electronic Equipment>>

[C-1]

Electronic equipment having an imaging device in which, in a pixel array section in which a selection pixel where signal readout is performed and a reference pixel where signal readout is not performed are arranged in a pixel array section, an amplification transistor of the selection pixel and an amplification transistor of the reference pixel each source electrode of which is connected in common to a common wire are connected with a constant current source via the common wire to form a differential amplification circuit, the imaging device including:

a bypass control section which selectively establishes connection between the constant current source and a differential output node of the differential amplification circuit, and limits a voltage of the differential output node to a predetermined voltage by causing a bypass current to flow between the constant current source and the differential output node; and a current path for bypass current that supplies the bypass current to the constant current source through the pixel array section.

[C-2]

The electronic equipment according to [C-1] above, in which the reference pixel is fixedly arranged in a particular area of the pixel array section.

[C-3]

The electronic equipment according to [C-2] above, in which the pixel array section includes a selection pixel area in which the selection pixel is arranged and a reference pixel area in which the reference pixel is arranged.

[C-4]

The electronic equipment according to [C-3] above, in which the reference pixel area is provided on an opposite side sandwiching the selection pixel area or is provided on a same side of a column readout circuit section including the bypass control section.

[C-5]

The electronic equipment according to [C-3] above, in which the reference pixel area is provided closer to a column readout circuit section including the bypass control section than the selection pixel area is.

[C-6]

The electronic equipment according to [C-4] or [C-5] above, in which the current path for bypass current includes a bypass wire placed between the bypass control section and the reference pixel, and the common wire placed along a pixel column and having one end connected to the bypass control section, and the bypass wire and the common wire are electrically connected to each other near the reference pixel area.

[C-7]

The electronic equipment according to [C-3] above, in which a column readout circuit section including the bypass control section and the constant current source has a double-sided readout configuration arranged on each side of the pixel array section in a pixel column direction, and the reference pixel area is provided on each side of the selection pixel area sandwiching the selection pixel area.

[C-8]

The electronic equipment according to [C-1] above, in which the current path for bypass current includes a bypass wire placed for each pixel column of the pixel array section along the pixel column and having one end connected to the bypass control section.

[C-9]

The electronic equipment according to [C-8] above, in which the reference pixel moves to follow the selection pixel that moves along with selection and scanning, and the bypass wire is a wire which specifies a clip connection destination that limits the voltage of the differential output node and which is linked with a common connection node of the amplification transistor and a selection transistor for each pixel of the pixel array section.

[C-10]

The electronic equipment according to [C-9] above, in which the bypass current flows through the selection transistor of the reference pixel and the selection transistor of the selection pixel through the bypass wire, and then flows into the constant current source through the common wire.

[C-11]

The electronic equipment according to [C-1] above, in which the common wire is placed for each pixel column of the pixel array section along the pixel column, and has one end connected to the bypass control section, and the current path for bypass current includes the common wire.

[C-12]

The electronic equipment according to [C-11] above, in which the constant current source is arranged on a side opposite to the bypass control section sandwiching the pixel array section, and connected to the other end of the common wire.

[C-13]

The electronic equipment according to [C-12] above, in which the bypass current flows into the constant current source through the common wire.

[C-14]

The electronic equipment according to [C-11] or [C-13] above, in which a column readout circuit section including the bypass control section and the constant current source has a double-sided readout configuration arranged on each side of the pixel array section in a pixel column direction, and two common wires are provided corresponding to the double-sided readout configuration, and each of the two common wires has one end connected to the bypass control section and the other end connected to the constant current source.

[C-15]

The electronic equipment according to [C-1] above, in which the current path for bypass current includes a bypass wire placed for each pixel column of the pixel array section along the pixel column, and the common wire placed along the pixel column and having one end connected to the bypass control section, and in the pixel array section, the bypass wire and the common wire are electrically connected to each other near a pixel row at an end far from the bypass control section.

[C-16]

The electronic equipment according to [C-1] above, in which a column readout circuit section including the bypass control section and the constant current source has a double-sided readout configuration arranged on each side of the pixel array section in a pixel column direction, the current path for bypass current includes a bypass wire placed for each pixel column of the pixel array section along the pixel column, and the common wire placed along the pixel column and having one end connected to the bypass control section, and in the pixel array section, the bypass wire and the common wire are electrically connected to each other near a middle pixel row.

[C-17]

The electronic equipment according to [C-1] above, in which the current path for bypass current is an inactive wire that is included in existing wires provided for each pixel column of the pixel array section along the pixel column and that does not contribute to signal readout at a time of readout of reading out a signal of the selection pixel by the differential amplification circuit.

[C-18]

The electronic equipment according to [C-17] above, including:

a first selector switch that electrically connects the inactive wire and an output wire of the bypass control section; and a second selector switch that electrically connects the inactive wire and the common wire to each other.

[C-19] The electronic equipment according to [C-18] above, in which the second selector switch is formed in the pixel array section.

[C-20] The electronic equipment according to [C-19] above, in which the second selector switch includes a depression-type N-channel MOS type field effect transistor.

[C-21] The electronic equipment according to any of [C-17] to [C-19] above, in which the inactive wire includes a vertical signal line that is not used at the time of readout of reading out a signal of the selection pixel by the differential amplification circuit.

[C-22] The electronic equipment according to any of [C-17] to [C-19] above, in which the inactive wire includes a reset line that is used only at a time of reset in the readout of reading out a signal of the selection pixel by the differential amplification circuit.

[C-23] The electronic equipment according to any of [C-17] to [C-19] above, including:

a stacked semiconductor chip structure in which a first semiconductor chip where the pixel array section is formed and a second semiconductor chip where a column readout circuit section including the bypass control section is formed are stacked one on another, in which the first semiconductor chip and the second semiconductor chip are electrically connected to each other via a connection section provided for each of the wires.

REFERENCE SIGNS LIST

10A: Single-sided readout imaging device
10B: Double-sided readout imaging device
11: Pixel array section
12: Vertical drive section
13: Column readout circuit section
14: Column signal processing section
15: Horizontal drive section
16: System control section
20: Selection pixel
30: Reference pixel
50: Differential amplification circuit
51: Current mirror circuit
52: Constant current source
53: Bypass control section
54: Bypass wire
58: Widthwise connection wire
531: Bypass transistor
VCOM: Common wire

The invention claimed is:

1. An imaging device in which, in a pixel array section in which a selection pixel where signal readout is performed and a reference pixel where signal readout is not performed are arranged, an amplification transistor of the selection pixel and an amplification transistor of the reference pixel each source electrode of which is connected in common to a common wire are connected with a constant current source via the common wire to form a differential amplification circuit, the imaging device comprising:

a bypass control section which selectively establishes connection between the constant current source and a differential output node of the differential amplification circuit, and limits a voltage of the differential output node to a predetermined voltage by causing a bypass current to flow between the constant current source and the differential output node; and a current path for bypass current that supplies the bypass current to the constant current source through the pixel array section.

2. The imaging device according to claim 1, wherein the reference pixel is fixedly arranged in a particular area of the pixel array section.

3. The imaging device according to claim 2, wherein the pixel array section includes a selection pixel area in which the selection pixel is arranged and a reference pixel area in which the reference pixel is arranged.

4. The imaging device according to claim 3, wherein the reference pixel area is provided on an opposite side sandwiching the selection pixel area or is provided on a same side of a column readout circuit section including the bypass control section.

5. The imaging device according to claim 3, wherein the reference pixel area is provided closer to a column readout circuit section including the bypass control section than the selection pixel area is.

6. The imaging device according to claim 4, wherein the current path for bypass current includes a bypass wire placed between the bypass control section and the reference pixel, and the common wire placed along a pixel column and having one end connected to the bypass control section, and the bypass wire and the common wire are electrically connected to each other near the reference pixel area.

7. The imaging device according to claim 3, wherein a column readout circuit section including the bypass control section and the constant current source has a double-sided readout configuration arranged on each side of the pixel array section in a pixel column direction, and the reference pixel area is provided on each side of the selection pixel area sandwiching the selection pixel area.

8. The imaging device according to claim 1, wherein the current path for bypass current includes a bypass wire placed for each pixel column of the pixel array section along the pixel column and having one end connected to the bypass control section.

9. The imaging device according to claim 8, wherein the reference pixel moves to follow the selection pixel that moves along with selection and scanning, and the bypass wire is a wire which specifies a clip connection destination that limits the voltage of the differential output node and which is linked with a common connection node of the amplification transistor and a selection transistor for each pixel of the pixel array section.

10. The imaging device according to claim 9, wherein the bypass current flows through the selection transistor of the reference pixel and the selection transistor of the selection pixel through the bypass wire, and then flows into the constant current source through the common wire.

11. The imaging device according to claim 1, wherein the common wire is placed for each pixel column of the pixel array section along the pixel column, and has one end connected to the bypass control section, and the current path for bypass current includes the common wire.

12. The imaging device according to claim 11, wherein the constant current source is arranged on a side opposite to the bypass control section sandwiching the pixel array section, and connected to the other end of the common wire.

13. The imaging device according to claim 12, wherein the bypass current flows into the constant current source through the common wire.

14. The imaging device according to claim 11, wherein a column readout circuit section including the bypass control section and the constant current source has a double-sided readout configuration arranged on each side of the pixel array section in a pixel column direction, and
two common wires are provided corresponding to the double-sided readout configuration, and each of the two common wires has one end connected to the bypass control section and the other end connected to the constant current source.

15. The imaging device according to claim 1, wherein the current path for bypass current includes a bypass wire placed for each pixel column of the pixel array section along the pixel column, and the common wire placed along the pixel column and having one end connected to the bypass control section, and
in the pixel array section, the bypass wire and the common wire are electrically connected to each other near a pixel row at an end far from the bypass control section.

16. The imaging device according to claim 1, wherein a column readout circuit section including the bypass control section and the constant current source has a double-sided readout configuration arranged on each side of the pixel array section in a pixel column direction,
the current path for bypass current includes a bypass wire placed for each pixel column of the pixel array section along the pixel column, and the common wire placed along the pixel column and having one end connected to the bypass control section, and
in the pixel array section, the bypass wire and the common wire are electrically connected to each other near a middle pixel row.

17. The imaging device according to claim 1, wherein the current path for bypass current is an inactive wire that is included in existing wires provided for each pixel column of the pixel array section along the pixel column and that does not contribute to signal readout at a time of readout of reading out a signal of the selection pixel by the differential amplification circuit.

18. The imaging device according to claim 17, comprising:
a first selector switch that electrically connects the inactive wire and an output wire of the bypass control section; and
a second selector switch that electrically connects the inactive wire and the common wire to each other.

19. The imaging device according to claim 18, wherein the second selector switch is formed in the pixel array section.

20. The imaging device according to claim 19, wherein the second selector switch includes a depression-type N-channel MOS type field effect transistor.

21. The imaging device according to claim 17, wherein the inactive wire includes a vertical signal line that is not used at the time of readout of reading out a signal of the selection pixel by the differential amplification circuit.

22. The imaging device according to claim 17, wherein the inactive wire includes a reset line that is used only at a time of reset in the readout of reading out a signal of the selection pixel by the differential amplification circuit.

23. The imaging device according to claim 17, comprising:
a stacked semiconductor chip structure in which a first semiconductor chip where the pixel array section is formed and a second semiconductor chip where a column readout circuit section including the bypass control section is formed are stacked one on another, wherein
the first semiconductor chip and the second semiconductor chip are electrically connected to each other via a connection section provided for each of the wires.

24. An imaging device in which, in a pixel array section in which a selection pixel where signal readout is performed and a reference pixel where signal readout is not performed are arranged, an amplification transistor of the selection pixel and an amplification transistor of the reference pixel each source electrode of which is connected in common to a common wire are connected with a constant current source via the common wire to form a differential amplification circuit, the imaging device comprising:
a bypass control section which selectively establishes connection between the constant current source and a differential output node of the differential amplification circuit, and limits a voltage of the differential output node to a predetermined voltage by causing a bypass current to flow between the constant current source and the differential output node; and
a widthwise connection wire that connects, widthwise, the common wire of each pixel column of the pixel array section for each pixel or for each set of a plurality of pixels.

25. The imaging device according to claim 24, wherein the reference pixel moves to follow the selection pixel that moves along with selection and scanning, and
the widthwise connection wire is provided in all pixel rows of the pixel array section.

26. The imaging device according to claim 24, wherein the reference pixel is fixedly arranged in a particular area of the pixel array section, and
the widthwise connection wire is provided in the particular area of the pixel array section.

27. Electronic equipment having an imaging device in which, in a pixel array section in which a selection pixel where signal readout is performed and a reference pixel where signal readout is not performed are arranged, an amplification transistor of the selection pixel and an amplification transistor of the reference pixel each source electrode of which is connected in common to a common wire are connected with a constant current source via the common wire to form a differential amplification circuit, the imaging device including:
a bypass control section which selectively establishes connection between the constant current source and a differential output node of the differential amplification circuit, and limits a voltage of the differential output node to a predetermined voltage by causing a bypass current to flow between the constant current source and the differential output node; and a current path for bypass current that supplies the bypass current to the constant current source through the pixel array section.

\* \* \* \* \*